US008992099B2

(12) United States Patent
Blackwell, Jr. et al.

(10) Patent No.: US 8,992,099 B2
(45) Date of Patent: Mar. 31, 2015

(54) OPTICAL INTERFACE CARDS, ASSEMBLIES, AND RELATED METHODS, SUITED FOR INSTALLATION AND USE IN ANTENNA SYSTEM EQUIPMENT

(75) Inventors: Chois A. Blackwell, Jr., North Richland Hills, TX (US); Terry D. Cox, Keller, TX (US)

(73) Assignee: Corning Cable Systems LLC, Hickory, NC (US)

( * ) Notice: Subject to any disclaimer, the term of this patent is extended or adjusted under 35 U.S.C. 154(b) by 620 days.

(21) Appl. No.: 12/751,895

(22) Filed: Mar. 31, 2010

(65) Prior Publication Data
US 2011/0188815 A1 Aug. 4, 2011

Related U.S. Application Data

(60) Provisional application No. 61/301,495, filed on Feb. 4, 2010, provisional application No. 61/301,488, filed on Feb. 4, 2010, provisional application No. 61/316,584, filed on Mar. 23, 2010, provisional application No. 61/316,591, filed on Mar. 23, 2010.

(51) Int. Cl.
*G02B 6/36* (2006.01)
*H05K 1/11* (2006.01)
*H05K 7/00* (2006.01)
*H05K 7/14* (2006.01)

(52) U.S. Cl.
CPC .. *H05K 1/11* (2013.01); *H05K 7/00* (2013.01); *H05K 7/14* (2013.01)
USPC .......................................................... 385/88

(58) Field of Classification Search
None
See application file for complete search history.

(56) References Cited

U.S. PATENT DOCUMENTS

| 620,013 | A | 2/1899 | Barnes |
|---|---|---|---|
| 2,528,910 | A | 11/1950 | Poe |
| 2,614,685 | A | 10/1952 | Miller |
| 3,081,717 | A | 3/1963 | Yurevich |

(Continued)

FOREIGN PATENT DOCUMENTS

| AU | 2010270959 A1 | 2/2012 |
|---|---|---|
| CA | 2029592 A1 | 5/1992 |

(Continued)

OTHER PUBLICATIONS

International Search Report for PCT/US2010/023901 mailed Jun. 11, 2010, 3 pages.

(Continued)

*Primary Examiner* — Sung Pak

(57) ABSTRACT

Optical interface cards, assemblies, and related methods, which may be suited for installation and use in antenna system equipment, are disclosed. In certain embodiments, an optical interface card (OIC) comprising a printed circuit board (PCB) having at least one optical sub-assembly (OSA) mounted to at least one first opening end of the PCB and extending into at least one opening and related methods are disclosed. In other embodiments, optical interface assemblies comprised of two OICs mounted together are disclosed. In other embodiments, a communications equipment enclosure including at least one fan configured to draw in air from a first side of the communications equipment enclosure into a lower plenum and across a plurality of communications components into an upper plenum to provide air cooling are disclosed. In another embodiment, a modular distributed antenna system assembly is disclosed.

25 Claims, 42 Drawing Sheets

(56) References Cited

U.S. PATENT DOCUMENTS

| | | |
|---|---|---|
| 3,175,873 A | 3/1965 | Blomquist et al. |
| 3,212,192 A | 10/1965 | Bachmann et al. |
| 3,433,886 A | 3/1969 | Myers |
| 3,494,306 A | 2/1970 | Aguilar |
| 3,545,712 A | 12/1970 | Ellis |
| 3,568,263 A | 3/1971 | Meehan |
| 3,646,244 A | 2/1972 | Cole |
| 3,664,514 A | 5/1972 | Drake |
| 3,683,238 A | 8/1972 | Olds et al. |
| 3,701,835 A | 10/1972 | Eisele et al. |
| 3,880,396 A | 4/1975 | Freiberger et al. |
| 3,906,592 A | 9/1975 | Sakasegawa et al. |
| 3,991,960 A | 11/1976 | Tanaka |
| 4,047,797 A | 9/1977 | Arnold et al. |
| 4,059,872 A | 11/1977 | Delesandri |
| 4,119,285 A | 10/1978 | Bisping et al. |
| 4,148,454 A | 4/1979 | Carlson et al. |
| 4,239,316 A | 12/1980 | Spaulding |
| 4,244,638 A | 1/1981 | Little et al. |
| 4,285,486 A | 8/1981 | Von Osten et al. |
| 4,303,296 A | 12/1981 | Spaulding |
| 4,354,731 A | 10/1982 | Mouissie |
| 4,457,482 A | 7/1984 | Kitagawa |
| 4,525,012 A | 6/1985 | Dunner |
| 4,540,222 A | 9/1985 | Burrell |
| 4,561,615 A | 12/1985 | Medlin, Jr. |
| 4,564,163 A | 1/1986 | Barnett |
| 4,597,173 A | 7/1986 | Chino et al. |
| 4,611,875 A | 9/1986 | Clarke et al. |
| 4,635,886 A | 1/1987 | Santucci et al. |
| 4,645,292 A | 2/1987 | Sammueller |
| 4,657,340 A | 4/1987 | Tanaka et al. |
| 4,681,288 A | 7/1987 | Nakamura |
| 4,702,551 A | 10/1987 | Coulombe |
| 4,711,518 A | 12/1987 | Shank et al. |
| 4,736,100 A | 4/1988 | Vastagh |
| 4,744,629 A | 5/1988 | Bertoglio et al. |
| 4,747,020 A | 5/1988 | Brickley et al. |
| 4,752,110 A | 6/1988 | Blanchet et al. |
| 4,753,510 A | 6/1988 | Sezerman |
| 4,787,706 A | 11/1988 | Cannon, Jr. et al. |
| 4,792,203 A | 12/1988 | Nelson et al. |
| 4,798,432 A | 1/1989 | Becker et al. |
| 4,805,979 A | 2/1989 | Bossard et al. |
| 4,808,774 A | 2/1989 | Crane |
| 4,824,193 A | 4/1989 | Maeda et al. |
| 4,824,196 A | 4/1989 | Bylander |
| 4,826,277 A | 5/1989 | Weber et al. |
| 4,838,643 A | 6/1989 | Hodges et al. |
| 4,840,449 A | 6/1989 | Ghandeharizadeh |
| 4,865,280 A | 9/1989 | Wollar |
| 4,898,448 A | 2/1990 | Cooper |
| 4,900,123 A | 2/1990 | Barlow |
| 4,911,662 A | 3/1990 | Debortoli et al. |
| 4,948,220 A | 8/1990 | Violo et al. |
| 4,949,376 A | 8/1990 | Nieves et al. |
| 4,971,421 A | 11/1990 | Ori |
| 4,986,625 A | 1/1991 | Yamada et al. |
| 4,988,831 A | 1/1991 | Wilson et al. |
| 4,991,928 A | 2/1991 | Zimmer |
| 4,995,688 A | 2/1991 | Anton et al. |
| 5,001,602 A | 3/1991 | Suffi et al. |
| 5,005,941 A | 4/1991 | Barlow et al. |
| 5,017,211 A | 5/1991 | Wenger et al. |
| 5,023,646 A | 6/1991 | Ishida et al. |
| 5,024,498 A | 6/1991 | Becker et al. |
| 5,028,114 A | 7/1991 | Krausse et al. |
| 5,037,175 A | 8/1991 | Weber |
| 5,048,918 A | 9/1991 | Daems et al. |
| 5,060,897 A | 10/1991 | Thalenfeld |
| 5,066,149 A | 11/1991 | Wheeler et al. |
| 5,067,784 A | 11/1991 | Debortoli et al. |
| 5,071,211 A | 12/1991 | Debortoli et al. |
| 5,071,220 A | 12/1991 | Ruello et al. |
| 5,073,042 A | 12/1991 | Mulholland et al. |
| 5,074,635 A | 12/1991 | Justice et al. |
| 5,076,688 A | 12/1991 | Bowen et al. |
| 5,080,459 A | 1/1992 | Wettengel et al. |
| 5,100,221 A | 3/1992 | Carney et al. |
| 5,104,336 A | 4/1992 | Hatanaka et al. |
| 5,125,060 A | 6/1992 | Edmundson |
| 5,127,082 A | 6/1992 | Below et al. |
| 5,127,851 A | 7/1992 | Hilbert et al. |
| 5,129,030 A | 7/1992 | Petrunia |
| 5,129,607 A | 7/1992 | Satoh |
| 5,133,039 A | 7/1992 | Dixit |
| 5,138,678 A | 8/1992 | Briggs et al. |
| 5,138,688 A | 8/1992 | Debortoli |
| 5,142,598 A | 8/1992 | Tabone |
| 5,142,607 A | 8/1992 | Petrotta et al. |
| 5,150,277 A | 9/1992 | Bainbridge et al. |
| D330,368 S | 10/1992 | Bourgeois et al. |
| 5,152,760 A | 10/1992 | Latina |
| 5,153,910 A | 10/1992 | Mickelson et al. |
| 5,157,749 A | 10/1992 | Briggs et al. |
| 5,167,001 A | 11/1992 | Debortoli et al. |
| 5,170,452 A | 12/1992 | Ott |
| 5,189,723 A | 2/1993 | Johnson et al. |
| 5,199,099 A | 3/1993 | Dalgoutte |
| 5,204,929 A | 4/1993 | Machall et al. |
| 5,209,572 A | 5/1993 | Jordan |
| 5,214,735 A | 5/1993 | Henneberger et al. |
| 5,224,186 A | 6/1993 | Kishimoto et al. |
| 5,230,492 A | 7/1993 | Zwart et al. |
| 5,231,687 A | 7/1993 | Handley |
| 5,231,688 A | 7/1993 | Zimmer |
| 5,233,674 A | 8/1993 | Vladic |
| 5,239,609 A | 8/1993 | Auteri |
| 5,243,679 A | 9/1993 | Sharrow et al. |
| 5,253,320 A | 10/1993 | Takahashi et al. |
| 5,260,957 A | 11/1993 | Hakimi et al. |
| 5,261,633 A | 11/1993 | Mastro |
| 5,265,187 A | 11/1993 | Morin et al. |
| 5,274,729 A | 12/1993 | King et al. |
| 5,274,731 A | 12/1993 | White |
| 5,278,933 A | 1/1994 | Hunsinger et al. |
| 5,280,138 A | 1/1994 | Preston et al. |
| 5,285,515 A | 2/1994 | Milanowski et al. |
| 5,291,570 A | 3/1994 | Filgas et al. |
| 5,315,679 A | 5/1994 | Baldwin et al. |
| 5,317,663 A | 5/1994 | Beard et al. |
| 5,323,478 A | 6/1994 | Milanowski et al. |
| 5,323,480 A | 6/1994 | Mullaney et al. |
| 5,329,520 A | 7/1994 | Richardson |
| 5,333,193 A | 7/1994 | Cote et al. |
| 5,333,221 A | 7/1994 | Briggs et al. |
| 5,333,222 A | 7/1994 | Belenkiy et al. |
| 5,337,400 A | 8/1994 | Morin et al. |
| 5,339,379 A | 8/1994 | Kutsch et al. |
| 5,347,603 A | 9/1994 | Belenkiy et al. |
| 5,353,367 A | 10/1994 | Czosnowski et al. |
| 5,359,688 A | 10/1994 | Underwood |
| 5,363,466 A | 11/1994 | Milanowski et al. |
| 5,363,467 A | 11/1994 | Keith |
| 5,366,388 A | 11/1994 | Freeman et al. |
| 5,367,598 A | 11/1994 | Devenish, III et al. |
| 5,373,421 A | 12/1994 | Detsikas et al. |
| 5,383,051 A | 1/1995 | Delrosso et al. |
| 5,390,272 A | 2/1995 | Repta et al. |
| 5,398,295 A | 3/1995 | Chang et al. |
| 5,398,820 A | 3/1995 | Kiss |
| 5,399,814 A | 3/1995 | Staber et al. |
| 5,401,193 A | 3/1995 | Lo Cicero et al. |
| 5,402,515 A | 3/1995 | Vidacovich et al. |
| 5,408,557 A | 4/1995 | Hsu |
| RE34,955 E | 5/1995 | Anton et al. |
| 5,412,751 A | 5/1995 | Siemon et al. |
| 5,416,837 A | 5/1995 | Cote et al. |
| 5,418,874 A | 5/1995 | Carlisle et al. |
| 5,420,956 A | 5/1995 | Grugel et al. |
| 5,420,958 A | 5/1995 | Henson et al. |
| 5,421,532 A | 6/1995 | Richter |
| 5,438,641 A | 8/1995 | Malacarne |
| 5,442,725 A | 8/1995 | Peng |

(56) References Cited

U.S. PATENT DOCUMENTS

| | | |
|---|---|---|
| 5,442,726 A | 8/1995 | Howard et al. |
| 5,443,232 A | 8/1995 | Kesinger et al. |
| 5,444,804 A | 8/1995 | Yui et al. |
| 5,448,015 A | 9/1995 | Jamet et al. |
| 5,450,518 A | 9/1995 | Burek et al. |
| 5,458,019 A | 10/1995 | Trevino |
| 5,471,555 A | 11/1995 | Braga et al. |
| 5,479,505 A | 12/1995 | Butler et al. |
| 5,481,634 A | 1/1996 | Anderson et al. |
| 5,481,939 A | 1/1996 | Bernardini |
| 5,490,229 A | 2/1996 | Ghandeharizadeh et al. |
| 5,495,549 A | 2/1996 | Schneider et al. |
| 5,497,416 A | 3/1996 | Butler, III et al. |
| 5,497,444 A | 3/1996 | Wheeler |
| 5,511,144 A | 4/1996 | Hawkins et al. |
| 5,511,798 A | 4/1996 | Kawamoto et al. |
| 5,519,804 A | 5/1996 | Burek et al. |
| 5,530,786 A | 6/1996 | Radliff et al. |
| 5,535,970 A | 7/1996 | Gobbi |
| 5,538,213 A | 7/1996 | Brown |
| 5,542,015 A | 7/1996 | Hultermans |
| 5,546,495 A | 8/1996 | Bruckner et al. |
| 5,548,641 A | 8/1996 | Butler et al. |
| 5,553,183 A | 9/1996 | Bechamps |
| 5,553,186 A | 9/1996 | Allen |
| 5,563,971 A | 10/1996 | Abendschein |
| 5,572,617 A | 11/1996 | Bernhardt et al. |
| 5,575,680 A | 11/1996 | Suffi |
| 5,577,151 A | 11/1996 | Hoffer |
| 5,590,234 A | 12/1996 | Pulido |
| 5,595,507 A | 1/1997 | Braun et al. |
| 5,596,670 A | 1/1997 | Debortoli et al. |
| 5,600,020 A | 2/1997 | Wehle et al. |
| 5,602,954 A | 2/1997 | Nolf et al. |
| 5,608,606 A | 3/1997 | Blaney |
| 5,613,030 A | 3/1997 | Hoffer et al. |
| 5,617,501 A | 4/1997 | Miller et al. |
| 5,638,474 A | 6/1997 | Lampert et al. |
| 5,640,476 A | 6/1997 | Womack et al. |
| 5,640,482 A | 6/1997 | Barry et al. |
| 5,647,043 A | 7/1997 | Anderson et al. |
| 5,647,045 A | 7/1997 | Robinson et al. |
| 5,650,334 A | 7/1997 | Zuk et al. |
| 5,668,910 A | 9/1997 | Arnett |
| 5,668,911 A | 9/1997 | Debortoli |
| 5,671,273 A | 9/1997 | Lanquist |
| 5,689,605 A | 11/1997 | Cobb et al. |
| 5,689,607 A | 11/1997 | Vincent et al. |
| 5,692,079 A | 11/1997 | Iso |
| 5,694,511 A | 12/1997 | Pimpinella et al. |
| 5,701,380 A | 12/1997 | Larson et al. |
| 5,704,573 A | 1/1998 | de Beers et al. |
| 5,708,742 A | 1/1998 | Beun et al. |
| 5,708,751 A | 1/1998 | Mattei |
| 5,710,851 A | 1/1998 | Walter et al. |
| 5,717,810 A | 2/1998 | Wheeler |
| 5,734,776 A | 3/1998 | Puetz |
| 5,740,300 A | 4/1998 | Hodge |
| 5,742,982 A | 4/1998 | Dodd et al. |
| 5,751,874 A | 5/1998 | Chudoba et al. |
| 5,751,882 A | 5/1998 | Daems et al. |
| 5,754,724 A | 5/1998 | Peterson et al. |
| 5,758,003 A | 5/1998 | Wheeler et al. |
| 5,758,004 A | 5/1998 | Alarcon et al. |
| 5,761,026 A | 6/1998 | Robinson et al. |
| 5,765,698 A | 6/1998 | Bullivant |
| 5,769,908 A | 6/1998 | Koppelman |
| 5,774,612 A | 6/1998 | Belenkiy et al. |
| 5,778,122 A | 7/1998 | Giebel et al. |
| 5,778,130 A | 7/1998 | Walters et al. |
| 5,781,686 A | 7/1998 | Robinson et al. |
| 5,788,087 A | 8/1998 | Orlando |
| 5,790,741 A | 8/1998 | Vincent et al. |
| 5,793,920 A | 8/1998 | Wilkins et al. |
| 5,793,921 A | 8/1998 | Wilkins et al. |
| 5,796,908 A | 8/1998 | Vicory |
| 5,806,687 A | 9/1998 | Ballesteros et al. |
| 5,823,646 A | 10/1998 | Arizpe et al. |
| 5,825,955 A | 10/1998 | Ernst et al. |
| 5,825,961 A | 10/1998 | Wilkins et al. |
| 5,828,807 A | 10/1998 | Tucker et al. |
| 5,832,162 A | 11/1998 | Sarbell |
| 5,835,657 A | 11/1998 | Suarez et al. |
| 5,835,658 A | 11/1998 | Smith |
| 5,862,290 A | 1/1999 | Burek et al. |
| 5,870,519 A | 2/1999 | Jenkins et al. |
| 5,874,733 A | 2/1999 | Silver et al. |
| 5,877,565 A | 3/1999 | Hollenbach et al. |
| 5,880,864 A | 3/1999 | Williams et al. |
| 5,881,200 A | 3/1999 | Burt |
| 5,883,995 A | 3/1999 | Lu et al. |
| 5,884,003 A | 3/1999 | Cloud et al. |
| 5,887,095 A | 3/1999 | Nagase et al. |
| 5,887,106 A | 3/1999 | Cheeseman et al. |
| 5,892,877 A | 4/1999 | Meyerhoefer |
| 5,894,540 A | 4/1999 | Drewing |
| 5,901,220 A | 5/1999 | Garver et al. |
| 5,903,693 A | 5/1999 | Brown |
| 5,906,342 A | 5/1999 | Kraus |
| 5,909,298 A | 6/1999 | Shimada et al. |
| 5,913,006 A | 6/1999 | Summach |
| 5,914,976 A | 6/1999 | Jayaraman et al. |
| 5,915,055 A | 6/1999 | Bennett et al. |
| 5,923,804 A | 7/1999 | Rosson |
| 5,930,425 A | 7/1999 | Abel et al. |
| 5,933,557 A | 8/1999 | Ott |
| 5,940,563 A | 8/1999 | Kobayashi et al. |
| 5,943,460 A | 8/1999 | Mead et al. |
| 5,945,633 A | 8/1999 | Ott et al. |
| 5,946,440 A | 8/1999 | Puetz |
| 5,949,946 A | 9/1999 | Debortoli et al. |
| 5,953,962 A | 9/1999 | Hewson |
| 5,956,439 A | 9/1999 | Pimpinella |
| 5,956,444 A | 9/1999 | Duda et al. |
| 5,956,449 A | 9/1999 | Otani et al. |
| 5,966,492 A | 10/1999 | Bechamps et al. |
| 5,969,294 A | 10/1999 | Eberle et al. |
| 5,975,769 A | 11/1999 | Larson et al. |
| 5,978,540 A | 11/1999 | Bechamps et al. |
| 5,980,303 A | 11/1999 | Lee et al. |
| 5,987,203 A | 11/1999 | Abel et al. |
| 5,993,071 A | 11/1999 | Hultermans |
| 5,995,700 A | 11/1999 | Burek et al. |
| 5,999,393 A | 12/1999 | Brower |
| 6,001,831 A | 12/1999 | Papenfuhs et al. |
| 6,009,224 A | 12/1999 | Allen |
| 6,009,225 A | 12/1999 | Ray et al. |
| 6,011,831 A | 1/2000 | Nieves et al. |
| 6,027,252 A | 2/2000 | Erdman et al. |
| 6,027,352 A | 2/2000 | Byrne |
| 6,041,042 A | 3/2000 | Bussiere |
| 6,044,193 A | 3/2000 | Szentesi et al. |
| 6,049,963 A | 4/2000 | Boe |
| 6,058,235 A | 5/2000 | Hiramatsu et al. |
| 6,061,492 A | 5/2000 | Strause et al. |
| 6,078,661 A | 6/2000 | Arnett et al. |
| 6,079,881 A | 6/2000 | Roth |
| 6,088,497 A | 7/2000 | Phillips et al. |
| 6,118,075 A | 9/2000 | Baker et al. |
| 6,127,627 A | 10/2000 | Daoud |
| 6,130,983 A | 10/2000 | Cheng |
| 6,134,370 A | 10/2000 | Childers et al. |
| 6,141,222 A | 10/2000 | Toor et al. |
| 6,149,313 A | 11/2000 | Giebel et al. |
| 6,149,315 A | 11/2000 | Stephenson |
| 6,151,432 A | 11/2000 | Nakajima et al. |
| 6,160,946 A | 12/2000 | Thompson et al. |
| 6,170,784 B1 | 1/2001 | MacDonald et al. |
| 6,172,782 B1 | 1/2001 | Kobayashi |
| 6,175,079 B1 | 1/2001 | Johnston et al. |
| 6,181,861 B1 | 1/2001 | Wenski et al. |
| 6,188,687 B1 | 2/2001 | Mussman et al. |
| 6,188,825 B1 | 2/2001 | Bandy et al. |
| 6,192,180 B1 | 2/2001 | Kim et al. |

(56) References Cited

U.S. PATENT DOCUMENTS

| | | |
|---|---|---|
| 6,200,170 B1 | 3/2001 | Amberg et al. |
| 6,201,919 B1 | 3/2001 | Puetz et al. |
| 6,201,920 B1 | 3/2001 | Noble et al. |
| 6,208,796 B1 | 3/2001 | Williams Vigliaturo |
| 6,212,324 B1 | 4/2001 | Lin et al. |
| 6,215,938 B1 | 4/2001 | Reitmeier et al. |
| 6,216,987 B1 | 4/2001 | Fukuo |
| 6,227,717 B1 | 5/2001 | Ott et al. |
| 6,229,948 B1 | 5/2001 | Blee et al. |
| 6,234,683 B1 | 5/2001 | Waldron et al. |
| 6,234,685 B1 | 5/2001 | Carlisle et al. |
| 6,236,795 B1 | 5/2001 | Rodgers |
| 6,240,229 B1 | 5/2001 | Roth |
| 6,243,522 B1 | 6/2001 | Allan et al. |
| 6,245,998 B1 | 6/2001 | Curry et al. |
| 6,247,851 B1 | 6/2001 | Ichihara |
| 6,250,816 B1 | 6/2001 | Johnston et al. |
| 6,259,850 B1 | 7/2001 | Crosby, Jr. et al. |
| 6,263,141 B1 | 7/2001 | Smith |
| 6,265,680 B1 | 7/2001 | Robertson |
| 6,269,212 B1 | 7/2001 | Schiattone |
| 6,273,532 B1 | 8/2001 | Chen et al. |
| 6,275,641 B1 | 8/2001 | Daoud |
| 6,278,829 B1 | 8/2001 | BuAbbud et al. |
| 6,278,831 B1 | 8/2001 | Henderson et al. |
| D448,005 S | 9/2001 | Klein, Jr. et al. |
| 6,289,618 B1 | 9/2001 | Kump et al. |
| 6,292,614 B1 | 9/2001 | Smith et al. |
| 6,301,424 B1 | 10/2001 | Hwang |
| 6,305,848 B1 | 10/2001 | Gregory |
| 6,307,997 B1 | 10/2001 | Walters et al. |
| 6,318,824 B1 | 11/2001 | LaGrotta et al. |
| 6,321,017 B1 | 11/2001 | Janus et al. |
| 6,322,279 B1 | 11/2001 | Yamamoto et al. |
| 6,324,575 B1 | 11/2001 | Jain et al. |
| 6,325,549 B1 | 12/2001 | Shevchuk |
| 6,327,059 B1 | 12/2001 | Bhalla et al. |
| RE37,489 E | 1/2002 | Anton et al. |
| 6,343,313 B1 | 1/2002 | Salesky et al. |
| 6,344,615 B1 | 2/2002 | Nolf et al. |
| 6,347,888 B1 | 2/2002 | Puetz |
| 6,353,696 B1 | 3/2002 | Gordon et al. |
| 6,353,697 B1 | 3/2002 | Daoud |
| 6,357,712 B1 | 3/2002 | Lu |
| 6,359,228 B1 | 3/2002 | Strause et al. |
| 6,363,198 B1 | 3/2002 | Braga et al. |
| 6,363,200 B1 | 3/2002 | Thompson et al. |
| 6,370,309 B1 | 4/2002 | Daoud |
| 6,371,419 B1 | 4/2002 | Ohnuki |
| 6,375,129 B2 | 4/2002 | Koziol |
| 6,377,218 B1 | 4/2002 | Nelson et al. |
| 6,379,052 B1 | 4/2002 | de Jong et al. |
| 6,381,642 B1 | 4/2002 | O'Donnell et al. |
| 6,385,374 B2 | 5/2002 | Kropp |
| 6,385,381 B1 | 5/2002 | Janus et al. |
| 6,389,214 B1 | 5/2002 | Smith et al. |
| 6,397,166 B1 | 5/2002 | Leung et al. |
| 6,398,149 B1 | 6/2002 | Hines et al. |
| 6,406,314 B1 | 6/2002 | Byrne |
| 6,410,850 B1 | 6/2002 | Abel et al. |
| 6,411,767 B1 | 6/2002 | Burrous et al. |
| 6,412,986 B1 | 7/2002 | Ngo et al. |
| 6,418,262 B1 | 7/2002 | Puetz et al. |
| 6,419,519 B1 | 7/2002 | Young |
| 6,424,781 B1 | 7/2002 | Puetz et al. |
| 6,425,694 B1 | 7/2002 | Szilagyi et al. |
| 6,427,045 B1 | 7/2002 | Matthes et al. |
| 6,431,762 B1 | 8/2002 | Taira et al. |
| 6,434,313 B1 | 8/2002 | Clapp, Jr. et al. |
| 6,438,310 B1 | 8/2002 | Lance et al. |
| 6,452,925 B1 | 9/2002 | Sistanizadeh et al. |
| 6,456,773 B1 | 9/2002 | Keys |
| 6,464,402 B1 | 10/2002 | Andrews et al. |
| 6,466,724 B1 | 10/2002 | Glover et al. |
| 6,469,905 B1 | 10/2002 | Hwang |
| D466,087 S | 11/2002 | Cuny et al. |
| 6,478,472 B1 | 11/2002 | Anderson et al. |
| 6,480,487 B1 | 11/2002 | Wegleitner et al. |
| 6,480,660 B1 | 11/2002 | Reitmeier et al. |
| 6,483,977 B2 | 11/2002 | Battey et al. |
| 6,484,958 B1 | 11/2002 | Xue et al. |
| 6,494,550 B1 | 12/2002 | Chen et al. |
| 6,496,640 B1 | 12/2002 | Harvey et al. |
| 6,504,988 B1 | 1/2003 | Trebesch et al. |
| 6,507,980 B2 | 1/2003 | Bremicker |
| 6,510,274 B1 | 1/2003 | Wu et al. |
| 6,532,332 B2 | 3/2003 | Solheid et al. |
| 6,533,472 B1 | 3/2003 | Dinh et al. |
| 6,535,397 B2 | 3/2003 | Clark et al. |
| 6,535,682 B1 | 3/2003 | Puetz et al. |
| 6,539,147 B1 | 3/2003 | Mahony |
| 6,539,160 B2 | 3/2003 | Battey et al. |
| 6,542,688 B1 | 4/2003 | Battey et al. |
| 6,544,075 B1 | 4/2003 | Liao |
| 6,550,977 B2 | 4/2003 | Hizuka |
| 6,554,485 B1 | 4/2003 | Beatty et al. |
| 6,560,334 B1 | 5/2003 | Mullaney et al. |
| 6,567,601 B2 | 5/2003 | Daoud et al. |
| 6,568,542 B1 | 5/2003 | Chen |
| 6,571,048 B1 | 5/2003 | Bechamps et al. |
| 6,577,595 B1 | 6/2003 | Counterman |
| 6,577,801 B2 | 6/2003 | Broderick et al. |
| 6,579,014 B2 | 6/2003 | Melton et al. |
| 6,584,267 B1 | 6/2003 | Caveney et al. |
| 6,585,423 B1 | 7/2003 | Vergeest |
| 6,587,630 B2 | 7/2003 | Spence et al. |
| 6,588,938 B1 | 7/2003 | Lampert et al. |
| 6,591,051 B2 | 7/2003 | Solheid et al. |
| 6,591,053 B2 | 7/2003 | Fritz |
| 6,592,266 B1 | 7/2003 | Hankins et al. |
| 6,597,670 B1 | 7/2003 | Tweedy et al. |
| 6,600,106 B2 | 7/2003 | Standish et al. |
| 6,600,866 B2 | 7/2003 | Gatica et al. |
| 6,601,997 B2 | 8/2003 | Ngo |
| 6,612,515 B1 | 9/2003 | Tinucci et al. |
| 6,612,874 B1 | 9/2003 | Stout et al. |
| 6,614,978 B1 | 9/2003 | Caveney |
| 6,614,980 B1 | 9/2003 | Mahony |
| 6,621,975 B2 | 9/2003 | Laporte et al. |
| 6,622,873 B2 | 9/2003 | Hegrenes et al. |
| 6,624,389 B1 | 9/2003 | Cox |
| 6,625,374 B2 | 9/2003 | Holman et al. |
| 6,625,375 B1 | 9/2003 | Mahony |
| 6,631,237 B2 | 10/2003 | Knudsen et al. |
| 6,640,042 B2 | 10/2003 | Araki et al. |
| RE38,311 E | 11/2003 | Wheeler |
| 6,644,863 B1 | 11/2003 | Azami et al. |
| 6,647,197 B1 | 11/2003 | Marrs et al. |
| 6,648,520 B2 | 11/2003 | McDonald et al. |
| 6,654,536 B2 | 11/2003 | Battey et al. |
| 6,668,127 B1 | 12/2003 | Mahony |
| 6,669,149 B2 | 12/2003 | Akizuki |
| 6,677,520 B1 | 1/2004 | Kim et al. |
| 6,679,604 B1 | 1/2004 | Bove et al. |
| 6,684,005 B1 | 1/2004 | Egnell et al. |
| 6,687,450 B1 | 2/2004 | Kempeneers et al. |
| 6,693,552 B1 | 2/2004 | Herzig et al. |
| 6,695,620 B1 | 2/2004 | Huang |
| 6,701,056 B2 | 3/2004 | Burek et al. |
| 6,710,366 B1 | 3/2004 | Lee et al. |
| 6,715,619 B2 | 4/2004 | Kim et al. |
| 6,719,149 B2 | 4/2004 | Tomino |
| 6,721,482 B1 | 4/2004 | Glynn |
| 6,741,784 B1 | 5/2004 | Guan |
| 6,741,785 B2 | 5/2004 | Barthel et al. |
| 6,746,037 B1 | 6/2004 | Kaplenski et al. |
| 6,748,154 B2 | 6/2004 | O'Leary et al. |
| 6,748,155 B2 | 6/2004 | Kim et al. |
| 6,758,600 B2 | 7/2004 | Del Grosso et al. |
| 6,768,860 B2 | 7/2004 | Liberty |
| 6,771,861 B2 | 8/2004 | Wagner et al. |
| 6,773,297 B2 | 8/2004 | Komiya |
| 6,778,525 B1 | 8/2004 | Baum et al. |
| 6,778,752 B2 | 8/2004 | Laporte et al. |

(56) References Cited

U.S. PATENT DOCUMENTS

| | | |
|---|---|---|
| 6,786,647 B1 | 9/2004 | Hinds et al. |
| 6,786,743 B2 | 9/2004 | Huang |
| 6,786,896 B1 | 9/2004 | Madhani et al. |
| 6,788,871 B2 | 9/2004 | Taylor |
| 6,792,190 B2 | 9/2004 | Xin et al. |
| 6,798,751 B1 | 9/2004 | Voit et al. |
| 6,804,447 B2 | 10/2004 | Smith et al. |
| 6,810,194 B2 | 10/2004 | Griffiths et al. |
| 6,813,412 B2 | 11/2004 | Lin |
| 6,816,660 B2 | 11/2004 | Nashimoto |
| 6,818,834 B1 | 11/2004 | Lin |
| 6,819,856 B2 | 11/2004 | Dagley et al. |
| 6,819,857 B2 | 11/2004 | Douglas et al. |
| 6,822,874 B1 | 11/2004 | Marler |
| 6,826,174 B1 | 11/2004 | Erekson et al. |
| 6,826,346 B2 | 11/2004 | Sloan et al. |
| 6,826,631 B2 | 11/2004 | Webb |
| 6,830,489 B2 | 12/2004 | Aoyama |
| 6,839,428 B2 | 1/2005 | Brower et al. |
| 6,839,438 B1 | 1/2005 | Riegelsberger et al. |
| 6,840,815 B2 | 1/2005 | Musolf et al. |
| 6,845,207 B2 | 1/2005 | Schray |
| 6,847,614 B2 | 1/2005 | Banker et al. |
| 6,848,862 B1 | 2/2005 | Schlig |
| 6,850,685 B2 | 2/2005 | Tinucci et al. |
| 6,853,637 B1 | 2/2005 | Norrell et al. |
| 6,854,894 B1 | 2/2005 | Yunker et al. |
| 6,856,334 B1 | 2/2005 | Fukui |
| 6,856,505 B1 | 2/2005 | Venegas et al. |
| 6,863,444 B2 | 3/2005 | Anderson et al. |
| 6,865,331 B2 | 3/2005 | Mertesdorf |
| 6,865,334 B2 | 3/2005 | Cooke et al. |
| 6,866,541 B2 | 3/2005 | Barker et al. |
| 6,868,216 B1 | 3/2005 | Gehrke |
| 6,869,227 B2 | 3/2005 | Del Grosso et al. |
| 6,870,734 B2 | 3/2005 | Mertesdorf et al. |
| 6,870,997 B2 | 3/2005 | Cooke |
| 6,879,545 B2 | 4/2005 | Cooke et al. |
| 6,915,058 B2 | 7/2005 | Pons |
| 6,920,273 B2 | 7/2005 | Knudsen |
| 6,920,274 B2 | 7/2005 | Rapp et al. |
| 6,923,406 B2 | 8/2005 | Akizuki |
| 6,925,241 B2 | 8/2005 | Bohle et al. |
| 6,934,451 B2 | 8/2005 | Cooke |
| 6,934,456 B2 | 8/2005 | Ferris et al. |
| 6,935,598 B2 | 8/2005 | Sono et al. |
| 6,937,807 B2 | 8/2005 | Franklin et al. |
| 6,944,383 B1 | 9/2005 | Herzog et al. |
| 6,944,389 B2 | 9/2005 | Giraud et al. |
| 6,945,701 B2 | 9/2005 | Trezza et al. |
| 6,952,530 B2 | 10/2005 | Helvajian et al. |
| 6,963,690 B1 | 11/2005 | Kassal et al. |
| 6,968,107 B2 | 11/2005 | Belardi et al. |
| 6,968,111 B2 | 11/2005 | Trebesch et al. |
| 6,985,665 B2 | 1/2006 | Baechtle |
| 6,993,237 B2 | 1/2006 | Cooke et al. |
| 7,000,784 B2 | 2/2006 | Canty et al. |
| 7,005,582 B2 | 2/2006 | Muller et al. |
| 7,006,748 B2 | 2/2006 | Dagley et al. |
| 7,007,296 B2 | 2/2006 | Rakib |
| 7,025,275 B2 | 4/2006 | Huang et al. |
| 7,027,695 B2 | 4/2006 | Cooke et al. |
| 7,027,706 B2 | 4/2006 | Diaz et al. |
| 7,031,588 B2 | 4/2006 | Cowley et al. |
| 7,035,510 B2 | 4/2006 | Zimmel et al. |
| 7,038,137 B2 | 5/2006 | Grubish et al. |
| 7,048,447 B1 | 5/2006 | Patel et al. |
| 7,054,513 B2 | 5/2006 | Herz et al. |
| 7,066,748 B2 | 6/2006 | Bricaud et al. |
| 7,068,907 B2 | 6/2006 | Schray |
| 7,070,459 B2 | 7/2006 | Denovich et al. |
| 7,077,710 B2 | 7/2006 | Haggay et al. |
| 7,079,744 B2 | 7/2006 | Douglas et al. |
| 7,090,406 B2 | 8/2006 | Melton et al. |
| 7,090,407 B2 | 8/2006 | Melton et al. |
| 7,094,095 B1 | 8/2006 | Caveney |
| 7,097,047 B2 | 8/2006 | Lee et al. |
| 7,101,093 B2 | 9/2006 | Hsiao et al. |
| 7,102,884 B2 | 9/2006 | Mertesdorf et al. |
| 7,103,255 B2 | 9/2006 | Reagan et al. |
| 7,110,654 B2 | 9/2006 | Dillat |
| 7,111,990 B2 | 9/2006 | Melton et al. |
| 7,113,679 B2 | 9/2006 | Melton et al. |
| 7,113,686 B2 | 9/2006 | Bellekens et al. |
| 7,113,687 B2 | 9/2006 | Womack et al. |
| 7,116,491 B1 | 10/2006 | Willey et al. |
| 7,116,883 B2 | 10/2006 | Kline et al. |
| 7,118,281 B2 | 10/2006 | Chiu et al. |
| 7,118,405 B2 | 10/2006 | Peng |
| 7,120,347 B2 | 10/2006 | Blackwell, Jr. et al. |
| 7,120,348 B2 | 10/2006 | Trebesch et al. |
| 7,120,349 B2 | 10/2006 | Elliott |
| 7,127,143 B2 | 10/2006 | Elkins, II et al. |
| 7,128,471 B2 | 10/2006 | Wilson |
| 7,136,555 B2 | 11/2006 | Theuerkorn et al. |
| 7,139,462 B1 | 11/2006 | Richtman |
| 7,140,903 B2 | 11/2006 | Pulizzi et al. |
| 7,147,383 B2 | 12/2006 | Sullivan |
| 7,170,466 B2 | 1/2007 | Janoschka |
| 7,171,099 B2 | 1/2007 | Barnes et al. |
| 7,171,121 B1 | 1/2007 | Skarica et al. |
| 7,181,142 B1 | 2/2007 | Xu et al. |
| 7,186,134 B2 | 3/2007 | Togami et al. |
| 7,193,783 B2 | 3/2007 | Willey et al. |
| 7,194,181 B2 | 3/2007 | Holmberg et al. |
| 7,195,521 B2 | 3/2007 | Musolf et al. |
| 7,200,314 B2 | 4/2007 | Womack et al. |
| 7,200,316 B2 | 4/2007 | Giraud et al. |
| 7,201,595 B1 | 4/2007 | Morello |
| 7,217,040 B2 | 5/2007 | Crews et al. |
| 7,218,526 B2 | 5/2007 | Mayer |
| 7,220,065 B2 | 5/2007 | Han et al. |
| 7,221,832 B2 | 5/2007 | Tinucci |
| 7,228,036 B2 | 6/2007 | Elkins, II et al. |
| 7,228,047 B1 | 6/2007 | Szilagyi et al. |
| 7,231,125 B2 | 6/2007 | Douglas et al. |
| 7,234,878 B2 | 6/2007 | Yamauchi et al. |
| 7,236,677 B2 | 6/2007 | Escoto et al. |
| 7,239,789 B2 | 7/2007 | Grubish et al. |
| 7,245,809 B1 | 7/2007 | Gniadek et al. |
| 7,259,325 B2 | 8/2007 | Pincu et al. |
| 7,266,283 B2 | 9/2007 | Kline et al. |
| 7,270,485 B1 | 9/2007 | Robinson et al. |
| 7,272,291 B2 | 9/2007 | Bayazit et al. |
| 7,274,852 B1 | 9/2007 | Smrha et al. |
| 7,284,785 B2 | 10/2007 | Gotou et al. |
| 7,287,913 B2 | 10/2007 | Keenum et al. |
| 7,289,731 B2 | 10/2007 | Thinguldstad |
| 7,292,769 B2 | 11/2007 | Watanabe et al. |
| 7,298,950 B2 | 11/2007 | Frohlich |
| 7,300,216 B2 | 11/2007 | Morse et al. |
| 7,300,308 B2 | 11/2007 | Laursen et al. |
| 7,302,149 B2 | 11/2007 | Swam et al. |
| 7,302,153 B2 | 11/2007 | Thom |
| 7,302,154 B2 | 11/2007 | Trebesch et al. |
| 7,308,184 B2 | 12/2007 | Barnes et al. |
| 7,310,471 B2 | 12/2007 | Bayazit et al. |
| 7,310,472 B2 | 12/2007 | Haberman |
| 7,315,681 B2 | 1/2008 | Kewitsch |
| 7,325,975 B2 | 2/2008 | Yamada et al. |
| 7,330,624 B2 | 2/2008 | Isenhour et al. |
| 7,330,625 B2 | 2/2008 | Barth |
| 7,330,626 B2 | 2/2008 | Kowalczyk et al. |
| 7,330,629 B2 | 2/2008 | Cooke et al. |
| 7,331,718 B2 | 2/2008 | Yazaki et al. |
| 7,340,145 B2 | 3/2008 | Allen |
| 7,349,615 B2 | 3/2008 | Frazier et al. |
| 7,352,946 B2 | 4/2008 | Heller et al. |
| 7,352,947 B2 | 4/2008 | Phung et al. |
| 7,373,071 B2 | 5/2008 | Douglas et al. |
| 7,376,321 B2 | 5/2008 | Bolster et al. |
| 7,376,323 B2 | 5/2008 | Zimmel |
| 7,391,952 B1 | 6/2008 | Ugolini et al. |
| 7,397,996 B2 | 7/2008 | Herzog et al. |

(56) References Cited

U.S. PATENT DOCUMENTS

| | | |
|---|---|---|
| 7,400,813 B2 | 7/2008 | Zimmel |
| 7,404,736 B2 | 7/2008 | Herbst et al. |
| 7,409,137 B2 | 8/2008 | Barnes |
| 7,414,198 B2 | 8/2008 | Stansbie et al. |
| 7,417,188 B2 | 8/2008 | McNutt et al. |
| 7,418,182 B2 | 8/2008 | Krampotich |
| 7,418,184 B1 | 8/2008 | Gonzales et al. |
| 7,421,182 B2 | 9/2008 | Bayazit et al. |
| 7,428,363 B2 | 9/2008 | Leon et al. |
| 7,435,090 B1 | 10/2008 | Schriefer et al. |
| 7,437,049 B2 | 10/2008 | Krampotich |
| 7,439,453 B2 | 10/2008 | Murano et al. |
| 7,454,113 B2 | 11/2008 | Barnes |
| 7,460,757 B2 | 12/2008 | Hoehne et al. |
| 7,460,758 B2 | 12/2008 | Xin |
| 7,461,981 B2 | 12/2008 | Yow, Jr. et al. |
| 7,462,779 B2 | 12/2008 | Caveney et al. |
| 7,463,810 B2 | 12/2008 | Bayazit et al. |
| 7,463,811 B2 | 12/2008 | Trebesch et al. |
| 7,469,090 B2 | 12/2008 | Ferris et al. |
| 7,471,867 B2 | 12/2008 | Vogel et al. |
| 7,474,828 B2 | 1/2009 | Leon et al. |
| 7,477,824 B2 | 1/2009 | Reagan et al. |
| 7,477,826 B2 | 1/2009 | Mullaney et al. |
| 7,480,438 B2 | 1/2009 | Douglas et al. |
| 7,488,205 B2 | 2/2009 | Spisany et al. |
| 7,493,002 B2 | 2/2009 | Coburn et al. |
| 7,496,269 B1 | 2/2009 | Lee |
| 7,499,622 B2 | 3/2009 | Castonguay et al. |
| 7,499,623 B2 | 3/2009 | Barnes et al. |
| 7,507,111 B2 | 3/2009 | Togami et al. |
| 7,509,015 B2 | 3/2009 | Murano |
| 7,509,016 B2 | 3/2009 | Smith et al. |
| 7,510,421 B2 | 3/2009 | Fransen et al. |
| 7,522,804 B2 | 4/2009 | Araki et al. |
| 7,523,898 B1 | 4/2009 | Barry et al. |
| 7,526,171 B2 | 4/2009 | Caveney et al. |
| 7,526,172 B2 | 4/2009 | Gniadek et al. |
| 7,526,174 B2 | 4/2009 | Leon et al. |
| 7,529,458 B2 | 5/2009 | Spisany et al. |
| 7,534,958 B2 | 5/2009 | McNutt et al. |
| 7,536,075 B2 | 5/2009 | Zimmel |
| 7,540,666 B2 | 6/2009 | Luther et al. |
| 7,542,645 B1 | 6/2009 | Hua et al. |
| 7,544,085 B2 | 6/2009 | Baldwin et al. |
| 7,552,899 B2 | 6/2009 | Chen et al. |
| 7,555,193 B2 | 6/2009 | Rapp et al. |
| 7,558,458 B2 | 7/2009 | Gronvall et al. |
| 7,565,051 B2 | 7/2009 | Vongseng |
| 7,567,744 B2 | 7/2009 | Krampotich et al. |
| 7,570,860 B2 | 8/2009 | Smrha et al. |
| 7,570,861 B2 | 8/2009 | Smrha et al. |
| 7,577,331 B2 | 8/2009 | Laurisch et al. |
| 7,596,293 B2 | 9/2009 | Isenhour et al. |
| 7,603,020 B1 | 10/2009 | Wakileh et al. |
| 7,607,938 B2 | 10/2009 | Clark et al. |
| 7,609,967 B2 | 10/2009 | Hochbaum et al. |
| 7,613,377 B2 | 11/2009 | Gonzales et al. |
| 7,614,903 B1 | 11/2009 | Huang |
| 7,620,272 B2 | 11/2009 | Hino et al. |
| 7,620,287 B2 | 11/2009 | Appenzeller et al. |
| 7,641,398 B2 | 1/2010 | O'Riorden et al. |
| 7,668,430 B2 | 2/2010 | McClellan et al. |
| 7,668,433 B2 | 2/2010 | Bayazit et al. |
| 7,672,561 B1 | 3/2010 | Keith et al. |
| 7,676,135 B2 | 3/2010 | Chen |
| 7,689,079 B2 | 3/2010 | Burnham et al. |
| 7,694,926 B2 | 4/2010 | Allen et al. |
| 7,697,811 B2 | 4/2010 | Murano et al. |
| 7,706,294 B2 | 4/2010 | Natarajan et al. |
| 7,715,125 B2 | 5/2010 | Willey |
| 7,715,683 B2 | 5/2010 | Kowalczyk et al. |
| 7,734,138 B2 | 6/2010 | Bloodworth et al. |
| 7,740,409 B2 | 6/2010 | Bolton et al. |
| 7,743,495 B2 | 6/2010 | Mori et al. |
| 7,751,674 B2 | 7/2010 | Hill |
| 7,751,675 B2 | 7/2010 | Holmberg et al. |
| 7,756,371 B1 | 7/2010 | Burnham et al. |
| 7,756,382 B2 | 7/2010 | Saravanos et al. |
| 7,760,984 B2 | 7/2010 | Solheid et al. |
| 7,764,858 B2 | 7/2010 | Bayazit et al. |
| 7,764,859 B2 | 7/2010 | Krampotich et al. |
| 7,769,266 B2 | 8/2010 | Morris |
| 7,805,044 B2 | 9/2010 | Reagan et al. |
| 7,809,232 B2 | 10/2010 | Reagan et al. |
| 7,809,235 B2 | 10/2010 | Reagan et al. |
| 7,811,136 B1 | 10/2010 | Hsieh et al. |
| 7,822,310 B2 | 10/2010 | Castonguay et al. |
| 7,837,495 B2 | 11/2010 | Baldwin et al. |
| 7,850,372 B2 | 12/2010 | Nishimura et al. |
| 7,853,112 B2 | 12/2010 | Zimmel et al. |
| 7,856,166 B2 | 12/2010 | Biribuze et al. |
| 7,862,369 B2 | 1/2011 | Gimenes et al. |
| 7,869,685 B2 | 1/2011 | Hendrickson et al. |
| 7,876,580 B2 | 1/2011 | Mayer |
| 7,899,298 B2 | 3/2011 | Cox et al. |
| 7,914,332 B2 | 3/2011 | Song et al. |
| 7,942,589 B2 | 5/2011 | Yazaki et al. |
| 7,945,135 B2 | 5/2011 | Cooke et al. |
| 7,945,136 B2 | 5/2011 | Cooke et al. |
| 7,945,138 B2 | 5/2011 | Hill et al. |
| 7,970,250 B2 | 6/2011 | Morris |
| 7,991,252 B2 | 8/2011 | Cheng et al. |
| 8,009,959 B2 | 8/2011 | Barnes et al. |
| 8,014,171 B2 | 9/2011 | Kelly et al. |
| 8,014,646 B2 | 9/2011 | Keith et al. |
| 8,020,813 B1 | 9/2011 | Clark et al. |
| 8,059,932 B2 | 11/2011 | Hill et al. |
| 8,093,499 B2 | 1/2012 | Hoffer et al. |
| 8,107,785 B2 | 1/2012 | Berglund et al. |
| 8,131,126 B2 | 3/2012 | Kowalczyk et al. |
| 8,184,938 B2 | 5/2012 | Cooke et al. |
| 8,206,043 B2 | 6/2012 | Thirugnanam et al. |
| 8,206,058 B2 | 6/2012 | Vrondran et al. |
| 8,220,881 B2 | 7/2012 | Keith |
| 8,226,305 B2 | 7/2012 | Thirugnanam et al. |
| 8,249,410 B2 | 8/2012 | Andrus et al. |
| 8,251,591 B2 | 8/2012 | Barnes et al. |
| 8,270,798 B2 | 9/2012 | Dagley et al. |
| 8,280,216 B2 | 10/2012 | Cooke et al. |
| 8,285,104 B2 | 10/2012 | Davis et al. |
| 8,301,004 B2 | 10/2012 | Cooke et al. |
| 8,331,752 B2 | 12/2012 | Biribuze |
| 8,353,494 B2 | 1/2013 | Peng et al. |
| 8,369,679 B2 | 2/2013 | Wakileh et al. |
| 8,391,666 B2 | 3/2013 | Hetzer et al. |
| 8,472,773 B2 | 6/2013 | de Jong |
| 8,491,331 B2 | 7/2013 | Follingstad |
| 8,528,872 B2 | 9/2013 | Mattlin et al. |
| 8,537,477 B2 | 9/2013 | Shioda |
| 8,538,226 B2 | 9/2013 | Makrides-Saravanos et al. |
| 8,559,783 B2 | 10/2013 | Campos et al. |
| 2001/0010741 A1 | 8/2001 | Hizuka |
| 2001/0029125 A1 | 10/2001 | Morita et al. |
| 2002/0010818 A1 | 1/2002 | Wei et al. |
| 2002/0012353 A1 | 1/2002 | Gerszberg et al. |
| 2002/0014571 A1 | 2/2002 | Thompson |
| 2002/0034290 A1 | 3/2002 | Pershan |
| 2002/0037139 A1 | 3/2002 | Asao et al. |
| 2002/0064364 A1 | 5/2002 | Battey et al. |
| 2002/0131730 A1 | 9/2002 | Keeble et al. |
| 2002/0136519 A1 | 9/2002 | Tinucci et al. |
| 2002/0141724 A1 | 10/2002 | Ogawa et al. |
| 2002/0150372 A1 | 10/2002 | Schray |
| 2002/0172467 A1 | 11/2002 | Anderson et al. |
| 2002/0180163 A1 | 12/2002 | Muller et al. |
| 2002/0181918 A1 | 12/2002 | Spence et al. |
| 2002/0181922 A1 | 12/2002 | Xin et al. |
| 2002/0191939 A1 | 12/2002 | Daoud et al. |
| 2002/0194596 A1 | 12/2002 | Srivastava |
| 2003/0002802 A1 | 1/2003 | Trezza et al. |
| 2003/0007743 A1 | 1/2003 | Asada |
| 2003/0007767 A1 | 1/2003 | Douglas et al. |
| 2003/0011855 A1 | 1/2003 | Fujiwara |

(56) References Cited

U.S. PATENT DOCUMENTS

| | | |
|---|---|---|
| 2003/0021539 A1 | 1/2003 | Kwon et al. |
| 2003/0036748 A1 | 2/2003 | Cooper et al. |
| 2003/0051026 A1 | 3/2003 | Carter et al. |
| 2003/0066998 A1 | 4/2003 | Lee |
| 2003/0086675 A1 | 5/2003 | Wu et al. |
| 2003/0095753 A1 | 5/2003 | Wada et al. |
| 2003/0147604 A1 | 8/2003 | Tapia et al. |
| 2003/0156552 A1 | 8/2003 | Banker et al. |
| 2003/0174996 A1 | 9/2003 | Henschel et al. |
| 2003/0180004 A1 | 9/2003 | Cox et al. |
| 2003/0180012 A1 | 9/2003 | Deane et al. |
| 2003/0183413 A1 | 10/2003 | Kato |
| 2003/0199201 A1 | 10/2003 | Mullaney et al. |
| 2003/0210882 A1 | 11/2003 | Barthel et al. |
| 2003/0223723 A1 | 12/2003 | Massey et al. |
| 2003/0223725 A1 | 12/2003 | Laporte et al. |
| 2003/0235387 A1 | 12/2003 | Dufour |
| 2004/0001717 A1 | 1/2004 | Bennett et al. |
| 2004/0013389 A1 | 1/2004 | Taylor |
| 2004/0013390 A1 | 1/2004 | Kim et al. |
| 2004/0022494 A1 | 2/2004 | Liddle et al. |
| 2004/0024934 A1 | 2/2004 | Webb |
| 2004/0067036 A1 | 4/2004 | Clark et al. |
| 2004/0074852 A1 | 4/2004 | Knudsen et al. |
| 2004/0086238 A1 | 5/2004 | Finona et al. |
| 2004/0086252 A1 | 5/2004 | Smith et al. |
| 2004/0120679 A1 | 6/2004 | Vincent et al. |
| 2004/0147159 A1 | 7/2004 | Urban et al. |
| 2004/0151465 A1 | 8/2004 | Krampotich et al. |
| 2004/0175090 A1 | 9/2004 | Vastmans et al. |
| 2004/0192115 A1 | 9/2004 | Bugg |
| 2004/0196841 A1 | 10/2004 | Tudor et al. |
| 2004/0208459 A1 | 10/2004 | Mizue et al. |
| 2004/0228598 A1 | 11/2004 | Allen et al. |
| 2004/0240827 A1 | 12/2004 | Daoud et al. |
| 2004/0240882 A1 | 12/2004 | Lipski et al. |
| 2004/0264873 A1 | 12/2004 | Smith et al. |
| 2005/0002633 A1 | 1/2005 | Solheid et al. |
| 2005/0008131 A1 | 1/2005 | Cook |
| 2005/0026497 A1 | 2/2005 | Holliday |
| 2005/0036749 A1 | 2/2005 | Vogel et al. |
| 2005/0067358 A1 | 3/2005 | Lee et al. |
| 2005/0069248 A1 | 3/2005 | Jasti et al. |
| 2005/0074990 A1 | 4/2005 | Shearman et al. |
| 2005/0076149 A1 | 4/2005 | McKown et al. |
| 2005/0083959 A1 | 4/2005 | Binder |
| 2005/0107086 A1 | 5/2005 | Tell et al. |
| 2005/0111809 A1 | 5/2005 | Giraud et al. |
| 2005/0111810 A1 | 5/2005 | Giraud et al. |
| 2005/0123261 A1 | 6/2005 | Bellekens et al. |
| 2005/0129379 A1 | 6/2005 | Reagan et al. |
| 2005/0175293 A1 | 8/2005 | Byers et al. |
| 2005/0178573 A1 | 8/2005 | James |
| 2005/0201073 A1 | 9/2005 | Pincu et al. |
| 2005/0232566 A1 | 10/2005 | Rapp et al. |
| 2005/0233647 A1 | 10/2005 | Denovich et al. |
| 2005/0254757 A1 | 11/2005 | Ferretti, III et al. |
| 2005/0281526 A1 | 12/2005 | Vongseng et al. |
| 2005/0281527 A1 | 12/2005 | Wilson et al. |
| 2005/0285493 A1 | 12/2005 | Hu et al. |
| 2006/0007562 A1 | 1/2006 | Willey et al. |
| 2006/0018448 A1 | 1/2006 | Stevens et al. |
| 2006/0018622 A1 | 1/2006 | Caveney |
| 2006/0034048 A1 | 2/2006 | Xu |
| 2006/0039290 A1 | 2/2006 | Roden et al. |
| 2006/0044774 A1 | 3/2006 | Vasavda et al. |
| 2006/0045458 A1 | 3/2006 | Sasaki et al. |
| 2006/0072606 A1 | 4/2006 | Posthuma |
| 2006/0077968 A1 | 4/2006 | Pitsoulakis et al. |
| 2006/0093303 A1 | 5/2006 | Reagan et al. |
| 2006/0103270 A1 | 5/2006 | Bergesch et al. |
| 2006/0110118 A1 | 5/2006 | Escoto et al. |
| 2006/0127026 A1 | 6/2006 | Beck |
| 2006/0133736 A1 | 6/2006 | Sullivan |
| 2006/0133759 A1 | 6/2006 | Mullaney et al. |
| 2006/0147172 A1 | 7/2006 | Luther et al. |
| 2006/0153517 A1 | 7/2006 | Reagan et al. |
| 2006/0160377 A1 | 7/2006 | Huang |
| 2006/0165365 A1 | 7/2006 | Feustel et al. |
| 2006/0165366 A1 | 7/2006 | Feustel et al. |
| 2006/0191700 A1 | 8/2006 | Herzog et al. |
| 2006/0193590 A1 | 8/2006 | Puetz et al. |
| 2006/0193591 A1 | 8/2006 | Rapp et al. |
| 2006/0198098 A1 | 9/2006 | Clark et al. |
| 2006/0204179 A1 | 9/2006 | Patel et al. |
| 2006/0215980 A1 | 9/2006 | Bayazit et al. |
| 2006/0225912 A1 | 10/2006 | Clark et al. |
| 2006/0228087 A1 | 10/2006 | Bayazit et al. |
| 2006/0269194 A1 | 11/2006 | Luther et al. |
| 2006/0269206 A1 | 11/2006 | Zimmel |
| 2006/0269208 A1 | 11/2006 | Allen et al. |
| 2006/0275008 A1 | 12/2006 | Xin |
| 2006/0275009 A1 | 12/2006 | Ellison et al. |
| 2006/0285812 A1 | 12/2006 | Ferris et al. |
| 2007/0003204 A1 | 1/2007 | Makrides-Saravanos et al. |
| 2007/0025070 A1 | 2/2007 | Jiang et al. |
| 2007/0031099 A1 | 2/2007 | Herzog et al. |
| 2007/0033629 A1 | 2/2007 | McGranahan et al. |
| 2007/0047894 A1 | 3/2007 | Holmberg et al. |
| 2007/0058641 A1 | 3/2007 | Cicchetti et al. |
| 2007/0086723 A1 | 4/2007 | Sasaki et al. |
| 2007/0104447 A1 | 5/2007 | Allen |
| 2007/0110373 A1 | 5/2007 | Dudek et al. |
| 2007/0127201 A1 | 6/2007 | Mertesdorf et al. |
| 2007/0131628 A1 | 6/2007 | Mimlitch, III et al. |
| 2007/0183732 A1 | 8/2007 | Wittmeier et al. |
| 2007/0189692 A1 | 8/2007 | Zimmel et al. |
| 2007/0196071 A1 | 8/2007 | Laursen et al. |
| 2007/0221793 A1 | 9/2007 | Kusuda et al. |
| 2007/0237484 A1 | 10/2007 | Reagan et al. |
| 2007/0257159 A1 | 11/2007 | Nelson et al. |
| 2007/0266192 A1 | 11/2007 | Campini et al. |
| 2007/0274718 A1 | 11/2007 | Bridges et al. |
| 2008/0011514 A1 | 1/2008 | Zheng et al. |
| 2008/0025683 A1 | 1/2008 | Murano |
| 2008/0031585 A1 | 2/2008 | Solheid et al. |
| 2008/0063350 A1 | 3/2008 | Trebesch et al. |
| 2008/0068788 A1 | 3/2008 | Ozawa et al. |
| 2008/0069511 A1 | 3/2008 | Blackwell, Jr. et al. |
| 2008/0069512 A1 | 3/2008 | Barnes et al. |
| 2008/0078899 A1 | 4/2008 | Chen et al. |
| 2008/0080826 A1 | 4/2008 | Leon et al. |
| 2008/0080827 A1 | 4/2008 | Leon et al. |
| 2008/0080828 A1 | 4/2008 | Leon et al. |
| 2008/0085094 A1 | 4/2008 | Krampotich |
| 2008/0089656 A1 | 4/2008 | Wagner et al. |
| 2008/0095502 A1 | 4/2008 | McColloch |
| 2008/0095541 A1 | 4/2008 | Dallesasse |
| 2008/0100440 A1 | 5/2008 | Downie et al. |
| 2008/0106871 A1 | 5/2008 | James |
| 2008/0112681 A1 | 5/2008 | Battey et al. |
| 2008/0118207 A1 | 5/2008 | Yamamoto et al. |
| 2008/0121423 A1 | 5/2008 | Vogel et al. |
| 2008/0124039 A1 | 5/2008 | Gniadek et al. |
| 2008/0131068 A1 | 6/2008 | Mertesdorf et al. |
| 2008/0145013 A1 | 6/2008 | Escoto et al. |
| 2008/0152294 A1 | 6/2008 | Hirano et al. |
| 2008/0166094 A1 | 7/2008 | Bookbinder et al. |
| 2008/0166131 A1 | 7/2008 | Hudgins et al. |
| 2008/0175541 A1 | 7/2008 | Lu et al. |
| 2008/0175550 A1 | 7/2008 | Coburn et al. |
| 2008/0175551 A1 | 7/2008 | Smrha et al. |
| 2008/0175552 A1 | 7/2008 | Smrha et al. |
| 2008/0193091 A1 | 8/2008 | Herbst |
| 2008/0205823 A1 | 8/2008 | Luther et al. |
| 2008/0205843 A1 | 8/2008 | Castonguay et al. |
| 2008/0205844 A1 | 8/2008 | Castonguay et al. |
| 2008/0212928 A1 | 9/2008 | Kowalczyk et al. |
| 2008/0219632 A1 | 9/2008 | Smith et al. |
| 2008/0219634 A1 | 9/2008 | Rapp et al. |
| 2008/0236858 A1 | 10/2008 | Quijano |
| 2008/0247723 A1 | 10/2008 | Herzog et al. |
| 2008/0267573 A1 | 10/2008 | Douglas et al. |
| 2008/0285934 A1 | 11/2008 | Standish et al. |

(56) References Cited

U.S. PATENT DOCUMENTS

| | | |
|---|---|---|
| 2008/0292261 A1 | 11/2008 | Kowalczyk et al. |
| 2008/0296060 A1 | 12/2008 | Hawley et al. |
| 2008/0298763 A1 | 12/2008 | Appenzeller et al. |
| 2008/0304803 A1 | 12/2008 | Krampotich et al. |
| 2008/0310810 A1 | 12/2008 | Gallagher |
| 2009/0010607 A1 | 1/2009 | Elisson et al. |
| 2009/0016685 A1 | 1/2009 | Hudgins et al. |
| 2009/0022470 A1 | 1/2009 | Krampotich |
| 2009/0038845 A1 | 2/2009 | Fransen et al. |
| 2009/0060439 A1 | 3/2009 | Cox et al. |
| 2009/0060440 A1 | 3/2009 | Wright et al. |
| 2009/0067800 A1 | 3/2009 | Vazquez et al. |
| 2009/0074371 A1 | 3/2009 | Bayazit et al. |
| 2009/0080849 A1 | 3/2009 | Hankins et al. |
| 2009/0097813 A1 | 4/2009 | Hill |
| 2009/0110347 A1 | 4/2009 | Jacobsson |
| 2009/0121092 A1 | 5/2009 | Keith |
| 2009/0136194 A1 | 5/2009 | Barnes |
| 2009/0136195 A1 | 5/2009 | Smrha et al. |
| 2009/0136196 A1 | 5/2009 | Trebesch et al. |
| 2009/0146342 A1 | 6/2009 | Haney et al. |
| 2009/0148117 A1 | 6/2009 | Laurisch |
| 2009/0166404 A1 | 7/2009 | German et al. |
| 2009/0169163 A1 | 7/2009 | Abbott, III et al. |
| 2009/0175588 A1 | 7/2009 | Brandt et al. |
| 2009/0180749 A1 | 7/2009 | Douglas et al. |
| 2009/0184221 A1 | 7/2009 | Sculler |
| 2009/0185782 A1 | 7/2009 | Parikh et al. |
| 2009/0191891 A1 | 7/2009 | Ma et al. |
| 2009/0194647 A1 | 8/2009 | Keith |
| 2009/0196563 A1 | 8/2009 | Mullsteff et al. |
| 2009/0202214 A1 | 8/2009 | Holmberg et al. |
| 2009/0207577 A1 | 8/2009 | Fransen et al. |
| 2009/0208178 A1 | 8/2009 | Kowalczyk et al. |
| 2009/0208210 A1 | 8/2009 | Trojer et al. |
| 2009/0212679 A1 | 8/2009 | Frousiakis et al. |
| 2009/0214171 A1 | 8/2009 | Coburn et al. |
| 2009/0220200 A1 | 9/2009 | Wong et al. |
| 2009/0220204 A1 | 9/2009 | Ruiz |
| 2009/0226142 A1 | 9/2009 | Barnes et al. |
| 2009/0238531 A1 | 9/2009 | Holmberg et al. |
| 2009/0245743 A1 | 10/2009 | Cote et al. |
| 2009/0252472 A1 | 10/2009 | Solheid et al. |
| 2009/0257726 A1 | 10/2009 | Redmann et al. |
| 2009/0257727 A1 | 10/2009 | Laurisch et al. |
| 2009/0257754 A1 | 10/2009 | Theodoras, II et al. |
| 2009/0263096 A1 | 10/2009 | Solheid et al. |
| 2009/0263122 A1 | 10/2009 | Helkey et al. |
| 2009/0267865 A1 | 10/2009 | Miller et al. |
| 2009/0269016 A1 | 10/2009 | Korampally et al. |
| 2009/0269018 A1 | 10/2009 | Frohlich et al. |
| 2009/0269019 A1 | 10/2009 | Andrus et al. |
| 2009/0274429 A1 | 11/2009 | Krampotich et al. |
| 2009/0274430 A1 | 11/2009 | Krampotich et al. |
| 2009/0274432 A1 | 11/2009 | Iwaya |
| 2009/0290842 A1 | 11/2009 | Bran de Leon et al. |
| 2009/0290843 A1 | 11/2009 | Reagan et al. |
| 2009/0297111 A1 | 12/2009 | Reagan et al. |
| 2009/0304342 A1 | 12/2009 | Adomeit et al. |
| 2009/0324189 A1 | 12/2009 | Hill et al. |
| 2010/0003000 A1 | 1/2010 | Rapp et al. |
| 2010/0012671 A1 | 1/2010 | Vrondran et al. |
| 2010/0027953 A1 | 2/2010 | Russell |
| 2010/0054681 A1 | 3/2010 | Biribuze et al. |
| 2010/0054682 A1 | 3/2010 | Cooke et al. |
| 2010/0054683 A1 | 3/2010 | Cooke et al. |
| 2010/0054684 A1 | 3/2010 | Cooke et al. |
| 2010/0054685 A1 | 3/2010 | Cooke et al. |
| 2010/0054686 A1 | 3/2010 | Cooke et al. |
| 2010/0054687 A1 | 3/2010 | Ye et al. |
| 2010/0061691 A1 | 3/2010 | Murano et al. |
| 2010/0061693 A1 | 3/2010 | Bran de Leon et al. |
| 2010/0074587 A1 | 3/2010 | Loeffelholz et al. |
| 2010/0080517 A1 | 4/2010 | Cline et al. |
| 2010/0086267 A1 | 4/2010 | Cooke et al. |
| 2010/0086274 A1 | 4/2010 | Keith |
| 2010/0111483 A1 | 5/2010 | Reinhardt et al. |
| 2010/0119201 A1 | 5/2010 | Smrha et al. |
| 2010/0129035 A1* | 5/2010 | Teo ................................ 385/88 |
| 2010/0142544 A1 | 6/2010 | Chapel et al. |
| 2010/0142910 A1 | 6/2010 | Hill et al. |
| 2010/0150518 A1 | 6/2010 | Leon et al. |
| 2010/0158467 A1 | 6/2010 | Hou et al. |
| 2010/0166377 A1 | 7/2010 | Nair et al. |
| 2010/0178022 A1 | 7/2010 | Schroeder et al. |
| 2010/0202740 A1 | 8/2010 | Barlowe et al. |
| 2010/0202745 A1 | 8/2010 | Sokolowski et al. |
| 2010/0202748 A1 | 8/2010 | Pierce et al. |
| 2010/0220967 A1 | 9/2010 | Cooke et al. |
| 2010/0220968 A1 | 9/2010 | Dagley et al. |
| 2010/0247051 A1 | 9/2010 | Kowalczyk et al. |
| 2010/0266245 A1 | 10/2010 | Sabo |
| 2010/0278499 A1 | 11/2010 | Mures et al. |
| 2010/0296790 A1 | 11/2010 | Cooke et al. |
| 2010/0296791 A1 | 11/2010 | Makrides-Saravanos et al. |
| 2010/0310225 A1 | 12/2010 | Anderson et al. |
| 2010/0310226 A1 | 12/2010 | Wakileh et al. |
| 2010/0316334 A1 | 12/2010 | Kewitsch |
| 2010/0322554 A1 | 12/2010 | Barnes et al. |
| 2010/0322579 A1 | 12/2010 | Cooke et al. |
| 2010/0322580 A1 | 12/2010 | Beamon et al. |
| 2010/0322581 A1 | 12/2010 | Cooke et al. |
| 2010/0322582 A1 | 12/2010 | Cooke et al. |
| 2010/0322583 A1 | 12/2010 | Cooke et al. |
| 2010/0329624 A1 | 12/2010 | Zhou et al. |
| 2011/0008004 A1 | 1/2011 | Liao et al. |
| 2011/0069931 A1 | 3/2011 | Cote et al. |
| 2011/0073730 A1 | 3/2011 | Kitchen |
| 2011/0085774 A1 | 4/2011 | Murphy et al. |
| 2011/0085776 A1 | 4/2011 | Biribuze et al. |
| 2011/0097053 A1 | 4/2011 | Smith et al. |
| 2011/0097977 A1 | 4/2011 | Bubnick et al. |
| 2011/0129185 A1 | 6/2011 | Lewallen et al. |
| 2011/0129186 A1 | 6/2011 | Lewallen et al. |
| 2011/0186532 A1 | 8/2011 | Wu |
| 2011/0192631 A1 | 8/2011 | Burek et al. |
| 2011/0211799 A1 | 9/2011 | Conner et al. |
| 2011/0217014 A1 | 9/2011 | Dominique |
| 2011/0217016 A1 | 9/2011 | Mullsteff |
| 2011/0222821 A1 | 9/2011 | Pitwon et al. |
| 2011/0249950 A1 | 10/2011 | Chapa Ramirez et al. |
| 2011/0268404 A1 | 11/2011 | Cote et al. |
| 2011/0268405 A1 | 11/2011 | Cote et al. |
| 2011/0268407 A1 | 11/2011 | Cowen et al. |
| 2011/0268408 A1 | 11/2011 | Giraud et al. |
| 2011/0268413 A1 | 11/2011 | Cote et al. |
| 2011/0280537 A1 | 11/2011 | Cowen et al. |
| 2012/0025683 A1 | 2/2012 | Mattlin et al. |
| 2012/0051707 A1 | 3/2012 | Barnes et al. |
| 2012/0057838 A1 | 3/2012 | Hill et al. |
| 2012/0106899 A1 | 5/2012 | Choi |
| 2012/0183263 A1 | 7/2012 | Wu |
| 2012/0183289 A1* | 7/2012 | Lou et al. ........................... 398/9 |
| 2012/0219263 A1* | 8/2012 | Beamon et al. ................ 385/135 |
| 2012/0288244 A1* | 11/2012 | Wu et al. ........................ 385/94 |
| 2012/0288248 A1 | 11/2012 | Chapa Ramirez et al. |
| 2012/0301083 A1 | 11/2012 | Carter et al. |
| 2013/0004136 A1 | 1/2013 | Brower et al. |
| 2013/0058616 A1 | 3/2013 | Cote et al. |
| 2013/0077927 A1 | 3/2013 | O'Connor |
| 2013/0214108 A1 | 8/2013 | Irudayaraj et al. |
| 2013/0266282 A1 | 10/2013 | Cote et al. |
| 2013/0308916 A1 | 11/2013 | Buff et al. |
| 2014/0003782 A1 | 1/2014 | Blackwell, Jr. et al. |
| 2014/0010510 A1 | 1/2014 | Blackard |
| 2014/0112628 A1* | 4/2014 | Keenum et al. ................. 385/89 |

FOREIGN PATENT DOCUMENTS

| | | |
|---|---|---|
| CA | 2186314 A1 | 4/1997 |
| CA | 2765835 A1 | 1/2011 |
| CH | 688705 A5 | 1/1998 |
| CN | 102460258 A | 5/2012 |
| DE | 8711970 U1 | 10/1987 |

(56) References Cited

FOREIGN PATENT DOCUMENTS

| | | |
|---|---|---|
| DE | 3726718 A1 | 2/1989 |
| DE | 3726719 A1 | 2/1989 |
| DE | 4030301 A1 | 3/1992 |
| DE | 4231181 C1 | 8/1993 |
| DE | 20115940 U1 | 1/2002 |
| DE | 10338848 A1 | 3/2005 |
| DE | 202005009932 U1 | 11/2005 |
| DE | 202007000556 U1 | 10/2007 |
| DE | 102007024476 A1 | 11/2008 |
| DE | 202010009385 U1 | 9/2010 |
| EP | 29512 A1 | 6/1981 |
| EP | 0105597 A2 | 4/1984 |
| EP | 0250900 A2 | 1/1988 |
| EP | 0408266 A2 | 1/1991 |
| EP | 0474091 A1 | 8/1991 |
| EP | 0468671 A1 | 1/1992 |
| EP | 0490698 A1 | 6/1992 |
| EP | 0529830 A1 | 3/1993 |
| EP | 0544004 A1 | 6/1993 |
| EP | 0547778 A1 | 6/1993 |
| EP | 0581527 A1 | 2/1994 |
| EP | 0620462 A1 | 10/1994 |
| EP | 0693699 A1 | 1/1996 |
| EP | 0720322 A2 | 7/1996 |
| EP | 0776557 B1 | 6/1997 |
| EP | 0940700 A2 | 9/1999 |
| EP | 0949522 A2 | 10/1999 |
| EP | 1041417 A2 | 10/2000 |
| EP | 1056177 A1 | 11/2000 |
| EP | 1065542 A1 | 1/2001 |
| EP | 1162485 A2 | 12/2001 |
| EP | 1203974 A2 | 5/2002 |
| EP | 1289319 A2 | 3/2003 |
| EP | 1310816 A2 | 5/2003 |
| EP | 1316829 A2 | 6/2003 |
| EP | 1367308 A1 | 12/2003 |
| EP | 1621907 A1 | 2/2006 |
| EP | 1777563 A1 | 4/2007 |
| EP | 2060942 A2 | 5/2009 |
| EP | 2159613 A2 | 3/2010 |
| FR | 1586331 A | 2/1970 |
| FR | 2123728 A5 | 9/1972 |
| FR | 2378378 A1 | 8/1978 |
| GB | 2241591 A | 9/1991 |
| GB | 2277812 A | 11/1994 |
| GB | 2367379 A | 4/2002 |
| GB | 2377839 A | 1/2003 |
| JP | 3060994 A | 3/1991 |
| JP | 3172806 A | 7/1991 |
| JP | 3281378 A | 12/1991 |
| JP | 5045541 A | 2/1993 |
| JP | 06018749 A | 1/1994 |
| JP | 7308011 A | 11/1995 |
| JP | 7318761 A | 12/1995 |
| JP | 8007308 A | 1/1996 |
| JP | 8248235 A | 9/1996 |
| JP | 8248237 A | 9/1996 |
| JP | 3487946 A | 10/1996 |
| JP | 8254620 A | 10/1996 |
| JP | 3279474 A | 10/1997 |
| JP | 9258033 A | 10/1997 |
| JP | 9258055 A | 10/1997 |
| JP | 2771870 B2 | 7/1998 |
| JP | 3448448 A | 8/1998 |
| JP | 10227919 A | 8/1998 |
| JP | 3478944 A | 12/1998 |
| JP | 10332945 A | 12/1998 |
| JP | 10339817 A | 12/1998 |
| JP | 11023858 A | 1/1999 |
| JP | 2000098138 A | 4/2000 |
| JP | 2000098139 A | 4/2000 |
| JP | 2000241631 A | 9/2000 |
| JP | 2001004849 A | 1/2001 |
| JP | 3160322 B2 | 4/2001 |
| JP | 2001133636 A | 5/2001 |
| JP | 3173962 B2 | 6/2001 |
| JP | 3176906 B2 | 6/2001 |
| JP | 2001154030 A | 6/2001 |
| JP | 2001159714 A | 6/2001 |
| JP | 2002022974 A | 1/2002 |
| JP | 2002077236 A | 3/2002 |
| JP | 2002116337 A | 4/2002 |
| JP | 2002169035 A | 6/2002 |
| JP | 3312893 B2 | 8/2002 |
| JP | 2002305389 A | 10/2002 |
| JP | 3344701 B2 | 11/2002 |
| JP | 2003029054 A | 1/2003 |
| JP | 3403573 B2 | 5/2003 |
| JP | 2003169026 A | 6/2003 |
| JP | 2003215353 A | 7/2003 |
| JP | 2003344701 A | 12/2003 |
| JP | 3516765 B2 | 4/2004 |
| JP | 2004144808 A | 5/2004 |
| JP | 2004514931 A | 5/2004 |
| JP | 3542939 B2 | 7/2004 |
| JP | 2004246147 A | 9/2004 |
| JP | 2004361652 A | 12/2004 |
| JP | 2004361893 A | 12/2004 |
| JP | 3107704 U | 2/2005 |
| JP | 2005055748 A | 3/2005 |
| JP | 2005062569 A | 3/2005 |
| JP | 2005084241 A | 3/2005 |
| JP | 2005148327 A | 6/2005 |
| JP | 2005257937 A | 9/2005 |
| JP | 3763645 B2 | 4/2006 |
| JP | 3778021 B2 | 5/2006 |
| JP | 2006126513 A | 5/2006 |
| JP | 2006126516 A | 5/2006 |
| JP | 3794540 B2 | 7/2006 |
| JP | 2006227041 A1 | 8/2006 |
| JP | 3833638 B2 | 10/2006 |
| JP | 2006292924 A | 10/2006 |
| JP | 3841344 B2 | 11/2006 |
| JP | 3847533 B2 | 11/2006 |
| JP | 200747336 A | 2/2007 |
| JP | 3896035 B2 | 3/2007 |
| JP | 2007067458 A1 | 3/2007 |
| JP | 3934052 B2 | 6/2007 |
| JP | 3964191 B2 | 8/2007 |
| JP | 3989853 B2 | 10/2007 |
| JP | 4026244 B2 | 12/2007 |
| JP | 4029494 B2 | 1/2008 |
| JP | 4065223 B2 | 3/2008 |
| JP | 4093475 B2 | 6/2008 |
| JP | 4105696 B2 | 6/2008 |
| JP | 4112437 B2 | 7/2008 |
| JP | 4118862 B2 | 7/2008 |
| JP | 2008176118 A1 | 7/2008 |
| JP | 2008180817 A1 | 8/2008 |
| JP | 4184329 B2 | 11/2008 |
| JP | 2008271017 A | 11/2008 |
| JP | 2008542822 T | 11/2008 |
| JP | 2009503582 T | 1/2009 |
| JP | 2009229506 A | 10/2009 |
| JP | 2012065019 A | 3/2012 |
| KR | 20110037404 A | 4/2011 |
| WO | 9105281 A1 | 4/1991 |
| WO | 9326070 A1 | 12/1993 |
| WO | 9520175 A1 | 7/1995 |
| WO | 9636896 A1 | 11/1996 |
| WO | 9638752 A1 | 12/1996 |
| WO | 9712268 A1 | 4/1997 |
| WO | 9722025 A1 | 6/1997 |
| WO | 9736197 A1 | 10/1997 |
| WO | 9744605 A1 | 11/1997 |
| WO | 9825416 A1 | 6/1998 |
| WO | 9927404 A1 | 6/1999 |
| WO | 0005611 A2 | 2/2000 |
| WO | 0127660 A2 | 4/2001 |
| WO | 0130007 A2 | 4/2001 |
| WO | 0180596 A1 | 10/2001 |
| WO | 0242818 A1 | 5/2002 |
| WO | 03009527 A2 | 1/2003 |
| WO | 03014943 A2 | 2/2003 |

(56) References Cited

FOREIGN PATENT DOCUMENTS

| WO | 2004052066 A1 | 6/2004 |
|----|---------------|--------|
| WO | 2005020400 A1 | 3/2005 |
| WO | 2006076062 A | 7/2006 |
| WO | 2006108024 A1 | 10/2006 |
| WO | 2007050515 A1 | 5/2007 |
| WO | 2007079074 A2 | 7/2007 |
| WO | 2007089682 A2 | 8/2007 |
| WO | 2007149215 A2 | 12/2007 |
| WO | 2008027201 A2 | 3/2008 |
| WO | 2008063054 A2 | 5/2008 |
| WO | 2008113054 A2 | 9/2008 |
| WO | 2008157248 A1 | 12/2008 |
| WO | 2009026688 A1 | 3/2009 |
| WO | 2009029485 A1 | 3/2009 |
| WO | 2009030360 A1 | 3/2009 |
| WO | 2009120280 A2 | 10/2009 |
| WO | 2010024847 A2 | 3/2010 |
| WO | 2010080745 A1 | 7/2010 |
| WO | 2011005461 A1 | 1/2011 |
| WO | 2011011510 A2 | 1/2011 |

OTHER PUBLICATIONS

Notice of Allowance for U.S. Appl. No. 12/576,769 mailed May 31, 2012, 9 pages.
Non-final Office Action for U.S. Appl. No. 12/576,806 mailed Dec. 13, 2011, 6 pages.
Notice of Allowance for U.S. Appl. No. 12/576,806 mailed Apr. 18, 2012, 5 pages.
Non-Final Rejection mailed Sep. 7, 2010, for U.S. Appl. No. 12/323,423, 18 pages.
Notice of Allowance for U.S. Appl. No. 12/323,423 mailed Jan. 24, 2012, 8 pages.
Examiner's Answer mailed Mar. 4, 2011, for U.S. Appl. No. 12/323,415, 11 pages.
Final Rejection mailed Jun. 25, 2010, for U.S. Appl. No. 12/323,415, 10 pages.
Non-Final Rejection mailed Aug. 5, 2011, for U.S. Appl. No. 12/323,415, 41 pages.
Non-final Office Action for U.S. Appl. No. 12/323,415 mailed Apr. 23, 2012, 11 pages.
Non-Final Rejection mailed Dec. 10, 2009, for U.S. Appl. No. 12/323,415, 7 pages.
Examiner's Answer to Appeal Brief for U.S. Appl. No. 11/320,062 mailed Dec. 8, 2011, 8 pages.
Final Office Action for U.S. Appl. No. 11/320,062 mailed Mar. 8, 2011, 8 pages.
Non-final Office Action for U.S. Appl. No. 11/320,062 mailed Jan. 15, 2010, 11 pages.
Non-final Office Action for U.S. Appl. No. 11/320,062 mailed Sep. 30, 2010, 7 pages.
Final Office Action for U.S. Appl. No. 11/439,086 mailed Feb. 4, 2010, 14 pages.
Non-final Office Action for U.S. Appl. No. 11/439,086 mailed May 3, 2010, 11 pages.
Non-final Office Action for U.S. Appl. No. 11/439,086 mailed Sep. 21, 2009, 10 pages.
Final Office Action for U.S. Appl. No. 12/079,481 mailed Mar. 18, 2010, 10 pages.
Non-final Office Action for U.S. Appl. No. 12/079,481 mailed Dec. 26, 2008, 9 pages.
Non-final Office Action for U.S. Appl. No. 12/079,481 mailed Sep. 16, 2009, 10 pages.
Notice of Allowance for U.S. Appl. No. 12/079,481 mailed Jun. 3, 2010, 6 pages.
Notice of Allowance for U.S. Appl. No. 12/079,481 mailed Oct. 4, 2010, 4 pages.
Final Office Action for U.S. Appl. No. 12/394,114 mailed Dec. 22, 2011, 8 pages.
Non-final Office Action for U.S. Appl. No. 12/394,114 mailed Mar. 16, 2012, 8 pages.
Non-final Office Action for U.S. Appl. No. 12/394,114 mailed Sep. 1, 2011, 7 pages.
Non-final Office Action for U.S. Appl. No. 12/323,373 mailed May 3, 2012, 7 pages.
Non-final Office Action for U.S. Appl. No. 11/809,474 mailed Apr. 8, 2008, 13 pages.
Non-final Office Action for U.S. Appl. No. 11/809,474 mailed Nov. 13, 2008, 10 pages.
Notice of Allowance for U.S. Appl. No. 11/809,474 mailed Jul. 6, 2009, 6 pages.
Final Office Action for U.S. Appl. No. 11/320,031 mailed Mar. 8, 2011, 8 pages.
Non-final Office Action for U.S. Appl. No. 11/320,031 mailed Jan. 5, 2010, 16 pages.
Non-final Office Action for U.S. Appl. No. 11/320,031 mailed Sep. 30, 2010, 7 pages.
Notice of Allowance for U.S. Appl. No. 11/320,031 mailed Nov. 15, 2011, 7 pages.
Non-final Office Action for U.S. Appl. No. 12/157,622 mailed Mar. 31, 2009, 9 pages.
Non-final Office Action for U.S. Appl. No. 12/157,622 mailed Oct. 15, 2009, 9 pages.
Notice of Allowance for U.S. Appl. No. 12/157,622 mailed Apr. 22, 2010, 4 pages.
Non-final Office Action for U.S. Appl. No. 12/323,395 mailed Dec. 8, 2011, 7 pages.
Non-final Office Action for U.S. Appl. No. 12/415,454 mailed Mar. 2, 2012, 5 pages.
Non-final Office Action for U.S. Appl. No. 12/415,454 mailed Sep. 6, 2011, 7 pages.
Notice of Allowance for U.S. Appl. No. 12/415,454 mailed Jan. 13, 2012, 5 pages.
Non-final Office Action for U.S. Appl. No. 12/576,769 mailed Feb. 2, 2012, 23 pages.
Notice of Allowance for U.S. Appl. No. 12/415,454 mailed Jun. 19, 2012, 5 pages.
Unknown, Author, "QuickNet SFQ Series MTP Fiber Optic Cassettes," Panduit Specification Sheet, Jan. 2009, 2 pages.
Unknown Author, "Cellular Specialties introduces the first simulated in-building location-based tracking solution," smart-grid.tmenet.com/news, Sep. 14, 2009, 2 pages.
Unknown Author, "CDMA Co-Pilot Transmitter," Cellular Specialties, Inc., Aug. 2009, 2 pages.
International Search Report for PCT/US2010/038986 mailed Aug. 18, 2010, 1 page.
International Search Report and Written Opinion for PCT/US2011/035683 mailed Sep. 8, 2011, 15 pages.
International Search Report and Written Opinion for PCT/US2010/039218 mailed Oct. 27, 2010, 13 pages.
International Search Report and Written Opinion for PCT/US2011/035684 mailed Jul. 1, 2011, 11 pages.
International Search Report and Written Opinion for PCT/US11/61754 mailed Mar. 26, 2012, 9 pages.
First Office Action for Chinese patent application 201080032453.2 issued Mar. 26, 2013, 6 pages.
Chinese Search Report for Chinese patent application 201080032453.2 mailed May 15, 2013, 2 pages.
First Office Action for Chinese patent application 201080031621.6 mailed Sep. 26, 2013, 9 pages.
Chinese Search Report for Chinese patent application 201080031621.6 mailed Sep. 13, 2013, 2 pages.
Ramdas, "Modern File Systems and Storage," Proceedings of the 2nd International SANE Conference, May 22-25, 2000, MECC, Maastricht, The Netherlands, Copyright Rodney R. Ramdas, 10 pages.
Author Unknown, "144 Fiber Patch Panel 1U," Technical Data, ADTEK Group Limited, 2009, 2 pages.
Non-final Office Action for U.S. Appl. No. 13/603,894 mailed Oct. 3, 2013, 9 pages.
Advisory Action for U.S. Appl. No. 12/394,114 mailed Jan. 2, 2014, 3 pages.
Notice of Allowance for U.S. Appl. No. 12/871,052 mailed Dec. 24, 2013, 9 pages.

(56) References Cited

OTHER PUBLICATIONS

Final Office Action for U.S. Appl. No. 12/953,039 mailed Dec. 27, 2013, 10 pages.
Advisory Action for U.S. Appl. No. 12/952,960 mailed Jan. 8, 2014, 3 pages.
Advisory Action for U.S. Appl. No. 12/952,912 mailed Nov. 26, 2013, 3 pages.
Examiner's Answer to the Appeal Brief for U.S. Appl. No. 12/953,118 mailed Dec. 3, 2013, 6 pages.
Non-final Office Action for U.S. Appl. No. 13/597,549 mailed Jan. 14, 2014, 9 pages.
Final Office Action for U.S. Appl. No. 12/732,487 mailed Dec. 6, 2013, 24 pages.
Final Office Action for U.S. Appl. No. 12/956,446 mailed Dec. 23, 2013, 12 pages.
Non-final Office Action for U.S. Appl. No. 12/953,536 mailed Dec. 17, 2013, 21 pages.
Non-final Office Action for U.S. Appl. No. 12/819,065 mailed Dec. 3, 2013, 8 pages.
International Search Report and Written Opinion for PCT/US2011/062353 mailed Apr. 10, 2012, 15 pages.
Non-Final Office Action for U.S. Appl. No. 12/953,039 mailed Jan. 11, 2013, 6 pages.
Non-Final Office Action for U.S. Appl. No. 12/952,912 mailed Dec. 28, 2012, 9 pages.
Non-Final Office Action for U.S. Appl. No. 12/953,118 mailed Jan. 7, 2013, 9 pages.
Non-Final Office Action for U.S. Appl. No. 12/707,889 mailed Jan. 2, 2013, 7 pages.
Non-Final Office Action for U.S. Appl. No. 12/953,536 mailed Jan. 2, 2013, 20 pages.
Final Office Action for U.S. Appl. No. 12/394,114 mailed Oct. 25, 2012, 8 pages.
Non-final Office Action for U.S. Appl. No. 12/732,487 mailed Sep. 19, 2012, 22 pages.
Non-final Office Action for U.S. Appl. No. 12/818,986 mailed Feb. 3, 2012, 12 pages.
Final Office Action for U.S. Appl. No. 12/818,986 mailed Oct. 18, 2012, 13 pages.
Non-final Office Action for U.S. Appl. No. 12/952,960 mailed Oct. 4, 2012, 11 pages.
Non-final Office Action for U.S. Appl. No. 12/953,134 mailed Sep. 25, 2012, 8 pages.
Non-final Office Action for U.S. Appl. No. 12/915,682 mailed Oct. 24, 2012, 8 pages.
Non-final Office Action for U.S. Appl. No. 12/946,139 mailed Jul. 26, 2012, 12 pages.
Final Office Action for U.S. Appl. No. 12/946,139 mailed Feb. 15, 2013, 17 pages.
Non-final Office Action for U.S. Appl. No. 12/751,884 mailed Feb. 15, 2013, 5 pages.
Non-final Office Action for U.S. Appl. No. 12/394,114 mailed Feb. 27, 2013, 8 pages.
Non-final Office Action for U.S. Appl. No. 12/819,065 mailed Mar. 4, 2013, 7 pages.
Final Office Action for U.S. Appl. No. 12/952,960 mailed Mar. 7, 2013, 13 pages.
Notice of Allowance for U.S. Appl. No. 12/732,487 mailed Mar. 19, 2013, 11 pages.
Non-final Office Action for U.S. Appl. No. 12/953,134 mailed Mar. 21, 2013, 9 pages.
Final Office Action for U.S. Appl. No. 12/641,617 mailed May 10, 2013, 21 pages.
European Search Report for patent application 10790017.7 mailed Nov. 8, 2012, 7 pages.
Examination Report for European patent application 09789090.9-2216 mailed Aug. 29, 2011, 4 pages.
Examination Report for European patent application 09789090.9-2216 mailed Mar. 30, 2012, 6 pages.
Written Opinion of the International Searching Authority for International patent application PCT/US2009004548, mailed Apr. 5, 2011, 6 pages.
European Search Report for European patent application 09789090.9-2217 mailed Jan. 24, 2013, 5 pages.
Notice of Allowance for U.S. Appl. No. 13/090,621 mailed Apr. 22, 2013, 8 pages.
Final Office Action for U.S. Appl. No. 12/953,039 mailed May 1, 2013, 8 pages.
Final Office Action for U.S. Appl. No. 12/953,118 mailed May 3, 2013, 11 pages.
Final Office Action for U.S. Appl. No. 12/915,682 mailed Apr. 18, 2013, 9 pages.
Advisory Action for U.S. Appl. No. 12/952,960 mailed May 15, 2013, 2 pages.
Non-final Office Action for U.S. Appl. No. 12/952,960 mailed Jun. 20, 2013, 13 pages.
Non-final Office Action for U.S. Appl. No. 12/953,536 mailed Jun. 6, 2013, 21 pages.
Non-final Office Action for U.S. Appl. No. 11/820,300 mailed Apr. 25, 2012, 10 pages.
Final Office Action for U.S. Appl. No. 12/871,052 mailed Jul. 1, 2013, 12 pages.
Non-final Office Action for U.S. Appl. No. 12/940,699 mailed Jun. 26, 2013, 9 pages.
Notice of Allowance for U.S. Appl. No. 13/090,621 mailed Jun. 25, 2013, 8 pages.
Non-final Office Action for U.S. Appl. No. 12/956,475 mailed Oct. 4, 2012, 7 pages.
Non-final Office Action for U.S. Appl. No. 13/302,067 mailed Jun. 7, 2013, 13 pages.
Final Office Action for U.S. Appl. No. 12/771,473 mailed Jul. 19, 2013, 7 pages.
Notice of Allowance for U.S. Appl. No. 12/751,884 mailed Jul. 17, 2013, 8 pages.
Non-final Office Action for U.S. Appl. No. 12/940,585 mailed Aug. 16, 2013, 14 pages.
Final Office Action for U.S. Appl. No. 12/953,134 mailed Aug. 23, 2013, 11 pages.
Ex parte Quayle Action for U.S. Appl. No. 12/953,164 mailed Aug. 16, 2013, 5 pages.
Non-final Office Action for U.S. Appl. No. 12/732,487 mailed Jul. 17, 2013, 22 pages.
Non-final Office Action and Interview Summary for U.S. Appl. No. 12/707,889 mailed Aug. 8, 2013, 15 pages.
Advisory Action for U.S. Appl. No. 12/953,039 mailed Jul. 12, 2013, 3 pages.
Advisory Action for U.S. Appl. No. 12/953,118 mailed Jul. 12, 2013, 3 pages.
Advisory Action for U.S. Appl. No. 12/641,617 mailed Jul. 29, 2013, 3 pages.
Final Office Action for U.S. Appl. No. 12/952,912 mailed Aug. 30, 2013, 15 pages.
Advisory Action for U.S. Appl. No. 12/771,473 mailed Oct. 2, 2013, 3 pages.
Notice of Allowance for U.S. Appl. No. 12/641,617 mailed Sep. 4, 2013, 9 pages.
Notice of Allowance for U.S. Appl. No. 12/871,052 mailed Sep. 18, 2013, 9 pages.
Non-final Office Action for U.S. Appl. No. 12/953,039 mailed Sep. 12, 2013, 8 pages.
Non-final Office Action for U.S. Appl. No. 12/946,139 mailed Oct. 2, 2013, 18 pages.
Final Office Action for U.S. Appl. No. 12/394,114 mailed Oct. 4, 2013, 10 pages.
Non-final Office Action for U.S. Appl. No. 12/818,986 mailed Oct. 4, 2013, 19 pages.
Advisory Action for U.S. Appl. No. 12/953,134 mailed Nov. 4, 2013, 3 pages.
Final Office Action for U.S. Appl. No. 12/952,960 mailed Oct. 29, 2013, 8 pages.
Notice of Allowance for U.S. Appl. No. 13/292,130 mailed Oct. 18, 2013, 9 pages.

(56) References Cited

OTHER PUBLICATIONS

Non-final Office Action for U.S. Appl. No. 13/901,074 mailed Oct. 9, 2013, 6 pages.
Non-final Office Action for U.S. Appl. No. 12/956,446 mailed Sep. 6, 2013, 10 pages.
International Search Report for PCT/US2009/066779 mailed Aug. 27, 2010, 3 pages.
"MPO Fiber Optic Rack Panels now available from L-com Connectivity Products," article dated Jun. 4, 2007, 16 pages, http://www.l-com.com/content/Article.aspx?Type=P&ID=438.
"19" Rack Panel with 16 MPO Fiber Optic Couplers—1U high," product page, accessed Oct. 23, 2012, 2 pages, http://www.l-com.com/item.aspx?id=9767#.UlbgG8XXay5.
"Drawing for L-com 1U Panel with 16 MTP couplers," May 15, 2007, 1 page, http://www.l-com.com/multimedia/eng_drawings/PR17516MTP.pdf.
"RapidNet Fibre MTP VHD Cassette," Brochure, Date Unknown, 1 page, http://www.hellermanntyton.se/documents/5000/576_fiber_1U.pdf.
"MPO for Gigabit Ethernet/FAS-NET MTP Solution," Brochure, Date Unknown, 11 pages, http://www.infinique.com/upload/13182286190.pdf.
"Hubbell OptiChannel High Density 144 Port 1U Fiber Enclosure," Brochure, Date Unknown, 2 pages, http://www.hubbell-premise.com/literature/PLDF010.pdf.
Non-final Office Action for U.S. Appl. No. 12/771,473 mailed Oct. 4, 2012, 6 pages.
Non-final Office Action for U.S. Appl. No. 12/819,081 mailed Aug. 21, 2012, 12 pages.
Notice of Allowance for U.S. Appl. No. 12/417,325 mailed Aug. 22, 2012, 7 pages.
Notice of Panel Decision for Pre-Appeal Brief for U.S. Appl. No. 12/417,325 mailed Aug. 8, 2012, 2 pages.
Advisory Action for U.S. Appl. No. 12/417,325 mailed Jun. 29, 2012, 3 pages.
Advisory Action for U.S. Appl. No. 12/417,325 mailed Jun. 12, 2012, 3 pages.
Final Office Action for U.S. Appl. No. 12/417,325 mailed Apr. 16, 2012, 6 pages.
Final Office Action for U.S. Appl. No. 12/417,325 mailed Feb. 7, 2012, 7 pages.
Non-final Office Action for U.S. Appl. No. 12/417,325 mailed Jun. 15, 2011, 6 pages.
Notice of Allowance for U.S. Appl. No. 12/487,929 mailed Sep. 12, 2012, 4 pages.
Notice of Allowance for U.S. Appl. No. 12/487,929 mailed Jun. 13, 2012, 8 pages.
Advisory Action for U.S. Appl. No. 12/487,929 mailed Apr. 17, 2012, 3 pages.
Final Office Action for U.S. Appl. No. 12/487,929 mailed Feb. 14, 2012, 6 pages.
Final Office Action for U.S. Appl. No. 12/487,929 mailed Dec. 5, 2011, 7 pages.
Non-final Office Action for U.S. Appl. No. 12/487,929 mailed May 23, 2011, 7 pages.
Notice of Allowance for U.S. Appl. No. 12/415,253 mailed Mar. 11, 2011, 7 pages.
Non-final Office Action for U.S. Appl. No. 12/415,253 mailed Jul. 12, 2010, 11 pages.
Final Office Action for U.S. Appl. No. 12/415,253 mailed Apr. 16, 2010, 9 pages.
Non-final Office Action for U.S. Appl. No. 12/415,253 mailed Sep. 30, 2009, 8 pages.
Non-final Office Action for U.S. Appl. No. 12/641,617 mailed Oct. 5, 2012, 21 pages.
Final Office Action for U.S. Appl. No. 12/630,938 mailed Jun. 1, 2012, 18 pages.
Non-final Office Action for U.S. Appl. No. 12/630,938 mailed Dec. 19, 2011, 15 pages.
Non-final Office Action for U.S. Appl. No. 12/751,884 mailed Jul. 2, 2012, 9 pages.
Non-final Office Action for U.S. Appl. No. 12/871,052 mailed Aug. 13, 2012, 8 pages.
International Search Report for PCT/US2013/041268 mailed Aug. 20, 2013, 5 pages.
Notice of Allowance for U.S. Appl. No. 13/292,130 mailed Feb. 14, 2014, 7 pages.
Final Office Action for U.S. Appl. No. 12/707,889 mailed Feb. 11, 2014, 17 pages.
Non-final Office Action for U.S. Appl. No. 12/940,699 mailed Feb. 3, 2014, 10 pages.
Notice of Allowance for U.S. Appl. No. 12/952,960 mailed Feb. 13, 2014, 7 pages.
Notice of Allowance and Applicant-Initiated Interview Summary for U.S. Appl. No. 12/771,473 mailed Feb. 27, 2014, 8 pages.
Non-final Office Action for U.S. Appl. No. 13/081,856 mailed Nov. 26, 2013, 11 pages.
Non-final Office Action for U.S. Appl. No. 13/688,675 mailed Jan. 31, 2014, 13 pages.
Non-final Office Action for U.S. Appl. No. 13/663,975 mailed Jan. 31, 2014, 18 pages.
Non-final Office Action for U.S. Appl. No. 12/394,114 mailed Mar. 21, 2014, 9 pages.
Final Office Action for U.S. Appl. No. 12/940,585 mailed Mar. 18, 2014, 15 pages.
Non-final Office Action for U.S. Appl. No. 12/953,101 mailed Apr. 3, 2014, 9 pages.
Advisory Action for U.S. Appl. No. 12/956,446 mailed Mar. 20, 2014, 3 pages.
Final Office Action for U.S. Appl. No. 13/603,894 mailed Mar. 20, 2014, 15 pages.
Advisory Action for U.S. Appl. No. 12/953,039 mailed Mar. 6, 2014, 3 pages.
International Search Report for PCT/US2012/023622 mailed Mar. 9, 2012, 4 pages.
International Search Report for PCT/US2012/023635 mailed Sep. 14, 2012, 3 pages.
International Search Report for PCT/US2012/023626 mailed May 22, 2012, 4 pages.
Notice of Allowance for U.S. Appl. No. 13/951,916 mailed Dec. 16, 2013, 12 pages.
International Preliminary Report on Patentability for PCT/US2012/052958 mailed Mar. 13, 2014, 14 pages.
Non-final Office Action for U.S. Appl. No. 12/947,883 mailed Sep. 6, 2013, 9 pages.
Final Office Action for U.S. Appl. No. 12/947,883 mailed Mar. 31, 2014, 13 pages.
Annex to Form PCT/ISA/2006, Communication Relating to the Results of the Partial International Search, for PCT/US2009/004549 mailed Feb. 10, 2010, 2 pages.
Annex to Form PCT/ISA/206, Communication Relating to the Results of the Partial International Search, for PCT/US2009/004548 mailed Jan. 19, 2010, 2 pages.
Corning Cable Systems, "Corning Cable Systems Products for BellSouth High Density Shelves," Jun. 2000, 2 pages.
Corning Cable Systems, "Corning Cable Systems Quick Reference Guide for Verizon FTTP FDH Products," Jun. 2005, 4 pages.
Conner, M. "Passive Optical Design for RFOG and Beyond," Braodband Properties, Apr. 2009, pp. 78-81.
Corning Evolant, "Eclipse Hardware Family," Nov. 2009, 1 page.
Corning Evolant, "Enhanced Management Frame," Dec. 2009, 1 page.
Corning Evolant, "Enhanced Management Frame (EMF)," Specification Sheet, Nov. 2009, 24 pages.
Corning Cable Systems, "Evolant Solutions for Evolving Networks: Fiber Optic Hardware," Oct. 2002, 2 pages.
Corning Cable Systems, "Fiber Optic Hardware with Factory-Installed Pigtails: Features and Benefits," Nov. 2010, 12 pages.
Corning Cable Systems, "FiberManager System 1- and 3-Position Compact Shelves," Jan. 2003, 4 pages.
Corning Cable Systems, "FiberManager System Frame and Components," Jan. 2003, 12 pages.

(56) References Cited

OTHER PUBLICATIONS

Corning Cable Systems, "High Density Frame," Jul. 2001, 2 pages.
Corning Cable Systems, "High Density Frame (HDF) Connector-Splice Shelves and Housings," May 2003, 4 pages.
International Search Report for PCT/US10/35529 mailed Jul. 23, 2010, 2 pages.
International Search Report for PCT/US10/35563 mailed Jul. 23, 2012, 1 page.
International Search Report for PCT/US2008/002514 mailed Aug. 8, 2008, 2 pages.
International Search Report for PCT/US2008/010317 mailed Mar. 4, 2008, 2 pages.
International Search Report for PCT/US2009/001692 mailed Nov. 24, 2009, 5 pages.
International Search Report for PCT/US2010/024888 mailed Jun. 23, 2010, 5 pages.
International Search Report for PCT/US2010/027402 mailed Jun. 16, 2010, 2 pages.
Corning Cable Systems, "MTX Frames and Accessories," Feb. 2006, 4 pages.
Panduit, "Lock-in LC Duplex Clip," Accessed Mar. 22, 2012, 1 page.
International Search Report for PCT/US06/49351 mailed Apr. 25, 2008, 1 page.
International Search Report for PCT/US09/57069 mailed Mar. 24, 2010, 2 pages.
International Search Report for PCT/US2009/057244 mailed Nov. 9, 2009 3 pages.
International Search Report for PCTUS2009004548 mailed Mar. 19, 2010, 5 pages.
International Search Report for PCTUS2009004549 mailed Apr. 20, 2010, 6 pages.
Siecor, "Single Shelf HDF with Slack Storage and Heat Shield (HH1-CSH-1238-1V-BS)," Jan. 1998, 12 pages.
Corning Cable Systems, "Mass Termination Xchange (MTX) Frame System Equipment Office Planning and Application Guide," SRP003-664, Issue 1, Mar. 2005, 57 pages.
Corning Cable Systems, "Mass Termination Xchange (MTX) Equipment Patch Cord Interbay Vertical Channel," SRP003-684, Issue 1, Mar. 2005, 8 pages.
Corning Cable Systems, "High Density Frame (HDF) Installation," SRP003-355, Issue 4, Sep. 2002, 18 pages.
Written Opinion for PCT/US2010/023901 mailed Aug. 25, 2011, 8 pages.
Advisory Action for U.S. Appl. No. 12/221,117 mailed Aug. 24, 2011, 3 pages.
Examiner's Answer to Appeal Brief for U.S. Appl. No. 12/221,117 mailed Mar. 29, 2012, 16 pages.
Final Office Action for U.S. Appl. No. 12/221,117 mailed Feb. 19, 2010, 7 pages.
Final Office Action for U.S. Appl. No. 12/221,117 mailed Jun. 10, 2011, 8 pages.
Non-final Office Action for U.S. Appl. No. 12/221,117 mailed Jul. 14, 2010, 7 pages.
Non-final Office Action for U.S. Appl. No. 12/221,117 mailed Jun. 9, 2009, 5 pages.
Non-final Office Action for U.S. Appl. No. 12/221,117 mailed Dec. 21, 2010, 7 pages.
Advisory Action for U.S. Appl. No. 12/394,483 mailed Feb. 16, 2012, 3 pages.
Final Office Action for U.S. Appl. No. 12/394,483 mailed Dec. 6, 2011, 14 pages.
Non-final Office Action for U.S. Appl. No. 12/394,483 mailed Jun. 17, 2011, 11 pages.
Advisory Action for U.S. Appl. No. 12/950,234 mailed Dec. 21, 2011, 3 pages.
Non-final Office Action for U.S. Appl. No. 12/950,234 mailed Jun. 17, 2011, 7 pages.
Non-final Office Action for U.S. Appl. No. 12/950,234 mailed Mar. 12, 2012, 10 pages.
Final Office Action for U.S. Appl. No. 12/950,234 mailed Oct. 14, 2011, 10 pages.
Advisory Action mailed May 12, 2011, for U.S. Appl. No. 12/323,423, 3 pages.
Final Rejection mailed Mar. 3, 2011, for U.S. Appl. No. 12/323,423, 17 pages.
Non-Final Rejection mailed Aug. 5, 2011, for U.S. Appl. No. 12/323,423, 13 pages.
International Search Report for PCT/US2011/030446 mailed Jul. 14, 2011, 2 pages.
International Search Report for PCT/US2011/030448 mailed Jul. 20, 2011, 2 pages.
International Search Report for PCT/US2011/030466 mailed Aug. 5, 2011, 2 pages.
International Search Report for PCT/US2012/052958 mailed Mar. 1, 2013, 7 pages.
International Search Report for PCT/US2013/041266 mailed Aug. 20, 2013, 4 pages.
Non-final Office Action for U.S. Appl. No. 13/621,958 mailed Feb. 13, 2014, 10 pages.
Non-final Office Action for U.S. Appl. No. 13/649,417 mailed Feb. 13, 2014, 10 pages.
Non-final Office Action for U.S. Appl. No. 13/663,949 mailed Feb. 3, 2014, 19 pages.
Non-final Office Action for U.S. Appl. No. 12/953,003 mailed Apr. 14, 2014, 13 pages.
Non-final Office Action for U.S. Appl. No. 12/953,039 mailed Apr. 15, 2014, 8 pages.
Final Office Action for U.S. Appl. No. 12/946,139 mailed Apr. 22, 2014, 18 pages.
Final Office Action for U.S. Appl. No. 13/597,549 mailed Apr. 24, 2014, 10 pages.
Final Office Action for U.S. Appl. No. 13/901,074 mailed May 9, 2014, 7 pages.
Non-final Office Action for U.S. Appl. No. 12/946,217 mailed Jul. 26, 2012, 25 pages.
Final Office Action for U.S. Appl. No. 12/946,217 mailed Mar. 18, 2013, 48 pages.
Non-final Office Action for U.S. Appl. No. 12/946,217 mailed Oct. 3, 2013, 47 pages.
Final Office Action for U.S. Appl. No. 12/946,217 mailed Apr. 25, 2014, 40 pages.
Non-final Office Action for U.S. Appl. No. 13/833,876 mailed Apr. 24, 2014, 7 pages.
Notice of Allowance for U.S. Appl. No. 12/953,536 mailed May 20, 2014, 9 pages.
Advisory Action for U.S. Appl. No. 12/707,889 mailed Jun. 11, 2014, 4 pages.
Advisory Action for U.S. Appl. No. 12/940,585 mailed Jun. 17, 2014, 3 pages.
Advisory Action for U.S. Appl. No. 12/947,883 mailed Jun. 19, 2014, 3 pages.
Non-final Office Action for U.S. Appl. No. 12/732,487 mailed Jun. 20, 2014, 24 pages.
Non-final Office Action for U.S. Appl. No. 13/621,958 mailed Jun. 20, 2014, 13 pages.
Final Office Action for U.S. Appl. No. 13/649,417 mailed Jun. 25, 2014, 9 pages.
Non-final Office Action for U.S. Appl. No. 12/952,960 mailed Jun. 26, 2014, 13 pages.
Non-final Office Action for U.S. Appl. No. 13/746,938 mailed Jul. 11, 2014, 9 pages.
Notice of Allowance for U.S. Appl. No. 13/533,093 mailed Jul. 8, 2014, 9 pages.
Notice of Allowance for U.S. Appl. No. 13/597,549 mailed Jul. 8, 2014, 8 pages.
Notice of Allowance for U.S. Appl. No. 13/455,646 mailed Jun. 2, 2014, 9 pages.
Non-final Office Action for U.S. Appl. No. 12/819,065 mailed Jul. 18, 2014, 10 pages.
Final Office Action for U.S. Appl. No. 12/818,986 mailed Jul. 18, 2014, 27 pages.

(56) References Cited

OTHER PUBLICATIONS

Final Office Action for U.S. Appl. No. 13/081,856 mailed Jul. 2, 2014, 8 pages.
Notice of Allowance for U.S. Appl. No. 12/221,117 mailed Jul. 16, 2014, 7 pages.
Decision on Appeal for U.S. Appl. No. 12/221,117 mailed Jul. 1, 2014, 7 pages.
Final Office Action for U.S. Appl. No. 12/953,039 mailed Jul. 25, 2014, 10 pages.
Advisory Action for U.S. Appl. No. 12/953,039 mailed Oct. 3, 2014, 3 pages.
Notice of Allowance for U.S. Appl. No. 12/953,536 mailed Aug. 28, 2014, 9 pages.
Final Office Action for U.S. Appl. No. 13/901,074 mailed Sep. 5, 2014, 7 pages.
Final Office Action for U.S. Appl. No. 13/663,975 mailed Aug. 14, 2014, 42 pages.
Corrected Notice of Allowance for U.S. Appl. No. 13/533,093 mailed Sep. 2, 2014, 7 pages.
Notice of Allowance for U.S. Appl. No. 13/649,417 mailed Sep. 8, 2014, 7 pages.
Examiner's Answer to the Appeal for U.S. Appl. No. 12/952,912 mailed Sep. 11, 2014, 15 pages.
Advisory Action and Examiner-Initiated Interview Summary for U.S. Appl. No. 13/081,856 mailed Sep. 16, 2014, 4 pages.
Notice of Allowance for U.S. Appl. No. 13/455,646 mailed Sep. 26, 2014, 9 pages.
Non-Final Office Action for U.S. Appl. No. 13/663,949 mailed Sep. 25, 2014, 21 pages.
Non-Final Office Action for U.S. Appl. No. 13/688,675 mailed Sep. 30, 2014, 9 pages.
Notice of Allowance for U.S. Appl. No. 13/597,549 mailed Oct. 3, 2014, 8 pages.
Decision on Appeal for U.S. Appl. No. 11/320,062 mailed Aug. 14, 2014, 8 pages.
Final Office Action for U.S. Appl. No. 12/953,101 mailed Oct. 20, 2014, 14 pages.
Notice of Allowance for U.S. Appl. No. 13/533,093 mailed Oct. 17, 2014, 9 pages.
Notice of Allowance for U.S. Appl. No. 12/732,487 mailed Oct. 7, 2014, 8 pages.
Non-Final Office Action for U.S. Appl. No. 13/567,288 mailed Oct. 8, 2014, 7 pages.
Advisory Action for U.S. Appl. No. 12/818,986 mailed Oct. 15, 2014, 5 pages.
Examiner's Answer to the Appeal Brief for U.S. Appl. No. 12/953,134 mailed Aug. 1, 2014, 7 pages.
Final Office Action for U.S. Appl. No. 12/394,114 mailed Oct. 31, 2014, 10 pages.
Non-final Office Action for U.S. Appl. No. 12/940,699 mailed Oct. 28, 2014, 9 pages.
Non-final Office Action for U.S. Appl. No. 12/953,039 mailed Nov. 12, 2014, 8 pages.
Notice of Allowance for U.S. Appl. No. 12/952,960 mailed Nov. 10, 2014, 7 pages.
Notice of Allowance for U.S. Appl. No. 13/081,856 mailed Oct. 29, 2014, 10 pages.
Notice of Allowance for U.S. Appl. No. 13/833,876 mailed Nov. 7, 2014, 7 pages.
Advisory Action for U.S. Appl. No. 13/901,074 mailed Nov. 24, 2014, 3 pages.
Non-final Office Action for U.S. Appl. No. 12/956,446 mailed Dec. 5, 2014, 12 pages.

\* cited by examiner

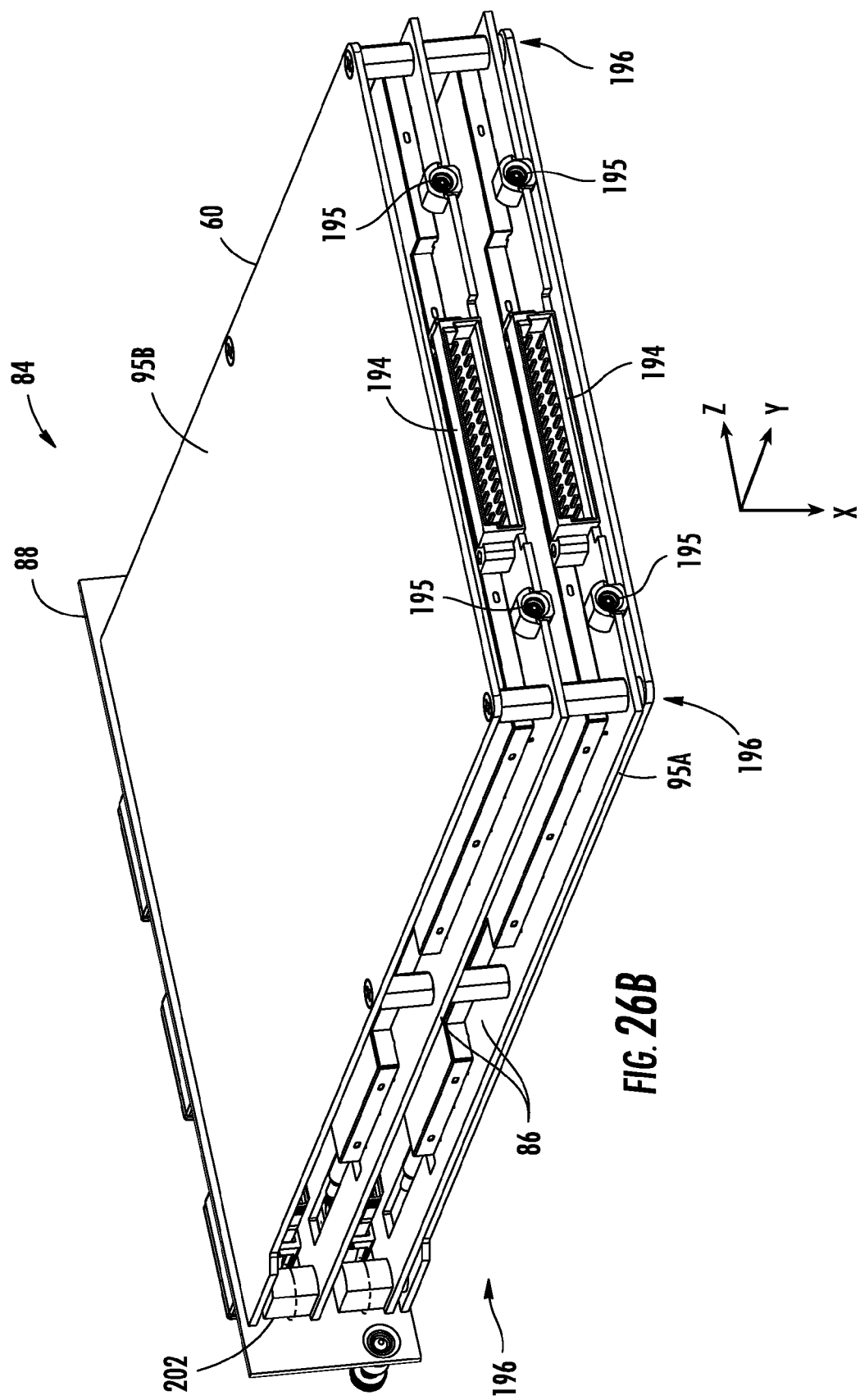

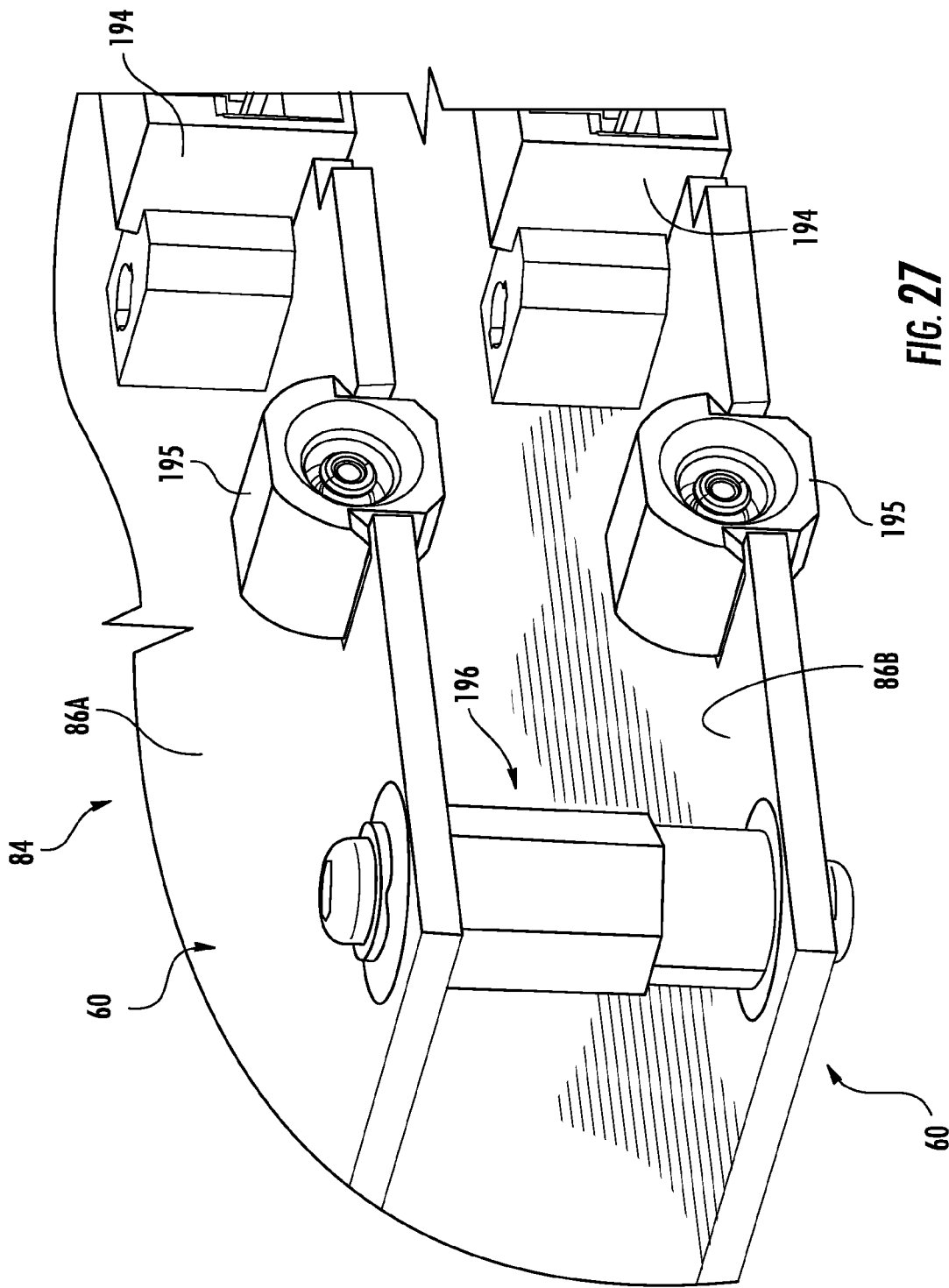

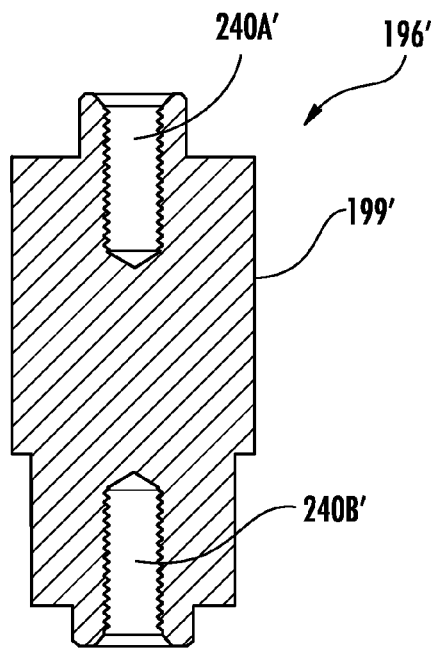
FIG. 31
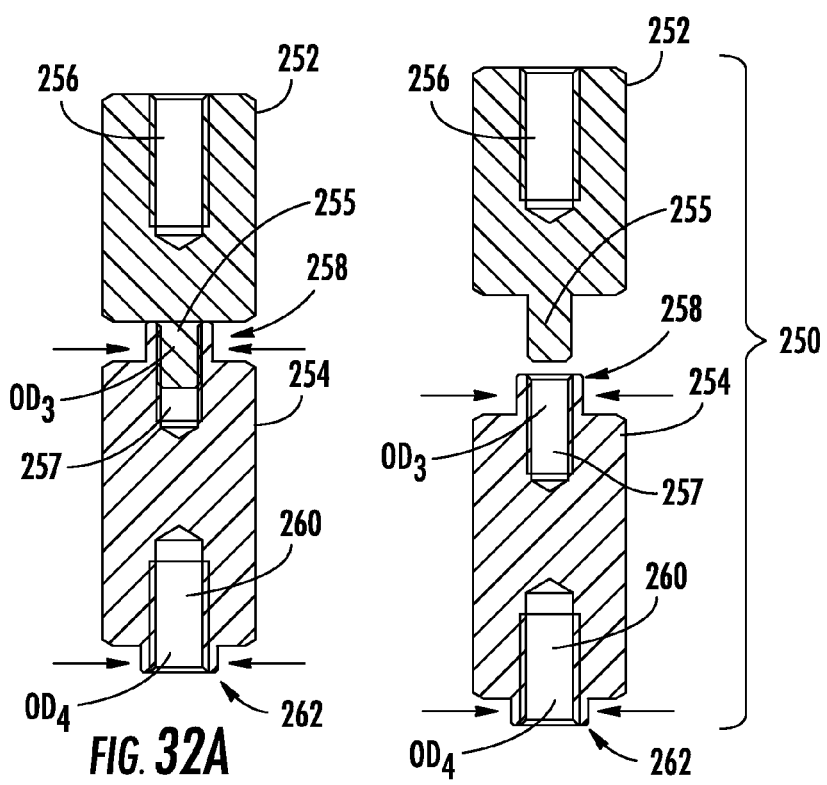
FIG. 32A
FIG. 32B

OPTICAL INTERFACE CARDS, ASSEMBLIES, AND RELATED METHODS, SUITED FOR INSTALLATION AND USE IN ANTENNA SYSTEM EQUIPMENT

RELATED APPLICATIONS

This application is related to U.S. Provisional Patent Application Ser. No. 61/301,495 filed Feb. 4, 2010 entitled "Modular Distributed Antenna System Equipment Housings, Assemblies, And Related Alignment Feature," which is incorporated herein by reference in its entirety.

This application is also related to U.S. Provisional Patent Application Ser. No. 61/301,488 filed Feb. 4, 2010 entitled "Modular Distributed Antenna System Equipment Housings, Assemblies, And Related Alignment Feature," which is incorporated herein by reference in its entirety.

This application is also related to U.S. Provisional Patent Application Ser. No. 61/316,584 filed Mar. 23, 2010 entitled "Modular Distributed Antenna System Equipment Housings, Assemblies, And Related Alignment Feature," which is incorporated herein by reference in its entirety.

This application is also related to U.S. patent application Ser. No. 12/751,884 filed Aug. 4, 2011 entitled "Communications Equipment Housings, Assemblies, and Related Alignment Features and Methods," which is incorporated herein by reference in its entirety.

BACKGROUND

1. Field of the Disclosure

The technology of the disclosure relates generally to enclosures for housing distributed antenna system equipment provided in a distributed antenna system. The distributed antenna system equipment can include optical fiber-based distributed antenna equipment for distributing radio frequency (RF) signals over optical fiber to remote antenna units.

2. Technical Background

Wireless communication is rapidly growing, with ever-increasing demands for high-speed mobile data communication. As an example, so-called "wireless fidelity" or "WiFi" systems and wireless local area networks (WLANs) are being deployed in many different types of areas (e.g., coffee shops, airports, libraries, etc.). Wireless communication systems communicate with wireless devices called "clients," which must reside within the wireless range or "cell coverage area" in order to communicate with an access point device.

One approach to deploying a wireless communication system involves the use of "picocells." Picocells are radio frequency (RF) coverage areas. Picocells can have a radius in the range from a few meters up to twenty meters as an example. Combining a number of access point devices creates an array of picocells that cover an area called a "picocellular coverage area." Because the picocell covers a small area, there are typically only a few users (clients) per picocell. This allows for minimizing the amount of RF bandwidth shared among the wireless system users. In this regard, head-end communication equipment can be provided to receive incoming RF signals from a wired or wireless network. The head-end communication equipment distributes the RF signals on a communication downlink to remote antenna units distributed throughout a building or facility. Client devices within range of the picocells can receive the RF signals and can communicate RF signals back to an antenna in the remote antenna unit, which are communicated back on a communication uplink to the head-end communication equipment and onto the network. The head-end communication equipment may be configured to convert RF signals into optical fiber signals to be communicated over optical fiber to the remote antenna units.

It may be desirable to provide a housing or enclosure for communication equipment for a distributed antenna system that is easily assembled. Thus, the housing or enclosure can be easily assembled in the field. Further, it may be desirable to provide communication equipment for a distributed antenna system that is compatible with expansion of picocells. Thus, it may be desirable to provide communication equipment for a distributed antenna system that can be easily upgraded or enhanced to support an increased number or type of remote antenna units, as an example. It may be further desired to allow technicians or other users to provide this increased support in the field, thus making it desirable to allow equipment changes and upgrades to easily be made in the communication equipment with ease and proper function.

SUMMARY OF THE DETAILED DESCRIPTION

Optical interface cards, assemblies, and related methods, which may be suited for installation and use in antenna system equipment, are disclosed. In one embodiment, optical interface cards are disclosed. Optical interface cards can provide an interface between optical and electrical signals in a communication system, including a distributed antenna communication system, as an example. In certain embodiments, the optical interface card comprises a printed circuit board (PCB) having a first end and a second end opposite the first end. At least one opening is disposed in the PCB between the first end and the second end of the PCB and having at least one first opening end and at least one second opening end opposite the at least one first opening end. At least one optical sub-assembly (OSA) is mounted to the at least one first opening end and extends into the at least one opening. In this manner, the OSA can be mounted on an end of a PCB to limit the length of exposed, unshielded wire extensions and printed traces on the PCB. This can provide for signal integrity of the signals after conversion to electrical signals.

In another embodiment, an optical interface assembly is provided. The optical interface assembly includes a first optical interface card (OIC) that comprises at least one first opening between a first end and a second end of the first OIC having at least one first opening end, and at least one first optical sub-assembly (OSA) mounted to the at least one first opening end and extending into the at least one first opening. A second OIC is provided that comprises at least one second opening between a first end and a second end of the second OIC having at least one second opening end, and at least one second OSA mounted to the at least one second opening end and extending into the at least one second opening. The optical interface assembly also includes at least one standoff disposed between the first OIC and second OIC.

In another embodiment, a method of assembling an optical interface card is provided. The method comprises providing a printed circuit board (PCB) having a first end and a second end opposite the first end. The method also comprises mounting at least one optical sub-assembly (OSA) to at least one first opening end of at least one opening disposed in the PCB between the first end and the second end of the PCB.

In another embodiment, a communications equipment enclosure is provided. The communications equipment enclosure comprises at least one compartment configured to house a plurality of communications components between a lower plenum and an upper plenum. The communications equipment enclosure also comprises at least one fan configured to draw in air from a first side of the communications equipment enclosure into the lower plenum and across the plurality of communications components into the upper plenum. The communications equipment enclosure also comprises an air outlet disposed on a second side of the communications equipment enclosure and coupled to the upper plenum to direct air drawn by the at least one fan into the upper plenum through the air outlet.

In another embodiment, a method of providing air cooling of communications components installed in a communications equipment enclosure is provided. The method includes drawing in air from a first side of the communications equipment enclosure into a lower plenum using at least one fan installed in the communications equipment enclosure. The method also includes drawing the air from the lower plenum across a plurality of communications components installed in the communications equipment enclosure between the lower plenum and an upper plenum. The method also includes drawing the air outside of the communications equipment enclosure through an air outlet disposed on a second side of the communications equipment enclosure and coupled to the upper plenum.

In another embodiment, a modular distributed antenna system assembly is provided. The assembly includes at least one first plate including at least one first locating alignment slot. The assembly also includes at least one second plate including at least one locating tab. The at least one locating tab engages with the at least one first locating alignment slot to align the at least one first plate in at least two dimensions to the at least one second plate to form an enclosure configured to support at least one distributed antenna system component.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE FIGURES

FIG. 26B is a rear perspective view the OIM of FIGS. 23 and 24 with shield plates installed;

FIG. 27 is a close-up rear view of the OIM of FIGS. 23 and 24 showing standoffs disposed between two printed circuit boards (PCBs) of the OICs, wherein one of the PCBs is a floating PCB;

FIG. 31 is a side cross-sectional view of an alternative standoff that can be employed to secure the OIC PCBs and provide one of the OIC PCBs as a floating PCB;

FIGS. 32A and 32B are side cross-sectional views of an alternative standoff that can be employed to secure the OIC PCBs and shield plates and provide one of the OIC PCBs as a floating PCB;

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Figure 1:
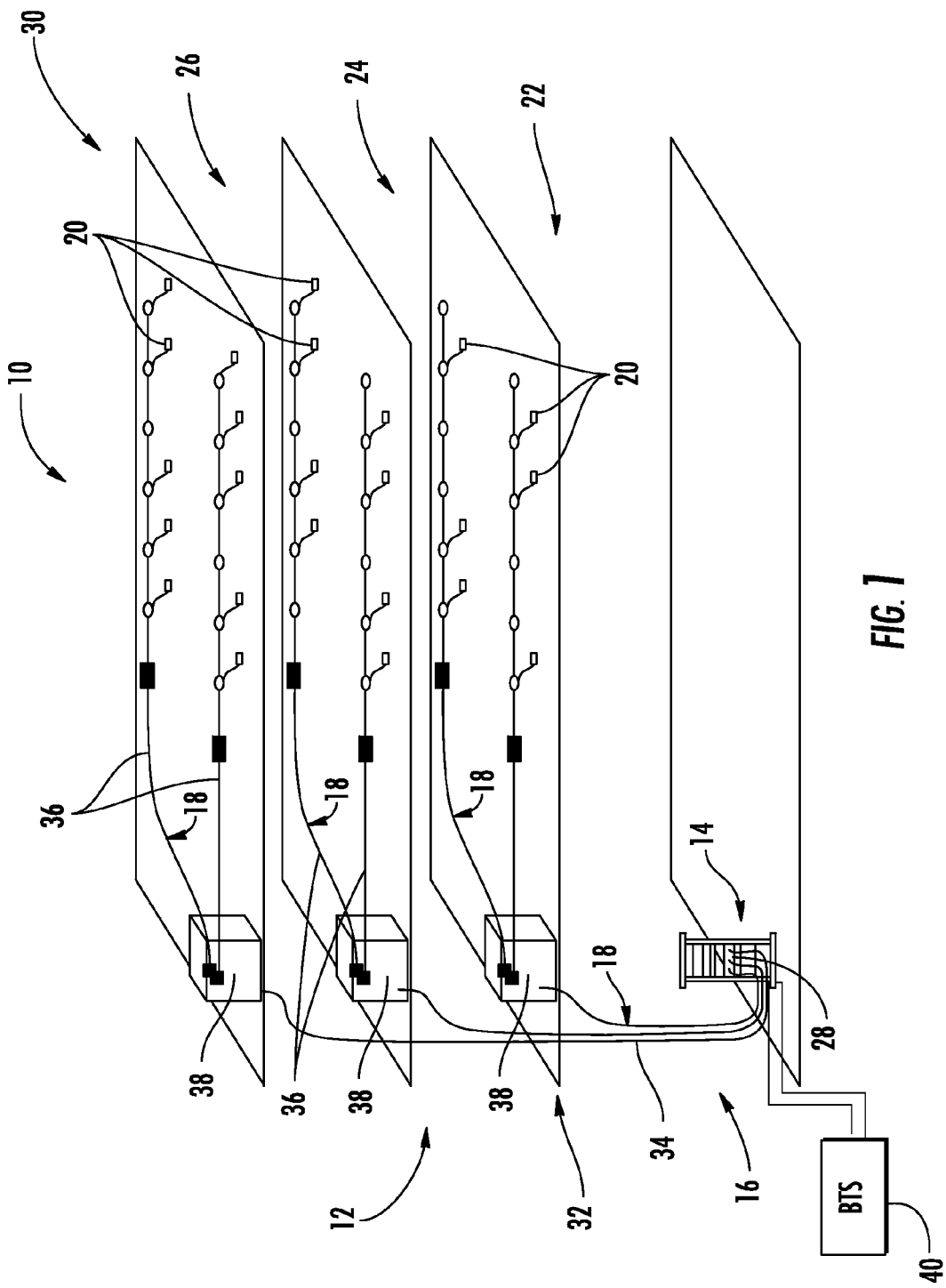
FIG. 1 is a partially schematic cut-away diagram of an exemplary building and building infrastructure in which a distributed antenna system is employed.

Optical interface cards, assemblies, and related methods, which may be suited for installation and use in antenna system equipment, are disclosed. In one embodiment, optical interface cards are disclosed. Before discussing the exemplary distributed antenna system equipment, assemblies and enclosures and their alignment features, which start at FIG. 3, an exemplary distributed antenna system is first described with regard to FIGS. 1 and 2. In this regard, FIG. 1 is a schematic diagram of a partially schematic cut-away diagram of a building 10 that generally represents any type of building in which a distributed antenna system 12 might be deployed. The distributed antenna system 12 incorporates a head-end communications unit or head-end unit (HEU) 14 to provide various types of communication services to coverage areas within an infrastructure 16 of the building 10. The HEU 14 is simply an enclosure that includes at least one communication component for the distributed antenna system 12. For example, as discussed in more detail below, the distributed antenna system 12 in this embodiment is an optical fiber-based wireless communication system that is configured to receive wireless radio frequency (RF) signals and provide the RF signals as Radio-over-Fiber (RoF) signals to be communicated over optical fiber 18 to remote antenna units (RAUs) 20 distributed throughout the building 10. The distributed antenna system 12 in this embodiment can be, for example, an indoor distributed antenna system (IDAS) to provide wireless service inside the building infrastructure 10. These wireless services can include cellular service, wireless services such as radio frequency identification (RFID) tracking, wireless fidelity (WiFi), local area network (LAN), and combinations thereof, as examples.

The terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. Likewise, other types of suitable optical fibers include bend-insensitive optical fibers, or any other expedient of a medium for transmitting light signals. An example of a bend-insensitive optical fiber is ClearCurve® Multimode fiber commercially available from Corning Incorporated.

With continuing reference to FIG. 1, the infrastructure 16 includes a first (ground) floor 22, a second floor 24, and a third floor 26. The floors 22, 24, 26 are serviced by the HEU 14 through a main distribution frame 28 to provide a coverage area 30 in the infrastructure 16. Only the ceilings of the floors 22, 24, 26 are shown in FIG. 1 for simplicity of illustration. In this example embodiment, a main cable 32 has a number of different sections that facilitate the placement of a large number of RAUs 20 in the infrastructure 16. Each RAU 20 in turn services its own coverage area in the coverage area 30. The main cable 32 can include, for example, a riser section 34 that carries all of the uplink and downlink optical fiber cables to and from the HEU 14. The main cable 32 can include one or more multi-cable (MC) connectors adapted to connect select downlink and uplink optical fiber cables, along with an electrical power line, to a number of optical fiber cables 36.

In this example embodiment, an interconnect unit 38 is provided for each floor 22, 24, and 26. The interconnect units 38 include an individual passive fiber interconnection of optical fiber cable ports. The optical fiber cables 36 include matching connectors. In this example embodiment, the riser section 34 includes a total of thirty-six (36) downlink and thirty-six (36) uplink optical fibers, while each of the six (6) optical fiber cables 36 carries six (6) downlink and six (6) uplink optical fibers to service six (6) RAUs 20. The number of optical fiber cables 36 can be varied to accommodate different applications, including the addition of second, third, etc. HEUs 14.

According to one aspect, each interconnect unit 38 can provide a low voltage DC current to the electrical conductors in the optical fiber cables 36 for powering the RAUs 20. For example, the interconnect units 38 can include an AC/DC transformer to transform 110V AC power that is readily available in the infrastructure 16. In one embodiment, the transformers supply a relatively low voltage DC current of 48V or less to the optical fiber cables 36. An uninterrupted power supply could be located at the interconnect units 38 and at the HEU 14 to provide operational durability to the distributed antenna system 12. The optical fibers utilized in the optical fiber cables 36 can be selected based upon the type of service required for the system, and single mode and/or multi-mode fibers may be used.

The main cable 32 enables multiple optical fiber cables 36 to be distributed throughout the infrastructure 16 (e.g., fixed to the ceilings or other support surfaces of each floor 22, 24 and 26) to provide the coverage area 30 for the first, second and third floors 22, 24 and 26. In this example embodiment, the HEU 14 is located within the infrastructure 16 (e.g., in a closet or control room), while in another example embodiment, the HEU 14 may be located outside of the building at a remote location. A base transceiver station (BTS) 40, which may be provided by a second party such as cellular service provider, is connected to the HEU 14, and can be co-located or located remotely from the HEU 14. A BTS is any station or source that provides an input signal to the HEU 14 and can receive a return signal from the HEU 14. In a typical cellular system, for example, a plurality of BTSs are deployed at a plurality of remote locations to provide wireless telephone coverage. Each BTS serves a corresponding cell and when a mobile station enters the cell, the BTS communicates with the mobile station. Each BTS can include at least one radio transceiver for enabling communication with one or more subscriber units operating within the associated cell.

The HEUs 14 are host neutral systems in this embodiment which can provide services for one or more BTSs 40 with the same infrastructure that is not tied to any particular service provider. The HEU 14 is connected to six (6) optical fiber cables 36 in this embodiment.

Figure 2:
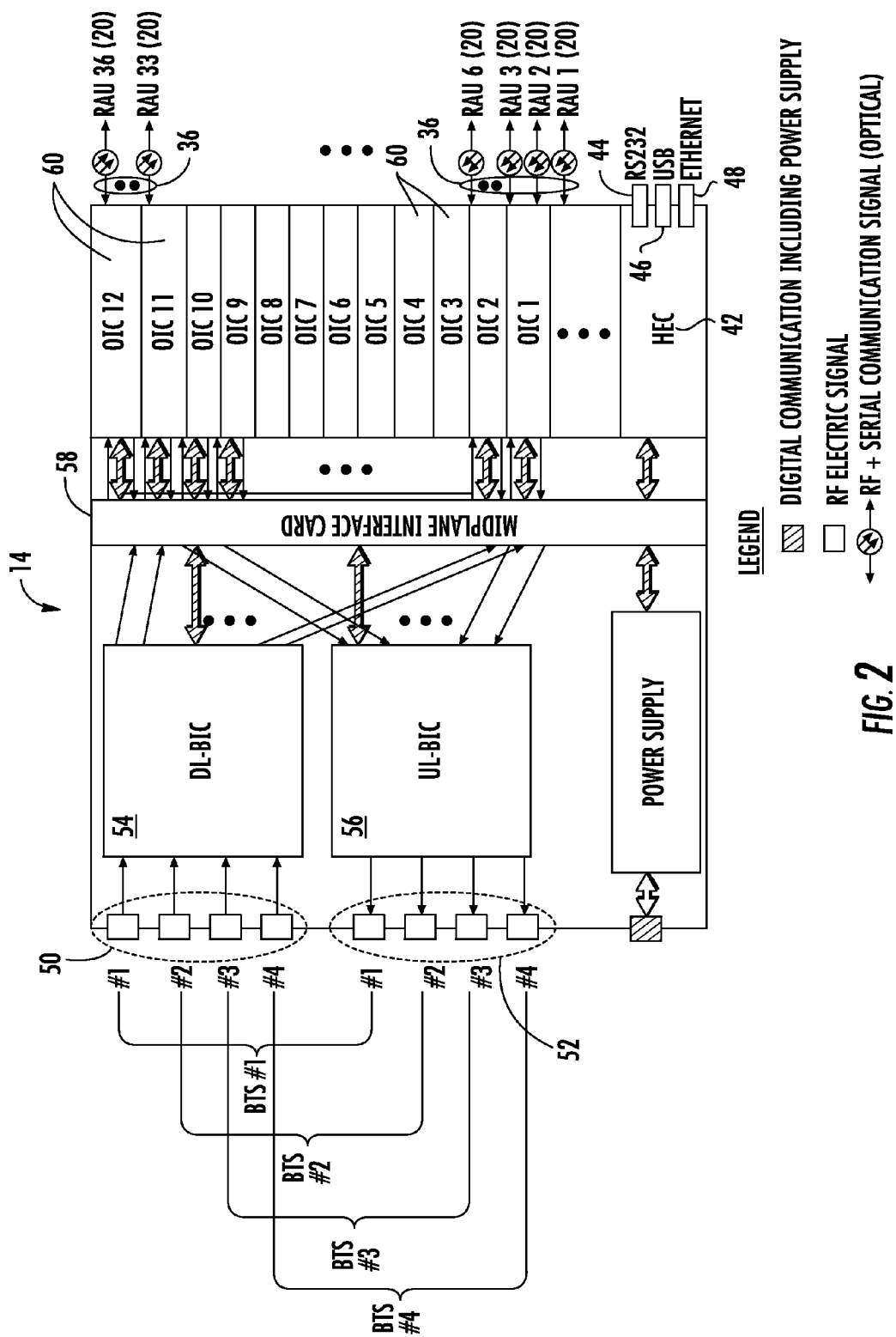
FIG. 2 is an exemplary schematic diagram of an exemplary head-end communications unit ("HEU") deployed in the distributed antenna system in FIG. 1.

FIG. 2 is a schematic diagram of the exemplary HEU 14 provided in the distributed antenna system 12 of FIG. 1 to provide further detail. As illustrated therein, the HEU 14 includes a number of exemplary distributed antenna system components. A distributed antenna system component can be any component that supports communication for the distributed antenna system, such as the distributed antenna system 12 of FIG. 1. For example, a head-end controller (HEC) 42 is included that manages the functions of the HEU 14 components and communicates with external devices via interfaces, such as a RS-232 port 44, a Universal Serial Bus (USB) port 46, and an Ethernet port 48, as examples. The HEU 14 can be connected to a plurality of BTSs, transceivers, etc. at BIC connectors 50, 52. BIC connectors 50 are downlink connectors and BIC connectors 52 are uplink connectors. Each downlink BIC connector 50 is connected to a downlink BTS interface card (BIC) 54 located in the HEU 14, and each uplink BIC connector 52 is connected to an uplink BIC 56 also located in the HEU 14. The downlink BIC 54 is configured to receive incoming or downlink RF signals from the BTS inputs, as illustrated in FIG. 2, to be communicated to the RAUs 20. The uplink BIC 56 is configured to provide outgoing or uplink RF signals from the RAUs 20 to the BTSs as a return communication path.

The downlink BIC 54 is connected to a midplane interface card 58. The uplink BIC 56 is also connected to the midplane interface card 58. The downlink BIC 54 and uplink BIC 56 can be provided in printed circuit boards (PCBs) that include connectors that can plug directly into the midplane interface card 58. The midplane interface card 58 is also in direct electrical communication with a plurality of optical interface cards (OICs) 60, which are in optical and electrical communication with the RAUs 20 via the optical fiber cables 36. The OICs 60 convert electrical RF signals from the downlink BIC 54 to optical signals, which are then communicated over the optical fiber cable 36 to the RAUs 20. The OICs 60 in this embodiment support up to three (3) RAUs 20 each.

The OICs 60 can also be provided in a PCB that includes a connector that can plug directly into the midplane interface card 58 to couple the links in the OICs 60 to the midplane interface card 58. In this manner, the exemplary embodiment of the HEU 14 is scalable to support up to thirty-six (36) RAUs 20 since the HEU 14 can support up to twelve (12) OICs 60. If less than thirty-four (34) RAUs 20 are to be supported by the HEU 14, less than twelve OICs 60 can be included in the HEU 14 and connected into the midplane interface card 58. An OIC 60 is needed for every three (3) RAUs 20 supported by the HEU 14 in this embodiment. OICs 60 can also be added to the HEU 14 and connected to the midplane interface card 58 if additional RAUs 20 are desired to be supported beyond an initial configuration. In this manner, the number of supported RAUs 20 by the HEU 14 is scalable and can be increased or decreased, as needed and in the field, by simply connecting more or less OICs 60 to the midplane interface card 58.

Figure 3:
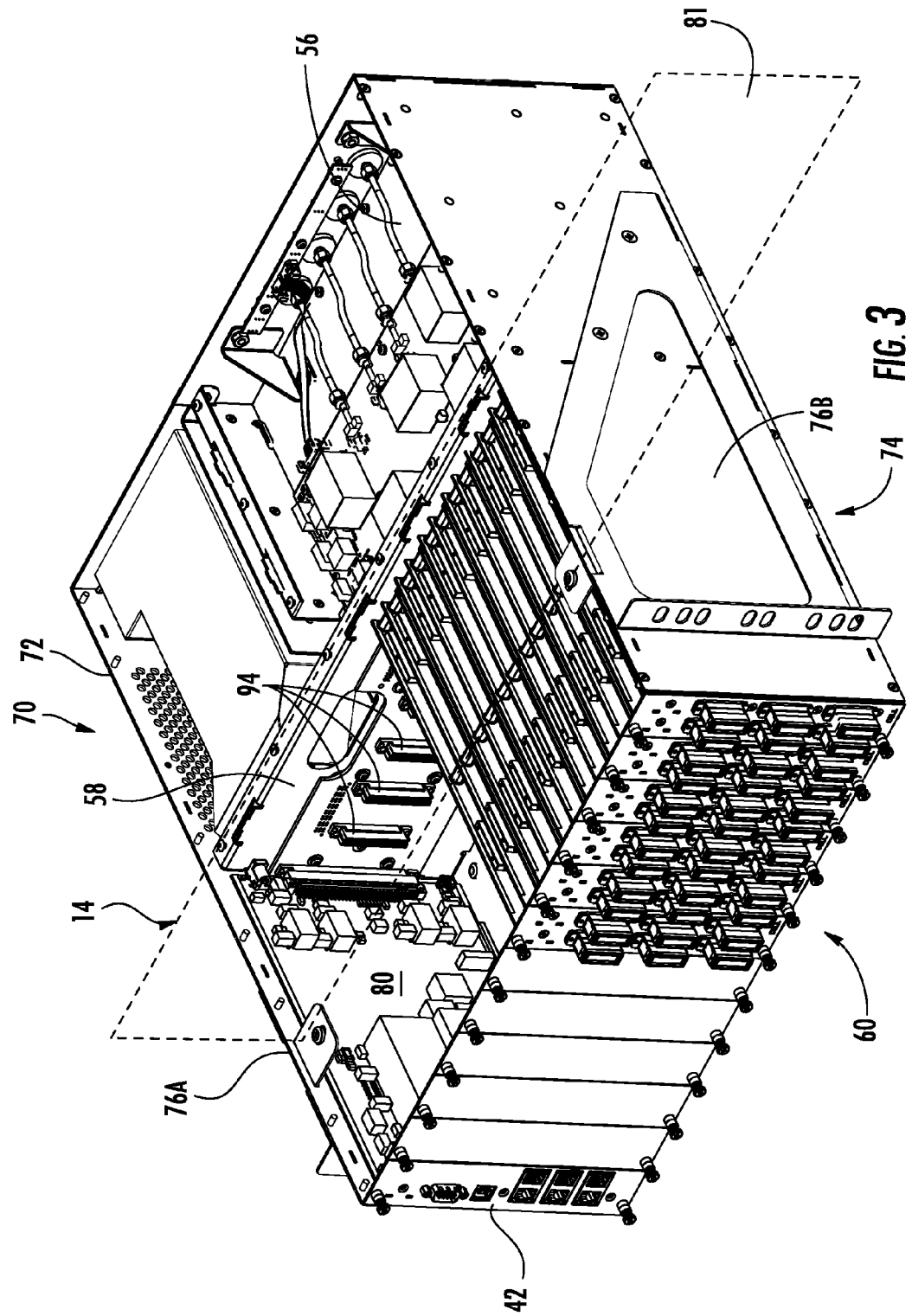
FIG. 3 is an exemplary distributed antenna system equipment housing assembly ("assembly") and enclosure configured to support the HEU of FIG. 2.
Figure 6:
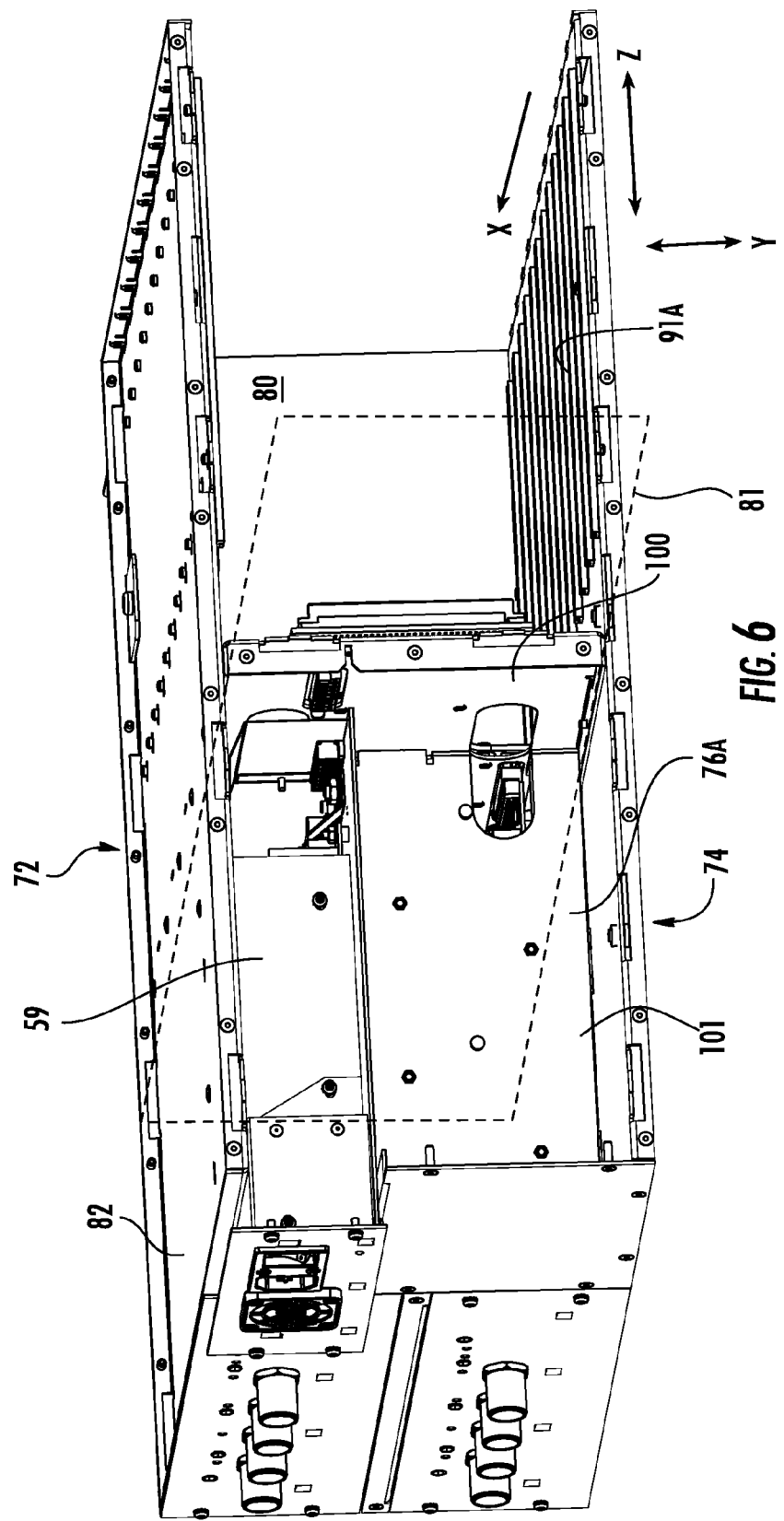
FIG. 6 is a rear side perspective view of the enclosure of FIG. 3 with the midplane interface card of FIG. 5 installed on a midplane support installed therein.

FIG. 3 illustrates an exemplary distributed antenna system housing assembly 70 (referred to as "assembly 70") that may be employed to provide an HEU, such as the HEU 14 in FIG. 2. An HEU is simply at least one communications component provided in an enclosure or housing. As will be described in more detail below, the assembly 70 is modular. The assembly 70 is configured to be easily assembled in a factory or in the field by a technician. Further, the assembly 70 supports a number of features that allow interface cards to be easily inserted and aligned with respect to the midplane interface card 58 to ensure that proper connections are made with other components of the HEU 14 that form part of the distributed antenna system, such as the distributed antenna system 12 in FIG. 1, for example. As illustrated in FIG. 3, the assembly 70 includes an enclosure 72. The enclosure 72 is comprised of a bottom plate 74 (see also, FIG. 14B) and side plates 76A, 76B. An internal cavity 80 is formed in the space formed inside the bottom plate 74 and the side plates 76A, 76B when assembled together for locating components of the HEU 14, such as the components illustrated in FIG. 2, for example. A top plate 82 can also be provided and secured to the side plates 76A, 76B, as illustrated in FIG. 6, to protect the internal cavity 80 and protect components of the HEU 14 disposed therein. Note that only two plates can be provided for the enclosure 72, if desired. For example, one plate could be a first plate wherein a second plate is attached to the first plate. The first plate could be any of the bottom plate 74, the side plates 76A, 76B, and top plate 82. Also, the second plate could be any of the bottom plate 74, the side plates 76A, 76B, and top plate 82.

Figure 4:
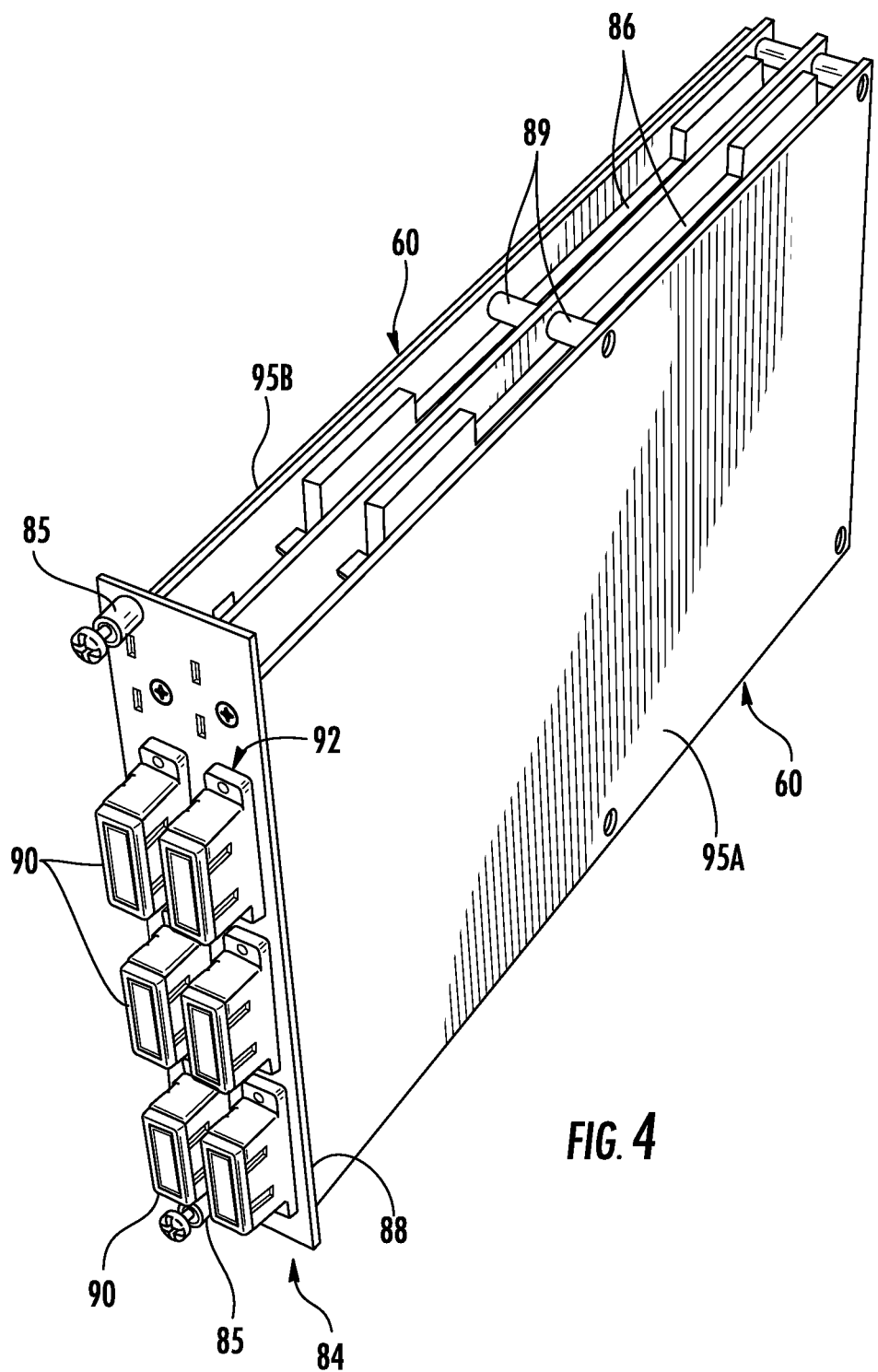
FIG. 4 is an exemplary optical interface module (OIM) comprised of a pair of optical interface cards (OIC) configured to be installed in the distributed antenna system equipment housing assembly of FIG. 3 as part of the HEU.

With continuing reference to FIG. 3, the enclosure 72 is configured to support the OICs 60 illustrated in FIG. 2. In this embodiment as illustrated FIG. 4, the OICs 60 are grouped together in pairs to form an optical interface module (OIM) 84. Thus, an OIM 84 is comprised of two (2) OICs 60 that each support up to three (3) RAUs 20 and thus the OIM 84 supports up to six (6) RAUs 20 in this embodiment. As illustrated in FIG. 4, each OIC 60 is provided as a PCB 86 with integrated circuits provided therein to provide electrical signal to optical signal conversions for communication downlinks and vice versa for communication uplinks. An OIM plate 88 is provided to assist in coupling a pair of OICs 60 together to form the OIM 84. As will be discussed in more detail below in this disclosure, the pair of OICs 60 are secured to the OIM plate 88 to form the OIM 84. The OIM plate 88 serves to support the OIC 60 and contribute to the alignment the OICs 60 for proper insertion into and attachment to the enclosure 72, which in turn assists in providing for a proper and aligned connection of the OICs 60 to the midplane interface card 58, as shown in FIG. 3. In this embodiment, the PCBs 86 are attached to shield plates 95A, 95B that are attached to the OIM plate 88 to provide mechanical, RF, and other electromagnetic interference shielding.

The OICs 60 are also secured together via standoff connectors 89 that contain alignment features to allow self-alignment between the OICs 60 when connected to the midplane interface card 58, as illustrated in FIG. 4 and as will be described in more detail in this disclosure. Connector adapters 90 are disposed in the OIM plate 88 and provide for optical connections of OIC PCBs 86 of the OICs 60. The connector adapters 90 are disposed through openings 92 in the OIM plate 88 to provide external access when the OIM 84 is installed in the enclosure 72. RAUs 20 can be connected to the connector adapters 90 to establish connections to the OICs 60 of the HEU 14, and thus provided as part of the distributed antenna system 12, via the optical fiber cables 36 in FIG. 1 being connected to the connector adapters 90. These connector adapters 90 may receive any type of fiber optic connector, including but not limited to FC, LC, SC, ST, MTP, and MPO. The OIM 84 is secured to the enclosure 72 via spring-loaded connector screws 85 disposed in the OIM plate 88 that are configured to be inserted into apertures 87 (see FIG. 5) to secure the OIM plate 88 to the enclosure 72, as illustrated in FIG. 3.

To provide flexibility in providing OIMs 84, the HEC 42, and the downlink BIC 54 and uplink BIC 56 in the HEU 14, the enclosure 72 provides for the midplane interface card 58 to be disposed inside the internal cavity 80 extending between the side plates 76A, 76B in a datum plane 81, as illustrated in FIG. 3. As will be discussed in more detail below, alignment features are provided in the midplane interface card 58 and the enclosure 72 such that proper alignment of the midplane interface card 58 with the enclosure 72 is effected when the midplane interface card 58 is inserted in the enclosure 72. Thus, when the OIMs 84, the HEC 42, and the downlink BIC 54 and uplink BIC 56 are properly and fully inserted into the enclosure 72, the alignment between these components and the enclosure 72 effect proper aligned connections between connectors on these components (e.g., connectors 94) and the midplane interface card 58. Proper connection to the midplane interface card 58 is essential to ensure proper connection to the proper components in the HEU 14 to support communications as part of a distributed antenna system supported by the HEU 14. Aligning these connections is important for proper connection, especially given that the enclosure 72 is modular and tolerances of the enclosure components in the enclosure 72 can vary.

Figure 5:
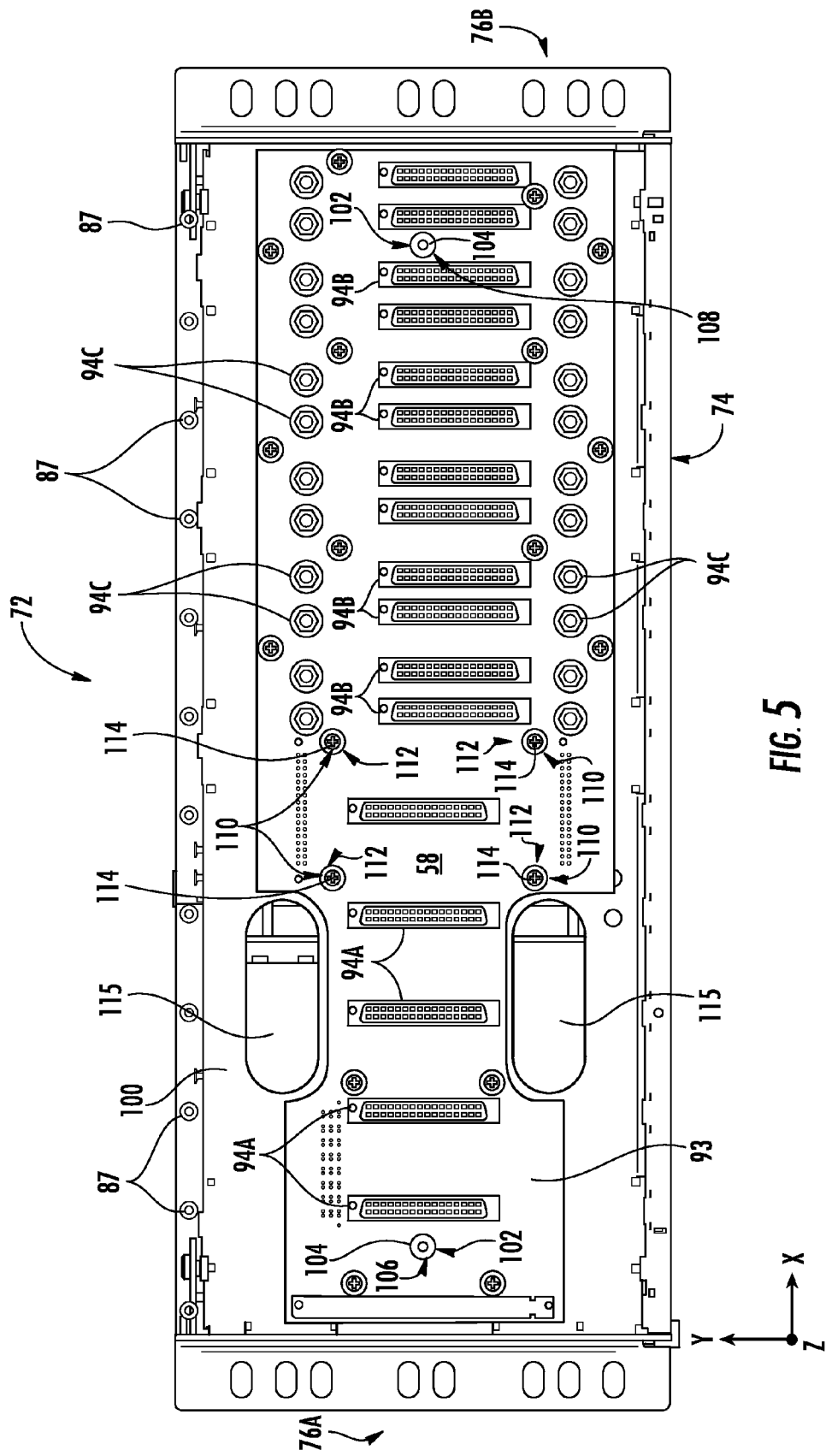
FIG. 5 is a front view of the enclosure of FIG. 3 with a midplane interface card of the HEU of FIG. 2 installed therein.

To illustrate the alignment features to properly align the midplane interface card 58 with the enclosure 72, FIG. 5 is provided to illustrate a front view of the enclosure 72 with the midplane interface card 58 installed therein. FIG. 5 illustrates a front side 93 of the midplane interface card 58. FIG. 6 illustrates a rear perspective view of the enclosure 72 with the midplane interface card 58 installed. No HEU 14 components are yet installed in the enclosure 72 in FIG. 5. FIG. 6 illustrates channels 91A that are disposed in the bottom plate 74 of the enclosure 72 to receive bottom portions of the HEC 42 and OIMs 84 to align these components in the X and Y directions of the enclosure 72. Channels 91B (FIG. 14B) are also disposed on the top plate 82 and are aligned with the channels 91A disposed in the bottom plate 74 to receive top portions of the HEC 42 and OIMs 84 to align these components in the X and Y directions. It is important that the midplane interface card 58 be properly aligned with regard to the enclosure 72 in each of the X, Y, and Z directions, as illustrated in FIG. 5, because the midplane interface card 58 includes connectors 94A, 94B, 94C that receive complementary connectors (described in more detail below) from components of the HEU 14 installed in the enclosure 72.

The connectors 94A are disposed in the midplane interface card 58 and designed to accept connections from the HEC 42 and other like cards with a compatible complementary connector, as illustrated in FIG. 3. The connectors 94B are disposed in the midplane interface card 58 and designed accept digital connections from the OICs 60. The RF connectors 94C are disposed in the midplane interface card 58 and designed to accept RF connections from the OIC 60 (see element 195, FIGS. 21 and 22). The enclosure 72 is designed such that alignment of the HEU 14 components is effected with respect to the enclosure 72 when installed in the enclosure 72. Thus, if the connectors 94A, 94B, 94C are not properly aligned with respect to the enclosure 72, components of the HEU 14, by their alignment with the enclosure 72, may not be able to establish proper connections with the midplane interface card 58 and thus will not be connected to the distributed antenna system provided by the HEU 14.

In this regard, as illustrated in FIGS. 5 and 6, a midplane support 100 is installed in the datum plane 81 of the enclosure 72 to align the midplane interface card 58 in the X, Y, and Z directions with regard to the enclosure 72. The midplane support 100 may be a plate formed from the same material as the bottom plate 74, the side plates 76A, 76B, and/or the top plate 82. The midplane support 100 provides a surface to mount the midplane interface card 58 in the enclosure 72. A divider plate 101 is also provided and attached to the midplane support 100, as illustrated in FIG. 6, to separate compartments for the downlink and uplink BICs 54, 56 and a power supply 59 (FIG. 6) to provide power for the HEC 42 and other components of the HEU 14. As will also be described in more detail below, the modular design of the enclosure 72 is provided such that the midplane support 100 is properly aligned in the datum plane 81 in the X, Y, and Z directions when installed in the enclosure 72. Thus, if alignment features are disposed in the midplane support 100 to allow the midplane interface card 58 to be properly aligned with the midplane support 100, the midplane interface card 58 can be properly aligned with the enclosure 72, and as a result, the connectors of the components of the HEU 14 installed in the enclosure 72 will be properly aligned to the connectors 94A, 94B, 94C disposed in the midplane interface card 58.

Figure 7:
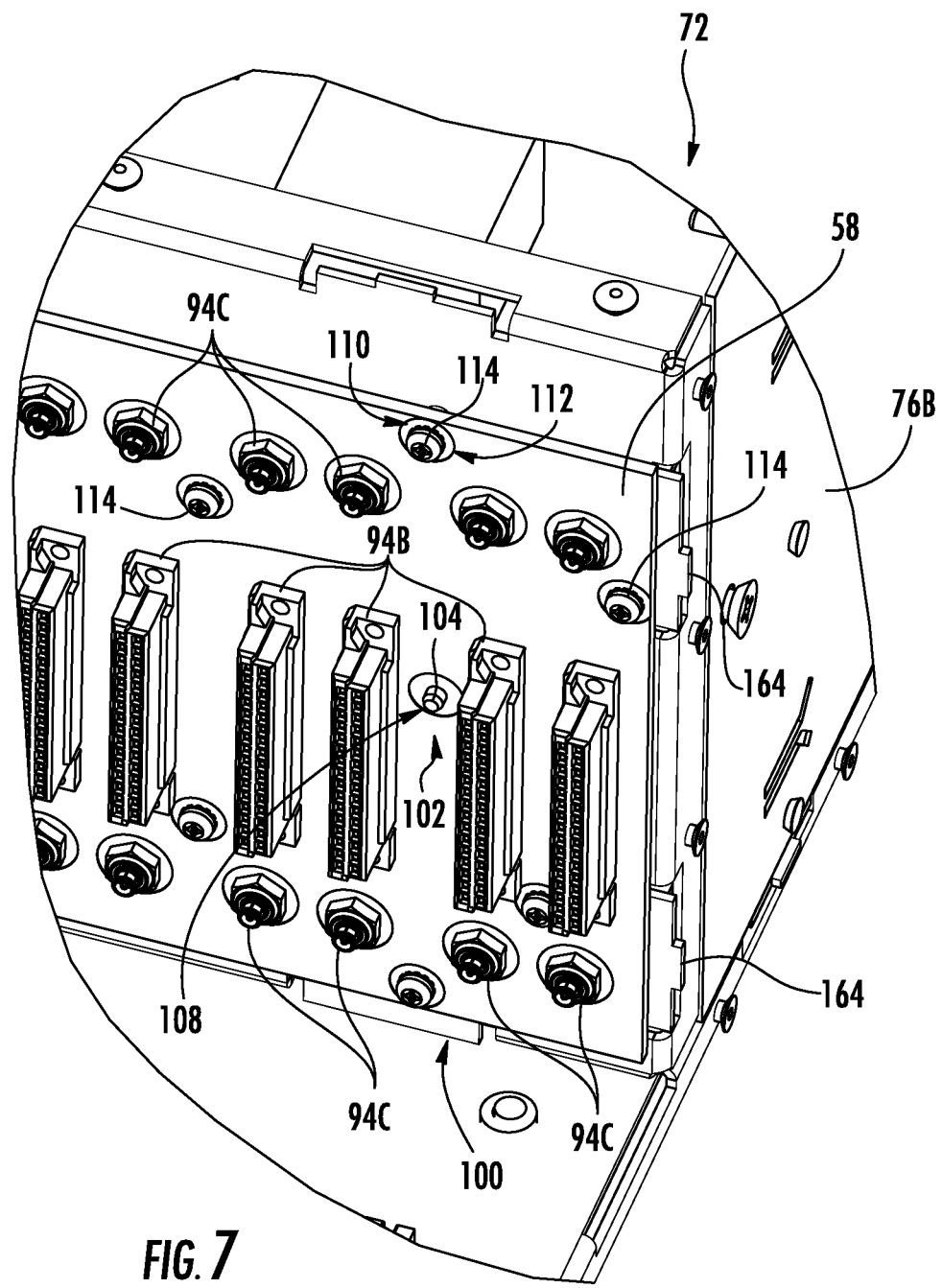
FIG. 7 is a close-up front, right side perspective view of the midplane interface card of FIG. 5 installed on a midplane support installed in the enclosure of FIG. 3.
Figure 8:
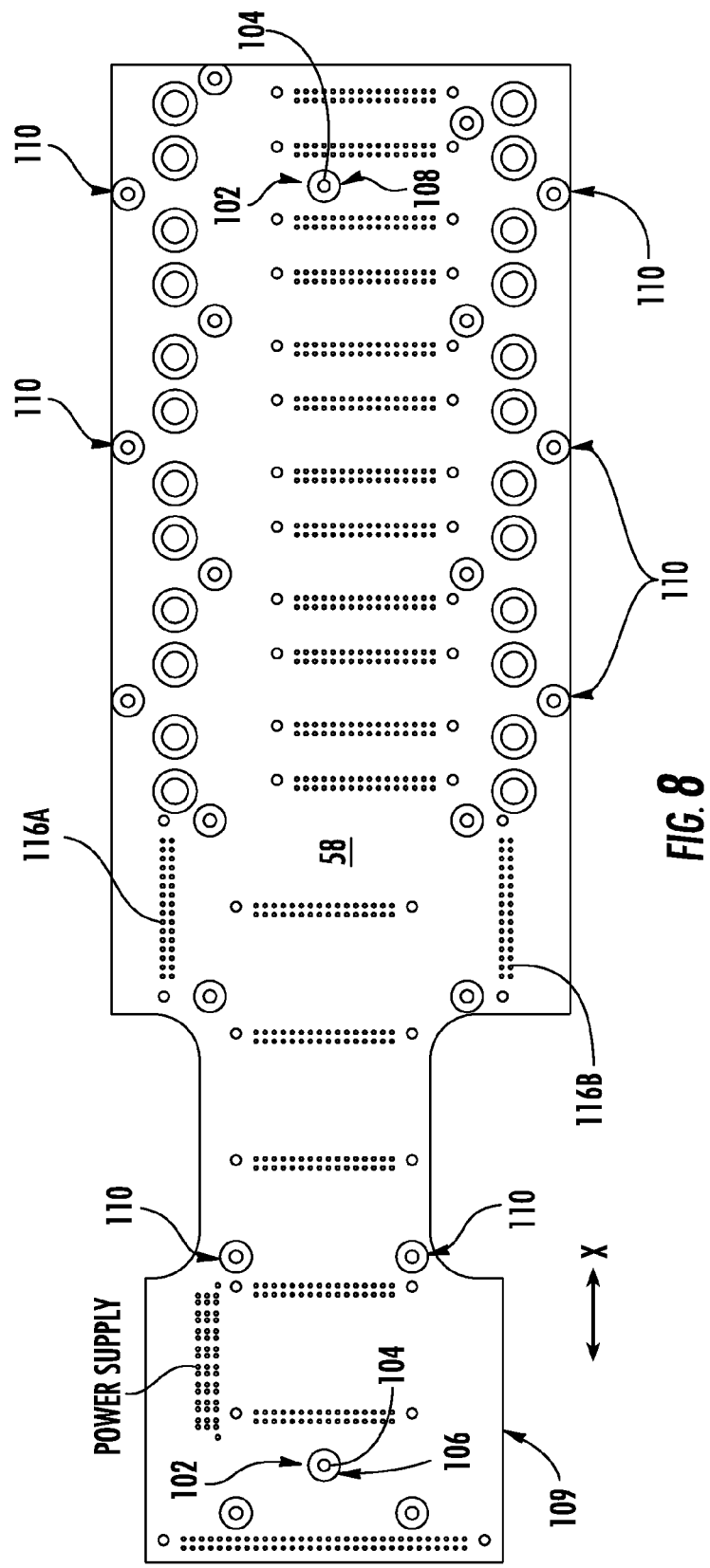
FIG. 8 illustrates a front side of the midplane interface card of FIG. 5 without connectors attached to the midplane interface card.

As illustrated in FIG. 5, two alignment features 102 are disposed in the midplane support 100 and the midplane interface card 58 to align the midplane interface card 58 in the X, Y, and Z directions with respect to the midplane support 100, and thus the enclosure 72. FIG. 7 illustrates a close-up view of the right-hand side of the midplane interface card 58 installed on the midplane support 100 that also shows one of the alignment features 102. The alignment features 102 in this embodiment are comprised of PCB support guide pins 104 that are configured to be disposed in alignment openings 106, 108 disposed in the midplane interface card 58 and midplane support 100, respectively. FIG. 8 illustrates a front side 109 of the midplane interface card 58 without connectors. The PCB support guide pins 104 are installed and configured to be disposed through the alignment openings 106, 108. Before the PCB support guide pins 104 can be inserted through both alignment openings 106, 108 disposed in the midplane interface card 58 and midplane support 100, the alignment openings 106, 108 are aligned with the PCB support guide pins 104. Thus, by this alignment, the midplane interface card 58 is aligned in the X and Y directions with the midplate support 100. For example, the inner diameter of the openings 106, 108 may be 0.003 inches or less larger that the outer diameter of the PCB support guide pin 104. Also, the tolerances between the center lines in the X direction of the alignment openings 106, 108 may be less than 0.01 inches or 0.005 inches, as examples, to provide an alignment between the alignment openings 106, 108 before the PCB support guide pins 104 can be disposed through both alignment openings 106, 108. Any other tolerances desired can be provided.

Once the PCB support guide pins 104 are inserted into the openings 106, 108, the midplane interface card 58 can be screwed in place to the midplane support 100. In this regard, additional openings 110 are disposed in the midplane interface card 58, as illustrated in FIG. 5. These openings 110 are configured to align with openings 112 disposed in the midplane support 100 when the alignment openings 106, 108 are aligned or substantially aligned. A total of twenty (20) or other number of openings 110, 112 are disposed in the midplane interface card 58 and midplane support 100, as illustrated in FIG. 5. Fasteners 114, such as screws for example, can be disposed through the openings 110, 112 to secure the midplane interface card 58 to the midplane support 100 and to, in turn, align the midplane interface card 58 to the midplane support 100 in the Z direction.

FIG. 8 illustrates the midplane interface card 58 without the fasteners 114 disposed in the openings 110 to further illustrate the openings 110. The fasteners 114 are screwed into self-clinching standoff. For example, the self-clinching standoff may be disposed in the midplane support 100. The height tolerances of the self-clinching standoffs may be between +0.002 and −0.005 inches, as an example. The inner diameter of the openings 110 may be 0.030 inches greater than the outer diameter of the fasteners 114, for example, since openings 110 are not used to provide the alignment provided by PCB support guide pins 104 and openings 106, 108. Further, as illustrated in FIG. 5, openings 115 are disposed in the midplane support 100 to allow cabling to be extended on each side of the midplane interface card 58. The nominal distance in one embodiment between the midplane support 100 and the midplane interface card 58 when installed is 0.121 inches, although any other distances could be provided.

The midplane interface card 58 is also configured to receive direct connections from the downlink BIC 54 and the uplink BIC 56 when installed in the enclosure 72. As illustrated in the rear view of the enclosure 72 in FIG. 9, the downlink BIC 54 and uplink BIC 56 are designed to be inserted through a rear side 116 of the enclosure 72. Referring back to FIG. 8, connector holes 116A, 116B are disposed on the midplane interface card 58 in FIG. 8 show where connectors are provided that are connected to connectors 118 (see FIGS. 10A and 10B) of the downlink BIC 54 and uplink BIC 56 when the downlink BIC 54 and uplink BIC 56 are received are fully inserted into the enclosure 72. The alignment features 102, by being provided between the midplane interface card 58 and the midplane support 100 as previously discussed, also provide proper alignment of the connector holes 116A, 116B to be properly aligned with the connectors 118 in the downlink BIC 54 and uplink BIC 56 when inserted in the enclosure 72.

Figure 9:
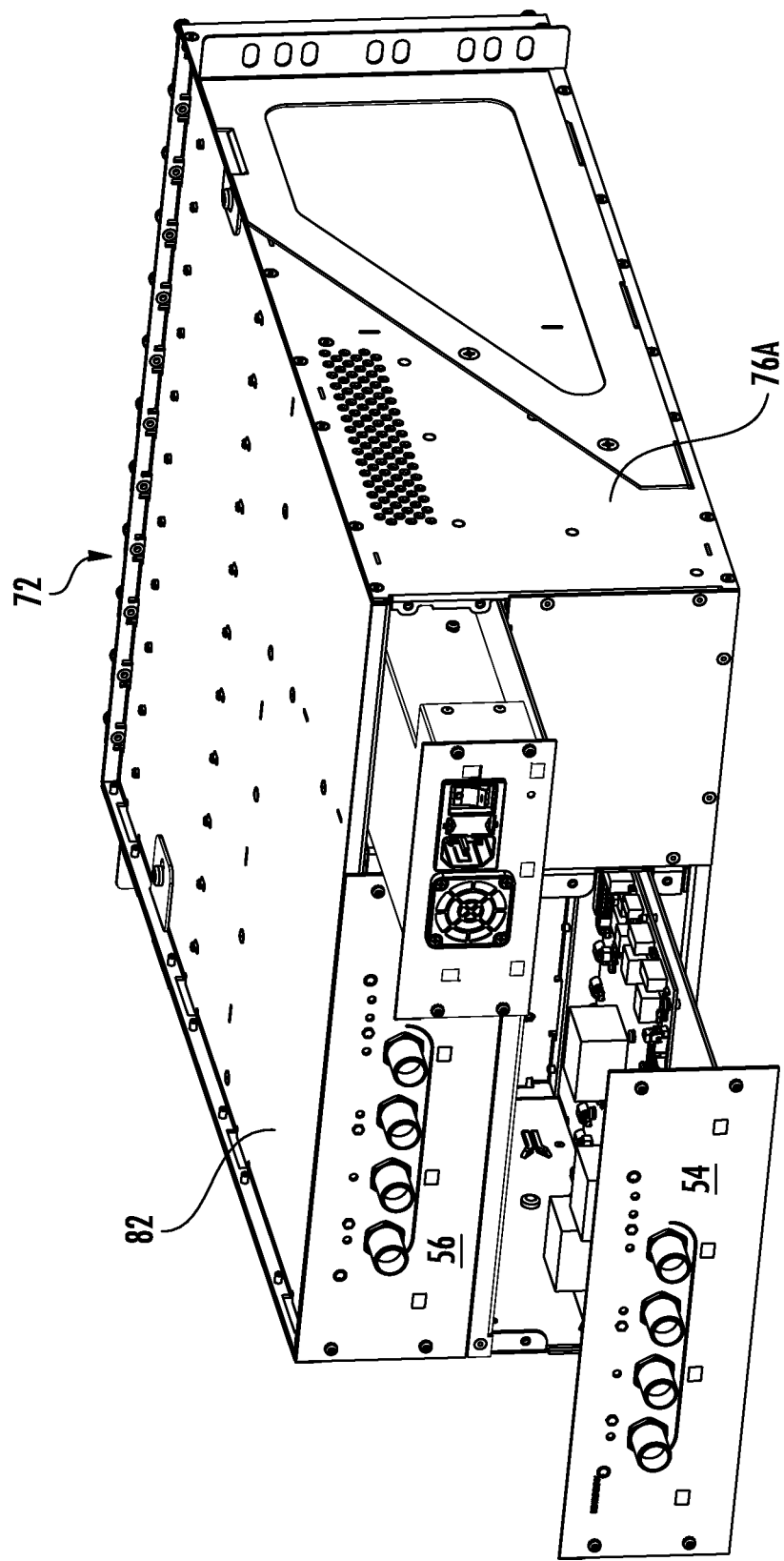
FIG. 9 illustrates a rear view of the enclosure of FIG. 3 with a downlink base transceiver interface (BTS) card (BIC) being inserted into the enclosure and an uplink BIC fully inserted into the enclosure and connected to the midplane interface card disposed in the enclosure.
Figure 10A:
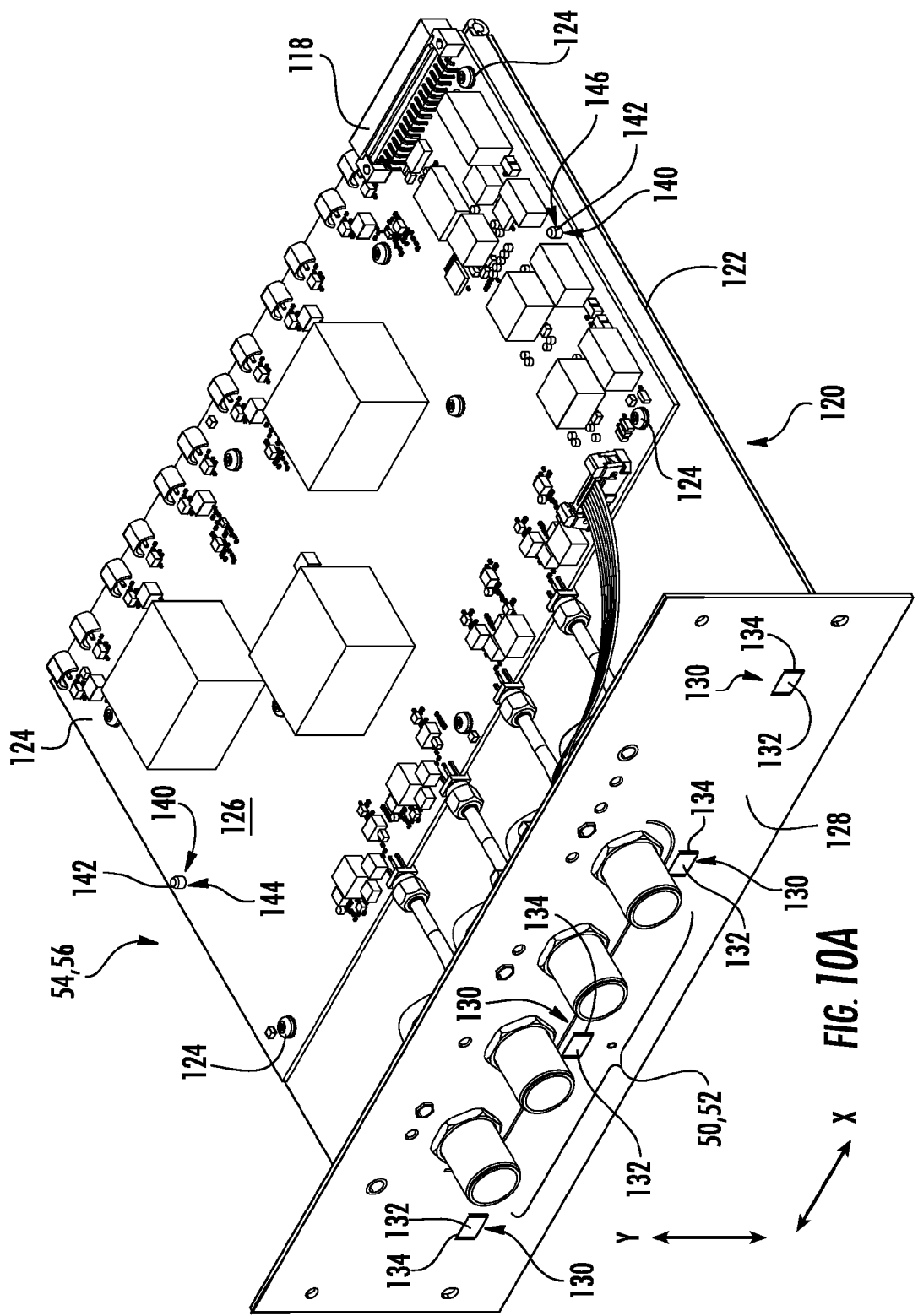
FIGS. 10A and 10B illustrate front and rear perspective views, respectively, of BIC assemblies that can be inserted in the enclosure of FIG. 3 with the BIC disposed in the assemblies connected to the midplane interface card disposed in the enclosure of FIG. 3.
Figure 10B:
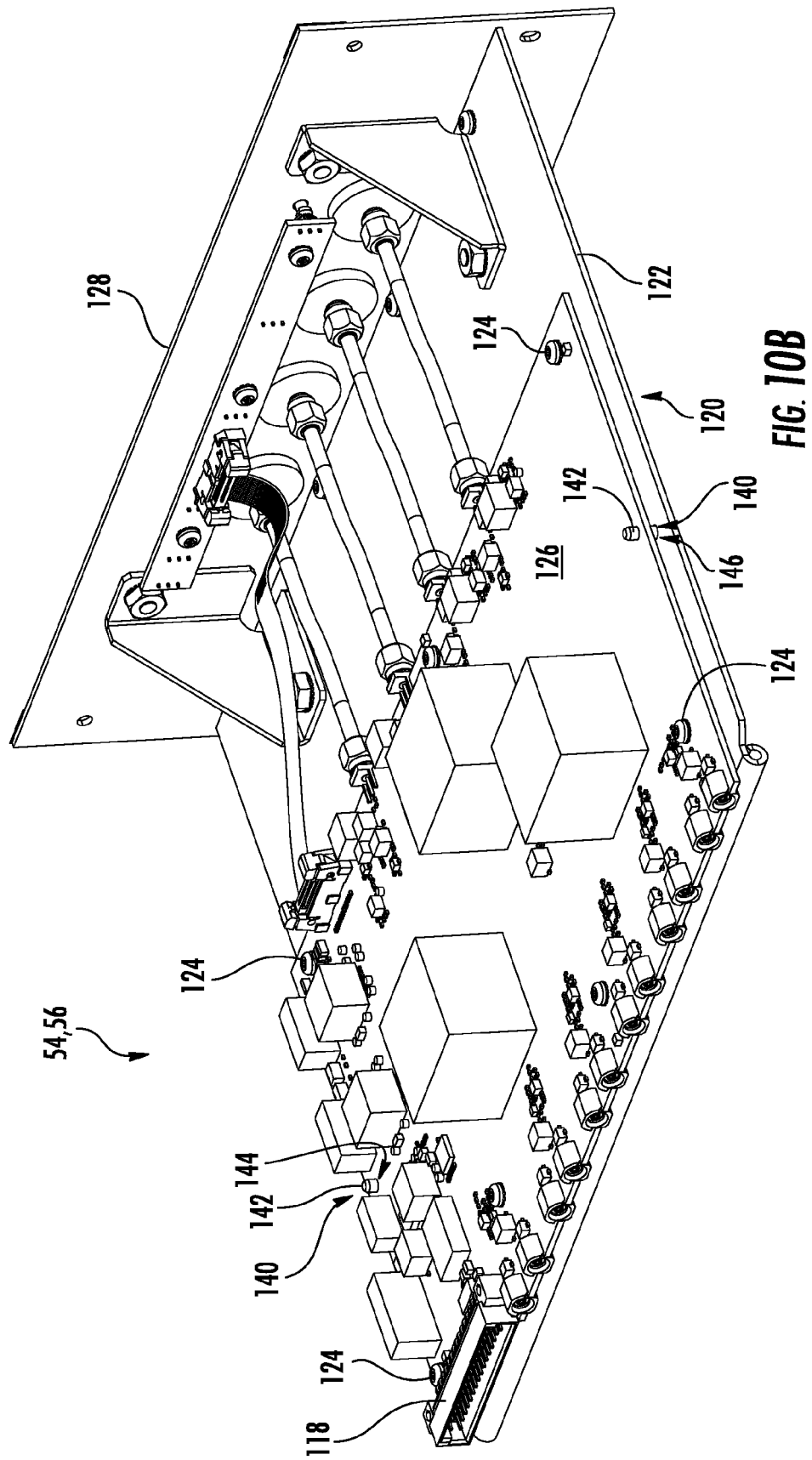
Figure 11:
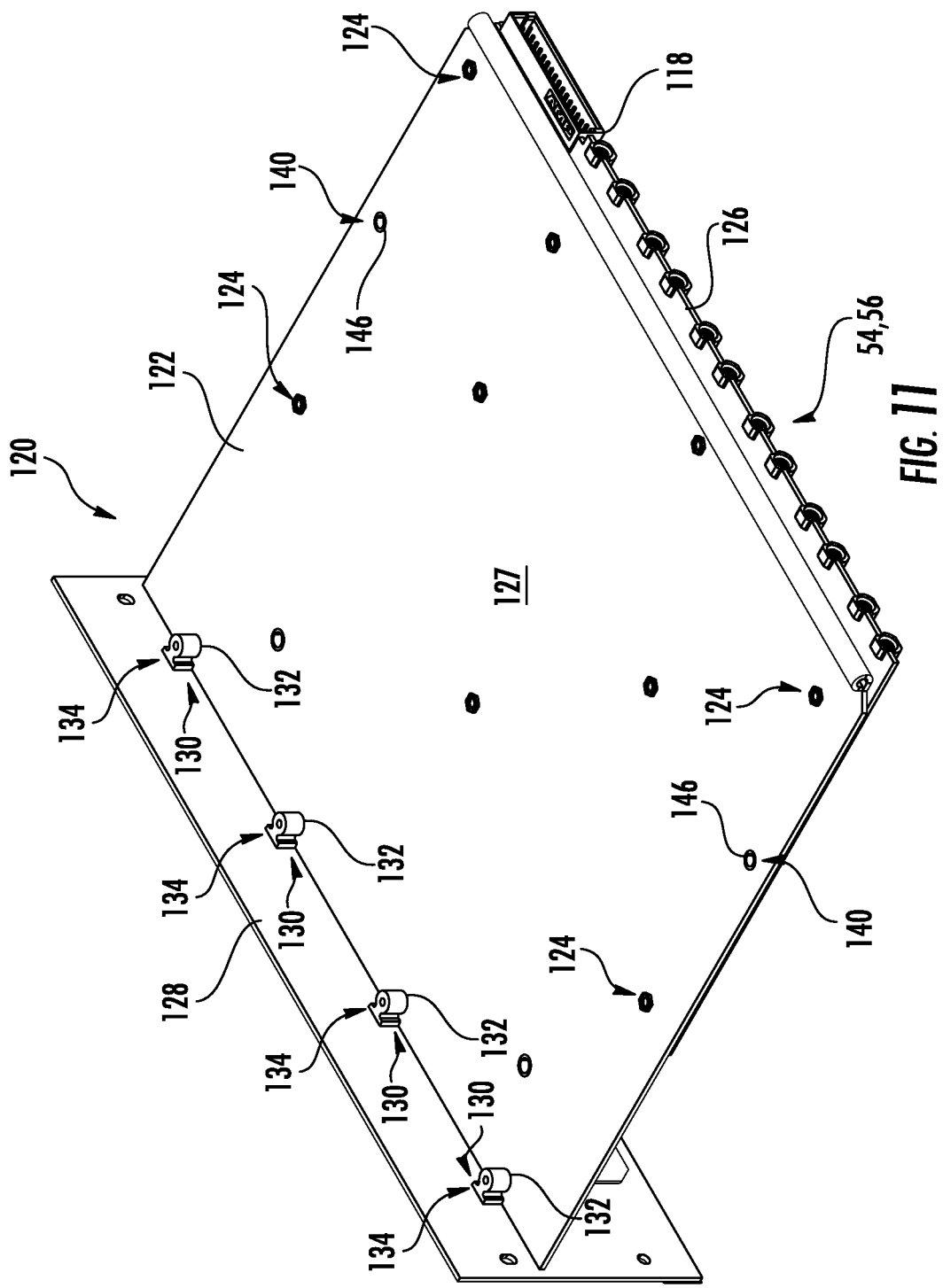
FIG. 11 illustrates a bottom view of the BIC assembly of FIGS. 10A and 10B.
Figure 12:
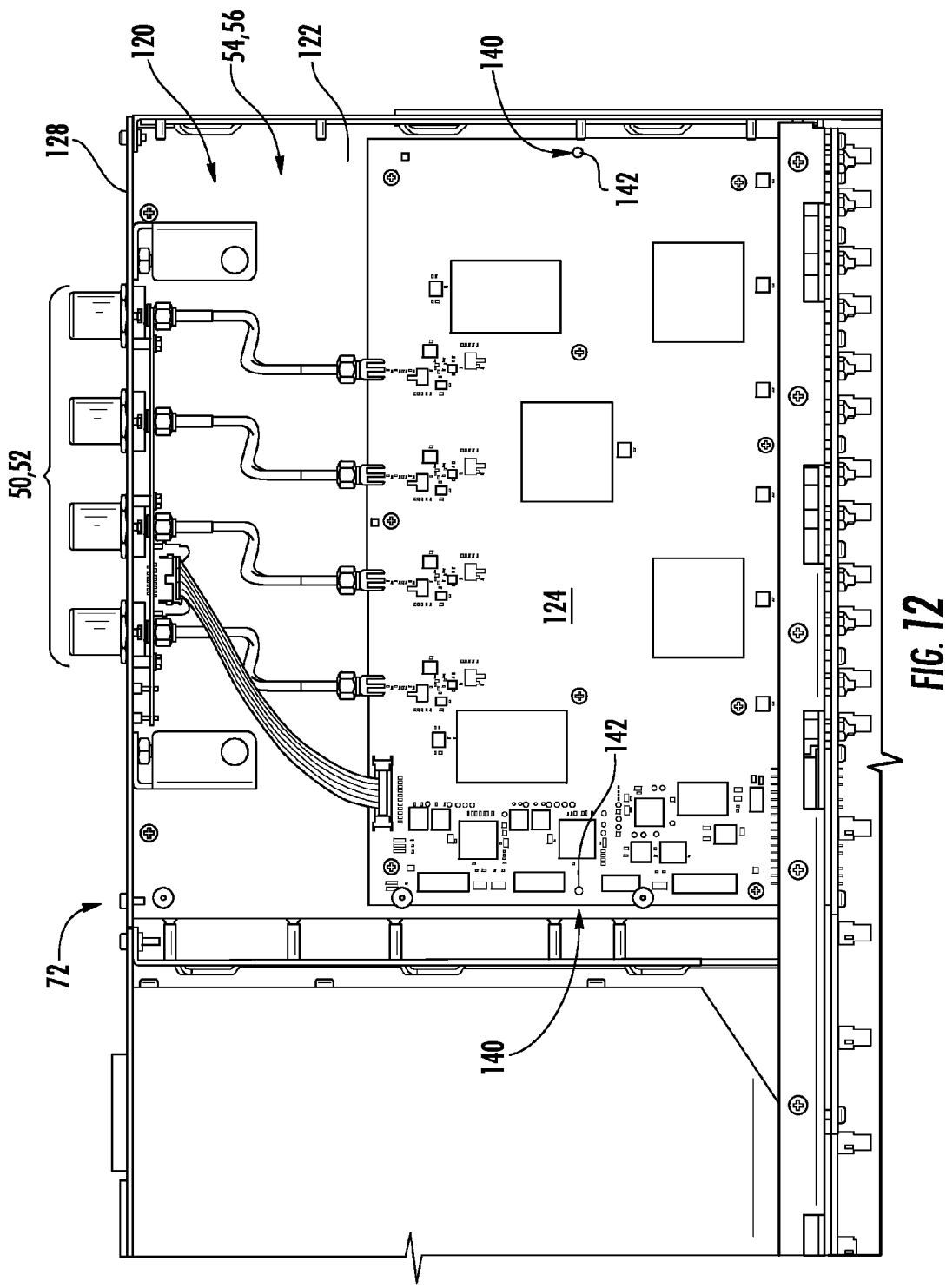
FIG. 12 illustrates a top view of the BIC assembly of FIGS. 10 and 10B installed in the enclosure of FIG. 3.

FIGS. 10A and 10B illustrate a BIC assembly 120 that supports the downlink BIC 54 or the uplink BIC 56 and is configured to be received in the enclosure 72 to connect the downlink BIC 54 or the uplink BIC 56 to the midplane interface card 58. The BIC assembly 120 is the same whether supporting the downlink BIC 54 or the uplink BIC 56; thus, the BIC supported by the BIC assembly 120 in FIGS. 10A and 10B could be either the downlink BIC 54 or the uplink BIC 56. The BIC assembly 120 includes a BIC support plate 122 that is configured to secure the downlink and uplink BICs 54, 56. Standoffs 124 are provided to support a BIC PCB 126 of the downlink and uplink BICs 54, 56 above the BIC support plate 122. A BIC face plate 128 is coupled generally orthogonal to the BIC support plate 122 to secure the downlink and uplink BICs 54, 56 to the enclosure, as illustrated in FIG. 9. Alignment features 130 are provided between the BIC support plate 122 and the BIC face plate 128 to ensure that the BIC PCB 126, and thus its connector 118, are properly aligned in the X and Y directions, as illustrated in FIG. 9, when the downlink and uplink BICs 54, 56 are inserted in the enclosure 72. Thus, the connector 118 will be properly aligned with the enclosure 72 and thus the connector holes 116A, 116B on the midplane interface card 58 to allow a proper connection between the downlink and uplink BICs 54, 56 and the midplane interface card 58. The alignment features 130 will ensure alignment of the BIC PCB 126 as long as the BIC PCB 126 is properly installed on the BIC support plate 122, which will be described in more detail below. As illustrated on the bottom side 127 of the BIC assembly 120 in FIG. 11, the alignment features 130 in this embodiment are protrusions 132 attached to the BIC support plate 122 that are configured to be disposed through openings 134 disposed through the BIC face plate 128, as illustrated in FIG. 10A. The downlink or uplink BIC connectors 50, 52 (see also, FIG. 2), as the case may be, are disposed through the BIC face plate 128 to allow BTS inputs and outputs to be connected to the downlink and uplink BICs 54, 56, external to the enclosure 72 when the downlink and uplink BICs 54, 56 are fully inserted in the enclosure 72.

To provide alignment of the BIC PCB 126 to the BIC support plate 122, alignment features 140 are also disposed in the BIC PCB 126 and the BIC support plate 122, as illustrated in FIGS. 10A, 10B, 11 and 12. As illustrated therein, PCB support guide pins 142 are disposed through alignment openings 144, 146 disposed in the BIC PCB 126 and BIC support plate 122, respectively, when aligned. The alignment openings 144 and 146 are designed to only be aligned to allow the PCB support guide pin 142 to be disposed therein when the alignment openings 144, 146 are in alignment. For example, the tolerances between the alignment openings 144, 146 may be less than 0.01 inches or less than 0.005 inches, as examples, to ensure an alignment between the alignment openings 144, 146 before the PCB support guide pins 142 can be disposed through both alignment openings 144, 146. Any other tolerances desired can be provided.

FIGS. 9-12 described above provide the BIC connectors 50, 52 disposed through the rear side 116 of the enclosure 70.

Figure 13:
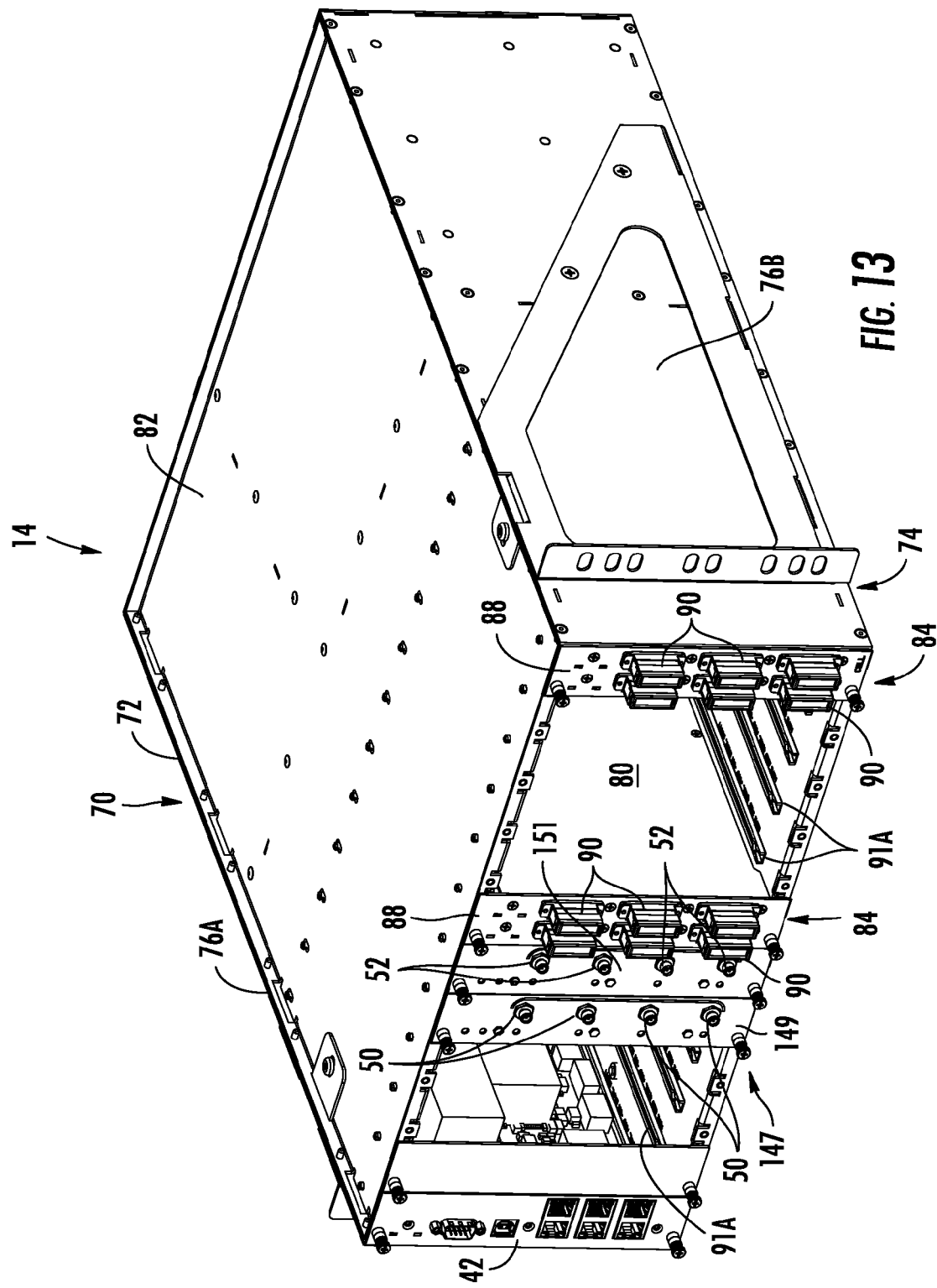
FIG. 13 is a side perspective view of the assembly of FIG. 3 with downlink BIC connectors for the downlink BIC and uplink BIC connectors for the uplink BIC disposed in downlink and uplink BIC connector plates, respectively, which are attached to the front of the enclosure.

To establish connections with the BIC connectors 50, 52, connections are established to the BIC connectors 50, 52 in the rear side 116 of the enclosure 72. Alternatively, the enclosure 72 could be designed to allow connections to be established to the downlink BIC 54 and the uplink BIC 76 from the front side of the enclosure 72. In this regard, FIG. 13 is a side perspective view of the assembly 70 of FIG. 3 with the downlink BIC connectors 50 for the downlink BIC and the uplink BIC connectors 52 for the uplink BIC 56 disposed through a front side 147 of the enclosure 72. As illustrated therein, a downlink BIC connector plate 149 containing downlink BIC connectors 50 disposed therein is disposed in the front side 147 of the assembly 70. Similarly, an uplink BIC connector plate 151 containing uplink BIC connectors 52 disposed therein is also disposed in the front side 147 of the assembly 70.

Figures 14, 15:
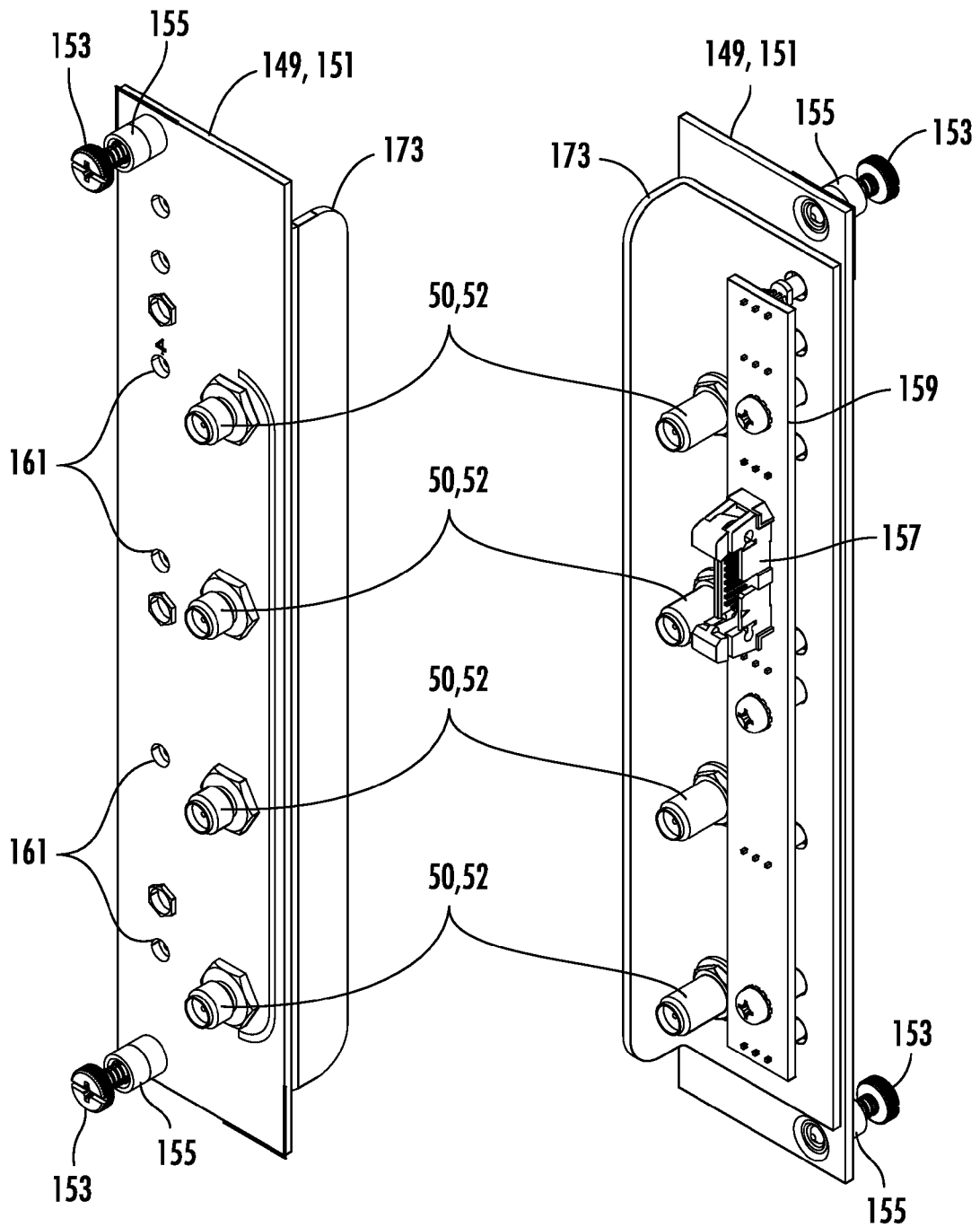
FIG. 14 is a front perspective view of the BIC connector plate illustrated in FIG. 13 with BIC connectors disposed therethrough.
FIG. 15 is a rear perspective view of the BIC connector plate with BIC connectors disposed therethrough illustrated in FIG. 14.

FIGS. 14 and 15 illustrate front and rear perspective views of an exemplary BIC connector plate, which can be BIC connector plate 149 or 151. As illustrated therein, the BIC connectors 50 or 52 are disposed through the BIC connector plate 149 or 151 so that the BIC connectors 50 or 52 can be accessed externally through the front side 147 of the assembly 70. Fasteners 153 can be disposed through openings 155 in the BIC connector plates 149 or 151 to fasten the BIC connector plates 149 or 151 to the assembly 70. Channel guides 173 are attached to the BIC connector plates 149 or 151 that are configured to be received in the channels 91A, 91B in the assembly 70 to assist in aligning the BIC connector plates 149 or 151 with the assembly 70 when disposing the BIC connector plates 149 or 151 in the assembly 70. Because the downlink BIC 54 and uplink BIC 56 are disposed in the rear of the assembly 70, as illustrated in FIGS. 9-12, the BIC connectors 50 or 52 are provided in the BIC connector plates 149 or 151 to connect the BIC connectors 50 or 52 to the downlink BIC 54 or uplink BIC 56, as illustrated in FIG. 15 and as will be described below with regard to FIGS. 16 and 17. Further, a BIC ribbon connector 157 is disposed in the BIC connector plates 149 or 151 to connect to the downlink BIC 54 or uplink BIC 56 to carry status signals regarding the downlink BIC 54 or uplink BIC 56 to be displayed on visual indicators 161 disposed on the BIC connector plates 149 or 151.

Figure 16:
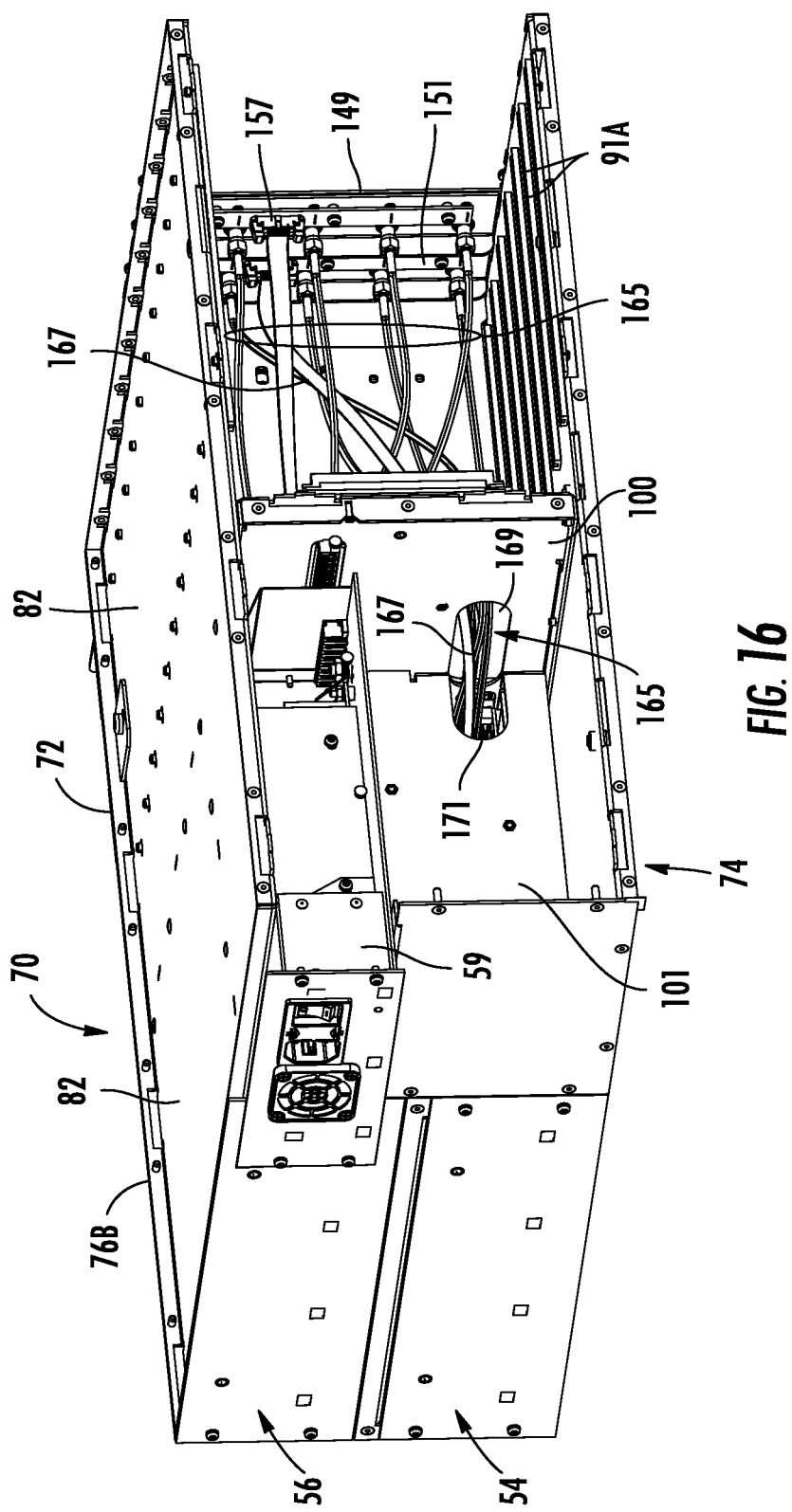
FIG. 16 is a rear side perspective view of the enclosure of FIG. 13 illustrating cables connected to the BIC connectors disposed through the BIC connector plates routed through openings in the midplane support to the downlink BIC and uplink BIC disposed in the enclosure.
Figure 17:
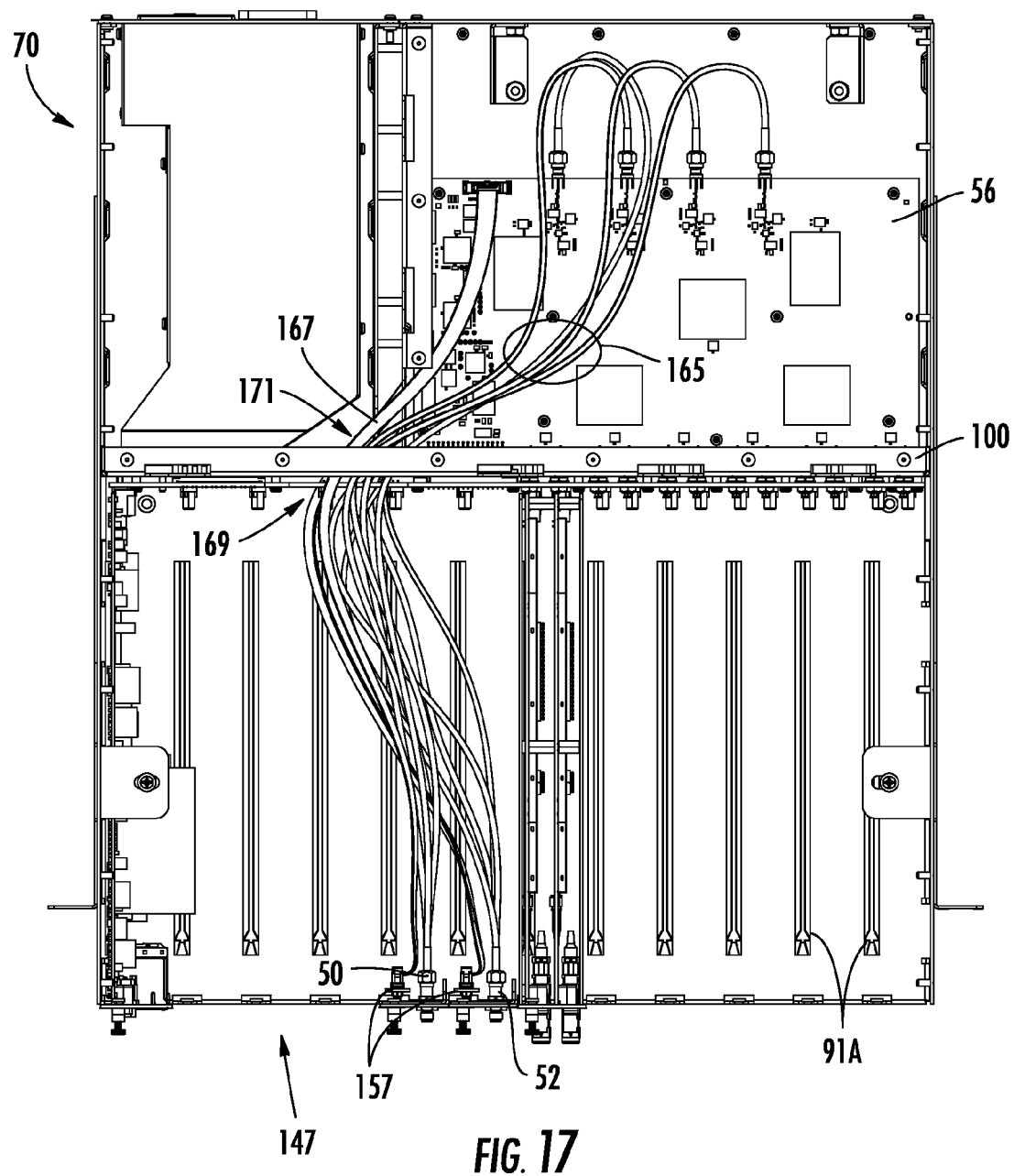
FIG. 17 is a top view of the enclosure of FIG. 13 illustrating cables connected to the BIC connectors disposed through the BIC connector plates routed through openings in the midplane support to the downlink BIC and uplink BIC disposed in the enclosure.

FIG. 16 is a rear side perspective view of the enclosure 72 illustrating cables 165, 167 connected to the BIC connectors 50, 52 being disposed through an opening 169 in the midplane support 100 and an opening 171 in the divider plate 101. The cables 165, 167 provide connections between the BIC connectors 50, 52 and the BIC ribbon connector 157 so that the BIC connectors 50, 52 can be disposed in the front side 147 of the assembly 70 with the downlink BIC 54 and the uplink BIC 56 disposed in the rear of the assembly 70. FIG. 17 is a top view of the assembly 70 further illustrating the routing of the cables 165, 167 connecting the BIC connectors 50, 52 and BIC ribbon connector 157 through the openings 169, 171 to the downlink BIC 54 and uplink BIC 56.

Figure 18:
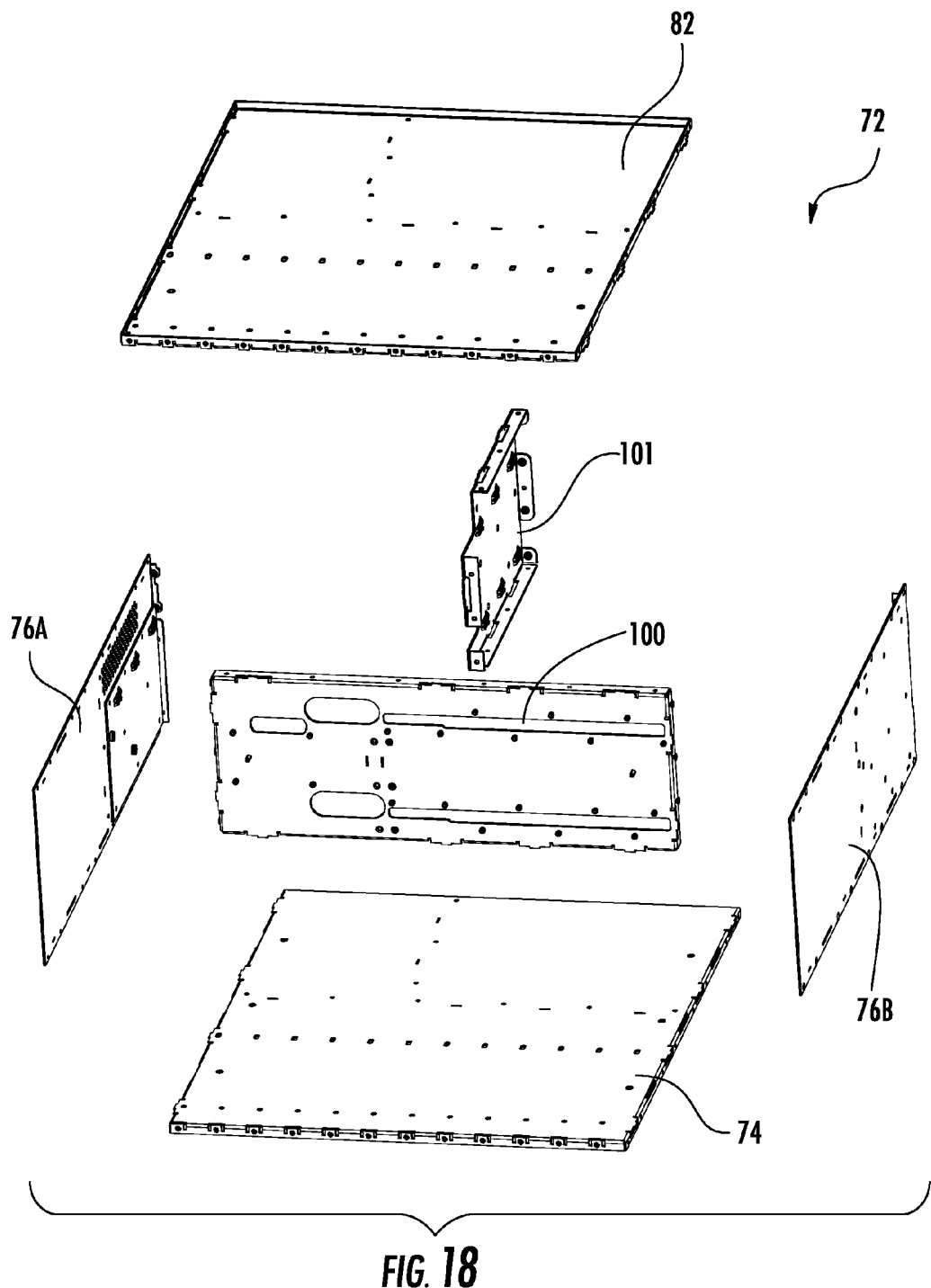
FIG. 18 is a front exploded perspective view of plates of the enclosure of FIG. 3 that are assembled together in a modular fashion to form the enclosure.

The enclosure 72 is also provided as a modular design to allow the enclosure to be easily assembled and to effect proper alignment between the various plates and components that form the enclosure 72. For example, FIG. 18 illustrates a front exploded perspective view of the enclosure 72. As illustrated therein, the enclosure 72 is formed from the side plates 76A, 76B being connected to and between the bottom plate 74 and the top plate 82. The midplane support 100 is configured to be disposed in the datum plane 81 (see FIG. 5) of the enclosure 72 when assembled. The divider plate 101 is configured to be attached to the midplane support 100 generally orthogonal to the datum plane 81 to divide compartments for the downlink and uplink BICs 54, 56 and a power module disposed in the HEU 14 on the rear side of the midplane support 100.

Figure 19A:
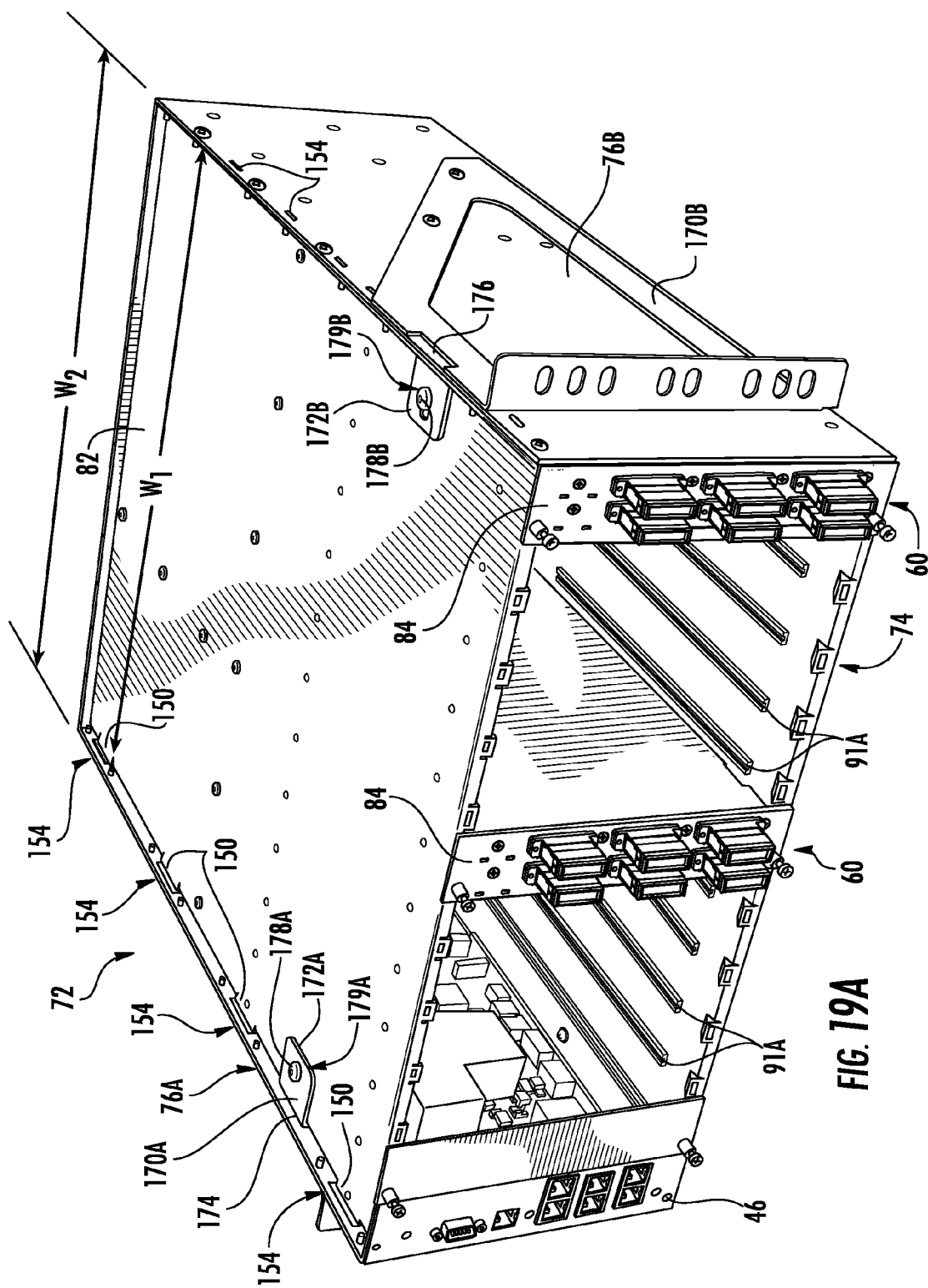
FIGS. 19A and 19B illustrate top and bottom perspective views of the enclosure of FIG. 3.
Figure 19B:
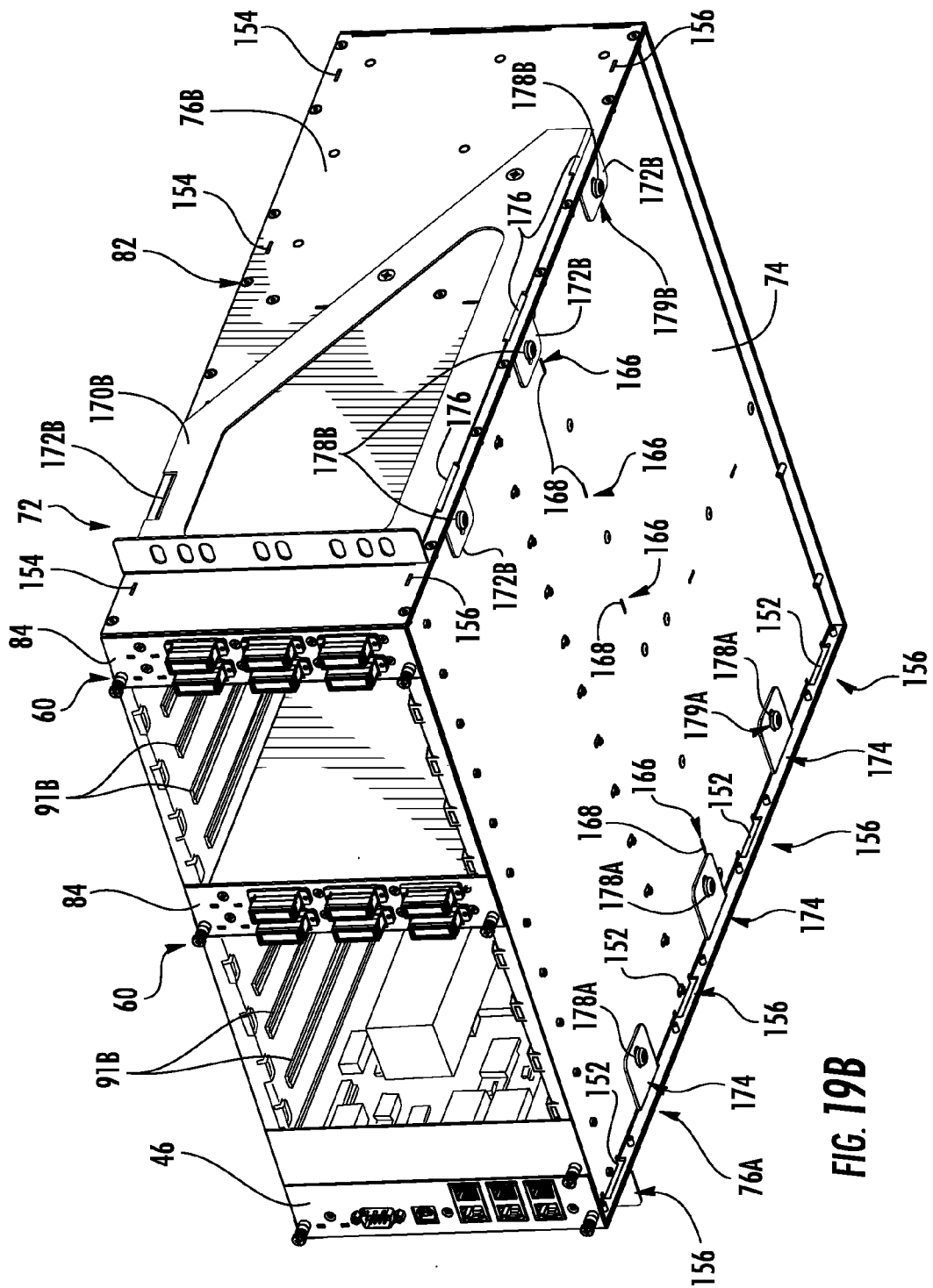
Figure 20:
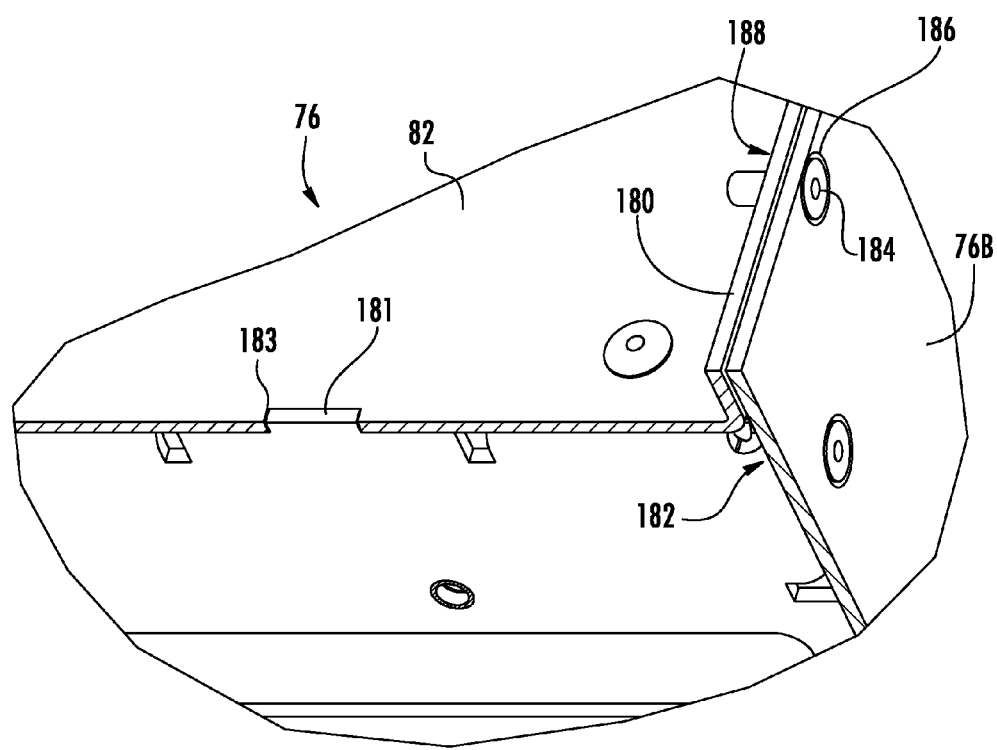
FIG. 20 illustrates a close-up view of the engagement of the top plate of the enclosure in FIG. 3 with a side plate and midplane support of the enclosure of FIG. 3.

To further illustrate the modularity and ease in assembly of the enclosure 72, FIGS. 19A and 19B illustrate top and bottom perspective view, respectively, of the enclosure 72 to further illustrate how the side plates 76A, 76B are attached to the top plate 82 and bottom plate 74. In this regard, the top and bottom plates 82, 74 include an alignment feature in the form of locating tabs 150, 152. The locating tabs 150, 152 are integrally formed in the top and bottom plates 74, 82 and are configured to engage with complementary alignment openings or alignment slots 154, 156 integrally disposed in the side plates 76A, 76B. FIGS. 19A and 19B also illustrates a close-up view of the top plate 82 attached to the side plate 76B and the locating tabs 150 engaged with the alignment slots 154. This allows the top and bottom plates 74, 82 to be attached in proper alignment quickly and easily with the side plates 76A, 76B when assembling the enclosure 72. In the enclosure 72, there are four (4) locating tabs 150, 152 on each side of the top and bottom plates 82, 74, and four (4) complementary alignment slots 154, 156 disposed on each side of the side plates 76A, 76B, although any number of locating tabs and slots desired can be employed. Fasteners can then be employed, if desired to secure the locating tabs 150, 152 within the alignment slots 154, 156 to prevent the enclosure 72 from disassembling, as illustrated in FIG. 20. FIG. 20 also illustrates a close-up view of the top plate 82 attached to the side plate 76B in this regard.

As illustrated in FIG. 20, the top plate 82 contains rolled or bent up sides 180 that are configured to abut tightly against and a top inside side 182 of the side plate 76B. The same design is provided between the top plate 82 and the side plate 76A, and the bottom plate 74 and the side plates 76A, 76B. An outer width $W_1$ of the top and bottom plates 82, 74 is designed such that the fit inside an inner width $W_2$ of the side plates 76A, 76B, as illustrated in FIG. 19A. Fasteners 184 disposed in openings 186 in the side plates 76A, 76B and openings 188 in the top and bottom plates 82, 74 pull the side plates 76A, 76B and the top and bottom plates 82, 74 close together tightly to provide a tight seal therebetween. Further, as illustrated in FIG. 20, an alignment tab 181 extending from the midplane support 100 is shown and extends into a slot 183 disposed in the top plate 82 to further align the midplane support 100 with the enclosure 72.

Figure 21:
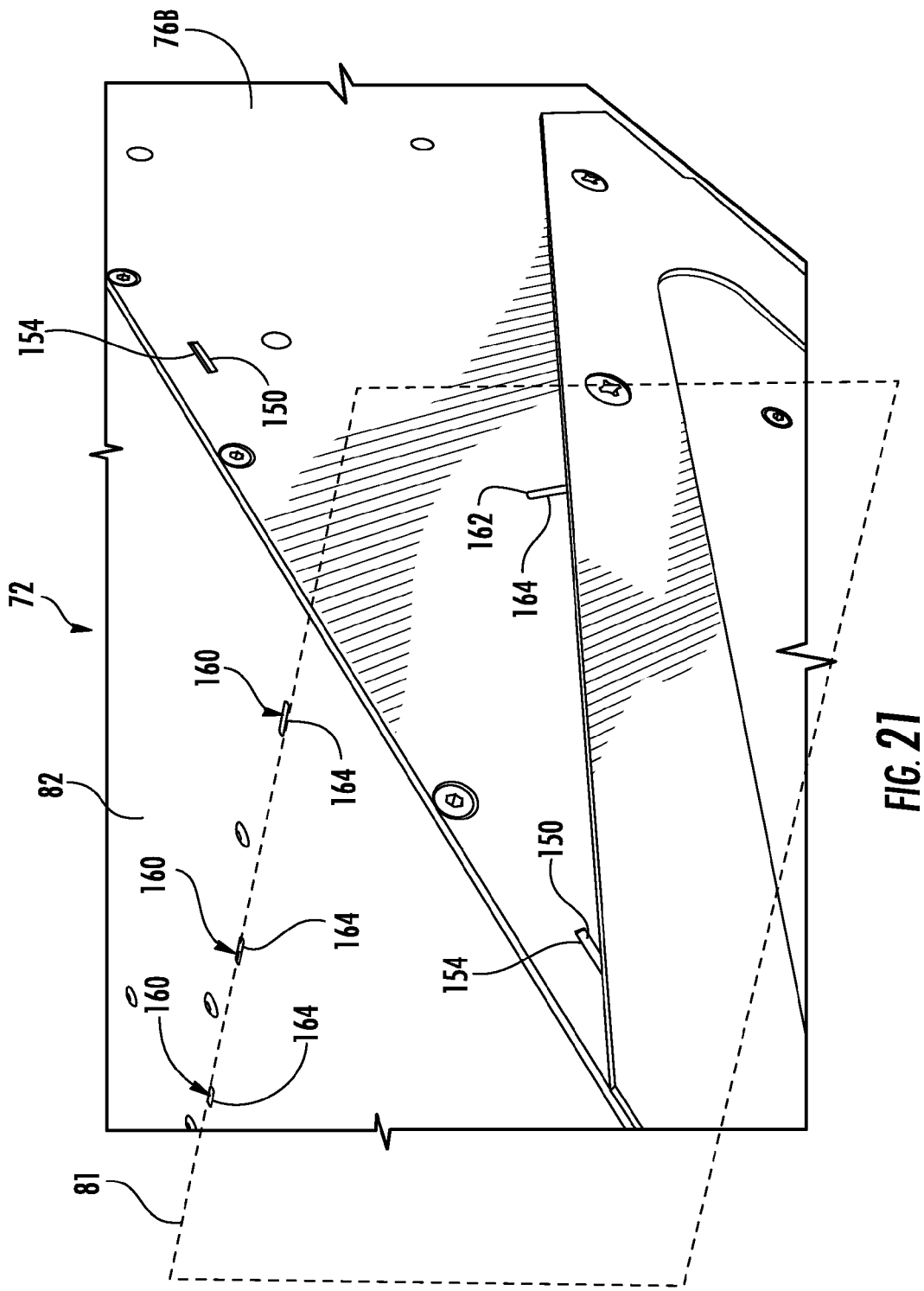
FIG. 21 illustrates a close-up view of locating tabs disposed in the top plate of the enclosure of FIG. 3 engaged with alignment slots disposed in the side plate of the enclosure of FIG. 3.

FIG. 21 also illustrates alignment features provided in the midplane support 100 that are configured to align the midplane support 100 with the enclosure 72. As illustrated in FIG. 21, the top plate 82 includes integral alignment slots 160 in the datum plane 81 when the top plate 82 is secured to the side plate 76B. The side plate 76B also includes alignment slots 162 integrally disposed along the datum plane 81 when the side plate 76B is secured to the top plate 82. The midplane support 100 includes locating tabs 164 that are disposed through the alignment slots 160, 162 when the midplane support 100 is properly aligned with the enclosure 72 and the top plate 82 and side plate 76B (see also, FIG. 7). In this manner, as previously described, when the midplane interface card 58 is properly aligned with the installed midplane support 100, the midplane interface card 58 is properly aligned with the enclosure 72 and thus any HEU 14 components installed in the enclosure 72. Alignment slots 166 similar to alignment slots 160 are also integrally disposed in the bottom plate 74, as illustrated in FIG. 19B. These alignment slots 166 are also configured to receive locating tabs 168 in the midplane support 100, as illustrated in FIG. 19B, to align the midplane support 100.

Further, as illustrated in FIGS. 19A and 19B, the enclosure 72 is also configured to receive and support removable mounting brackets 170A, 170B to secure the enclosure 72 to an equipment rack. As illustrated therein, the mounting brackets 170A, 170B include folded down components that form tabs 172A, 172B. The side plate 76A, 76B include integral alignment slots 174, 176, respectively, that are configured to receive the tabs 172A, 172B. To secure the tabs 172A, 172B to the enclosure 72, fasteners 178A, 178B are disposed through openings 179A, 179B in the tabs 172A, 172B, respectively, and secure to the top plate 82 and bottom plate 74.

Figure 22:
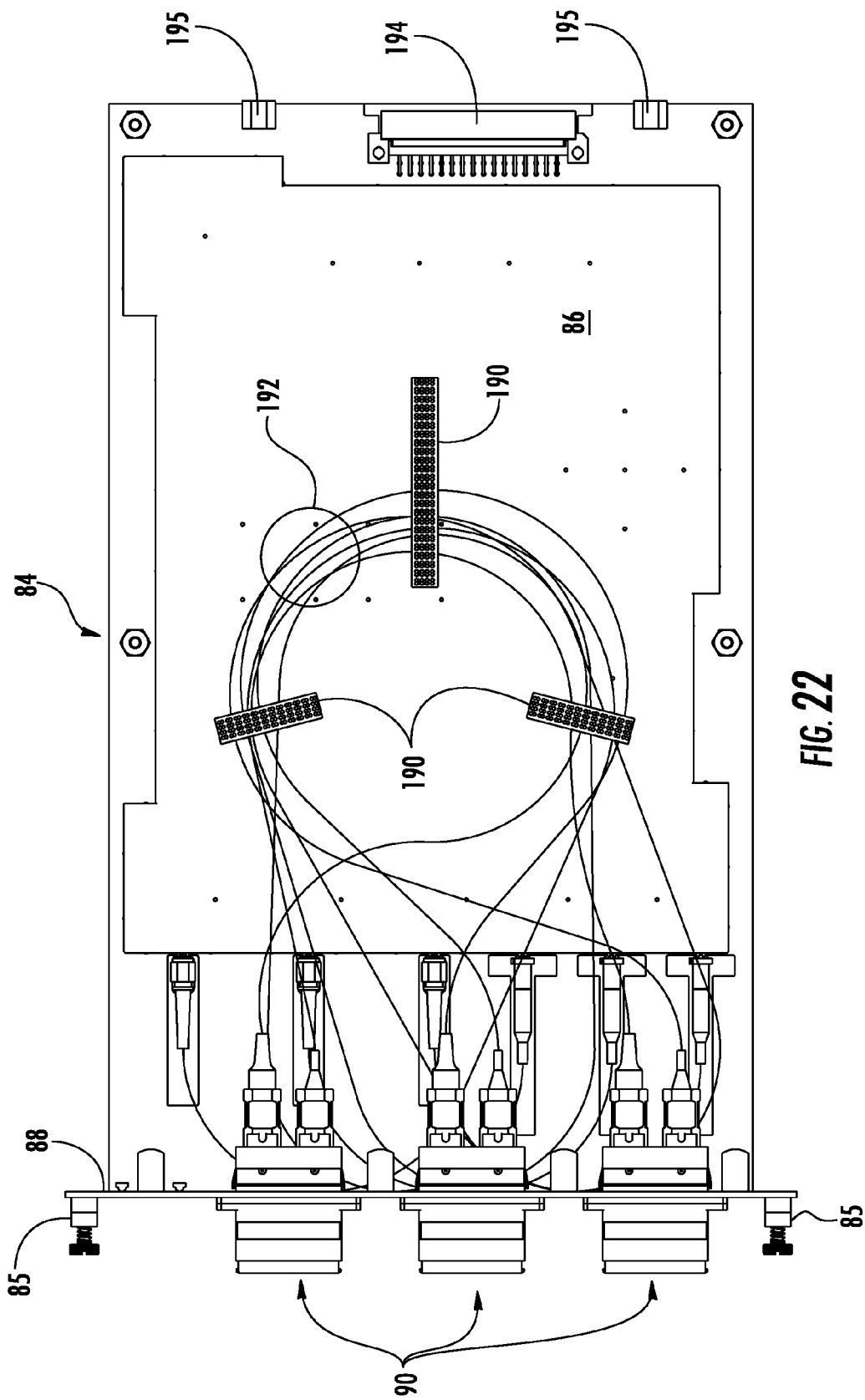
FIG. 22 is a side view of the OIM that can be disposed in the enclosure of FIG. 3.

Other features are provided to support alignment of components of the HEU 14 and to support proper connection of these components to the midplane interface card 58. For example, one of these components is the OIM 84, as previously discussed. The OIM 84 is illustrated in FIG. 22, wherein fiber routing guides 190 can be disposed on the outside of the PCB 86 of the OIC 60 to assist in routing optical fibers 192 from connector adapters 90 that are configured to connect to optical fibers connected to the RAUs 20 (see FIG. 2). The optical fibers 192 are connected to the electronic components of the OIC 60 to convert the received optical signals from the RAUs 20 into electrical signals to be communicated to the uplink BIC 56 via connector 194 and RF connectors 195 that are connected to the midplane interface card 58 when the OIM 84 is inserted into the enclosure 72, as previously discussed.

Figure 23:
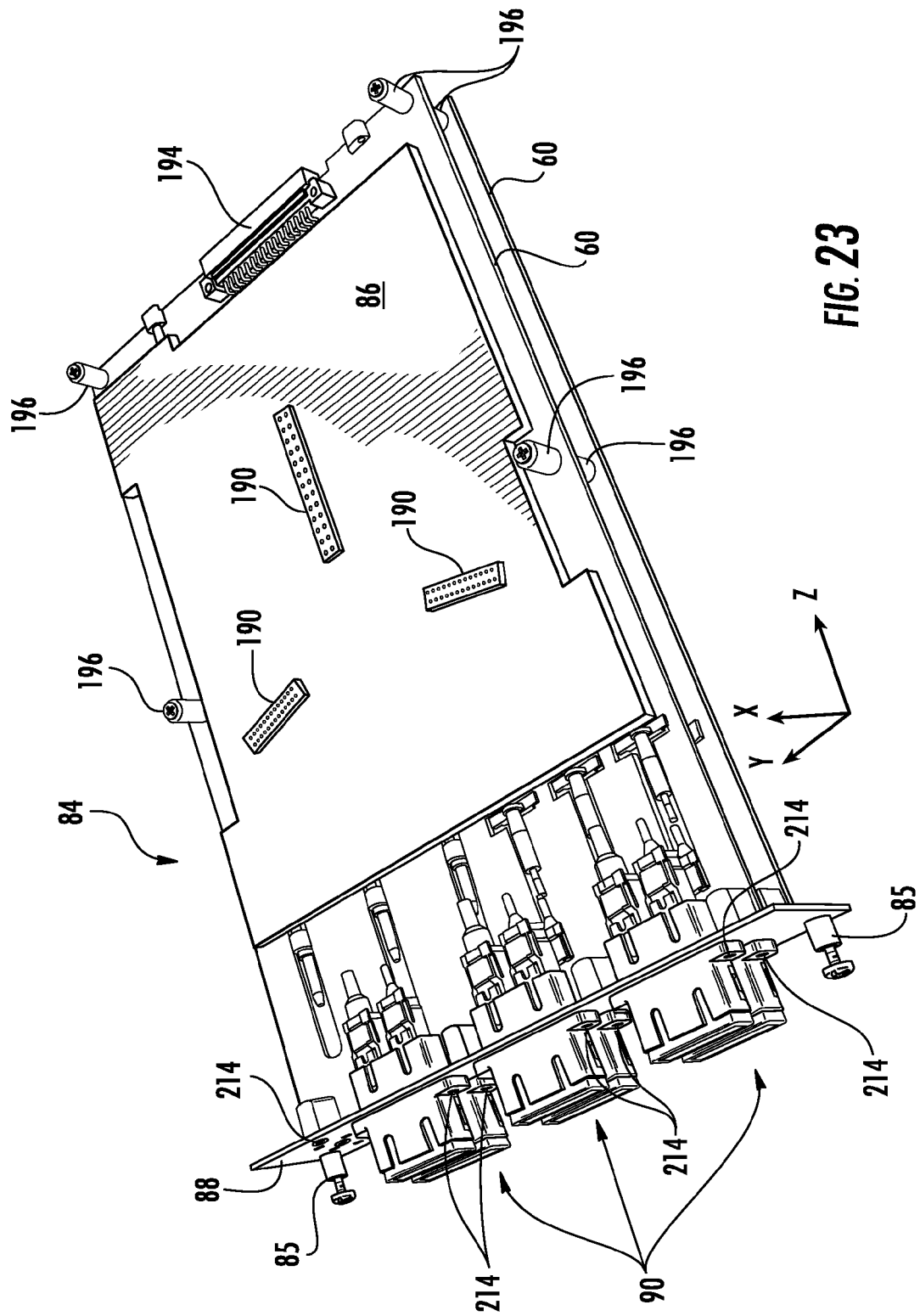
FIG. 23 is another perspective side view of the OIM that can be disposed in the enclosure of FIG. 3.

As previously discussed, the OIM 84 includes two OICs 60 connected to the OIM plate 88 to be disposed in channels 91A, 91B in the enclosure 72. Also, by providing two OICs 60 per OIM 84, it is important that the connectors 194 are properly aligned and spaced to be compatible with the alignment and spacing of the complementary connectors 94B in the midplane interface card 58 (see FIG. 5). Otherwise, the OICs 60 may not be able to be properly connected to the midplane interface card 58. For example, if the PCBs 86 of the OICs 60 are not both secured in proper alignment to the OIM plate 88, as illustrated in FIG. 23, one or both OICs 60 may not be aligned properly in the Z direction.

Figure 24:
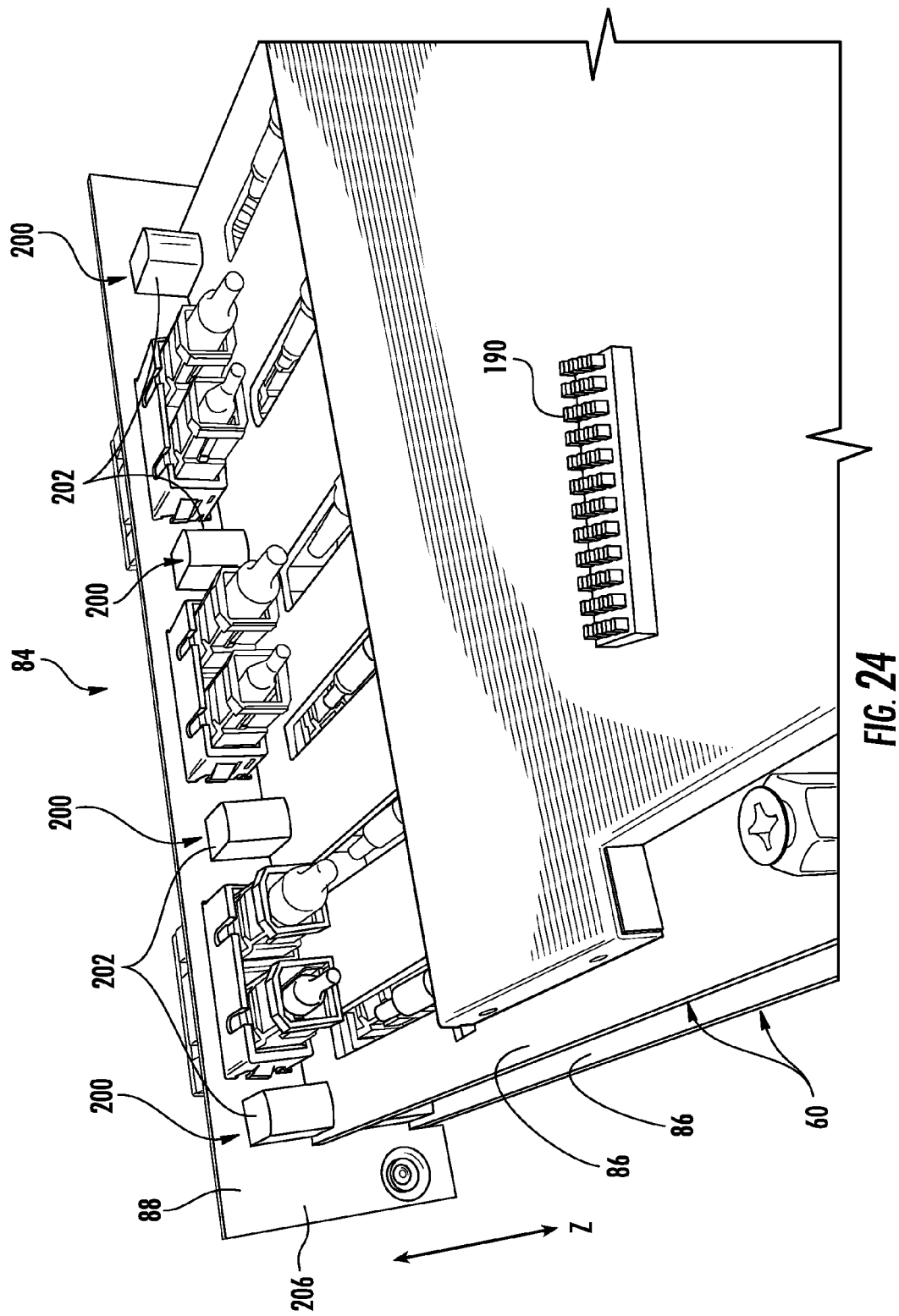
FIG. 24 is a rear perspective view of the OIM that can be disposed in the enclosure of FIG. 3.
Figure 25:
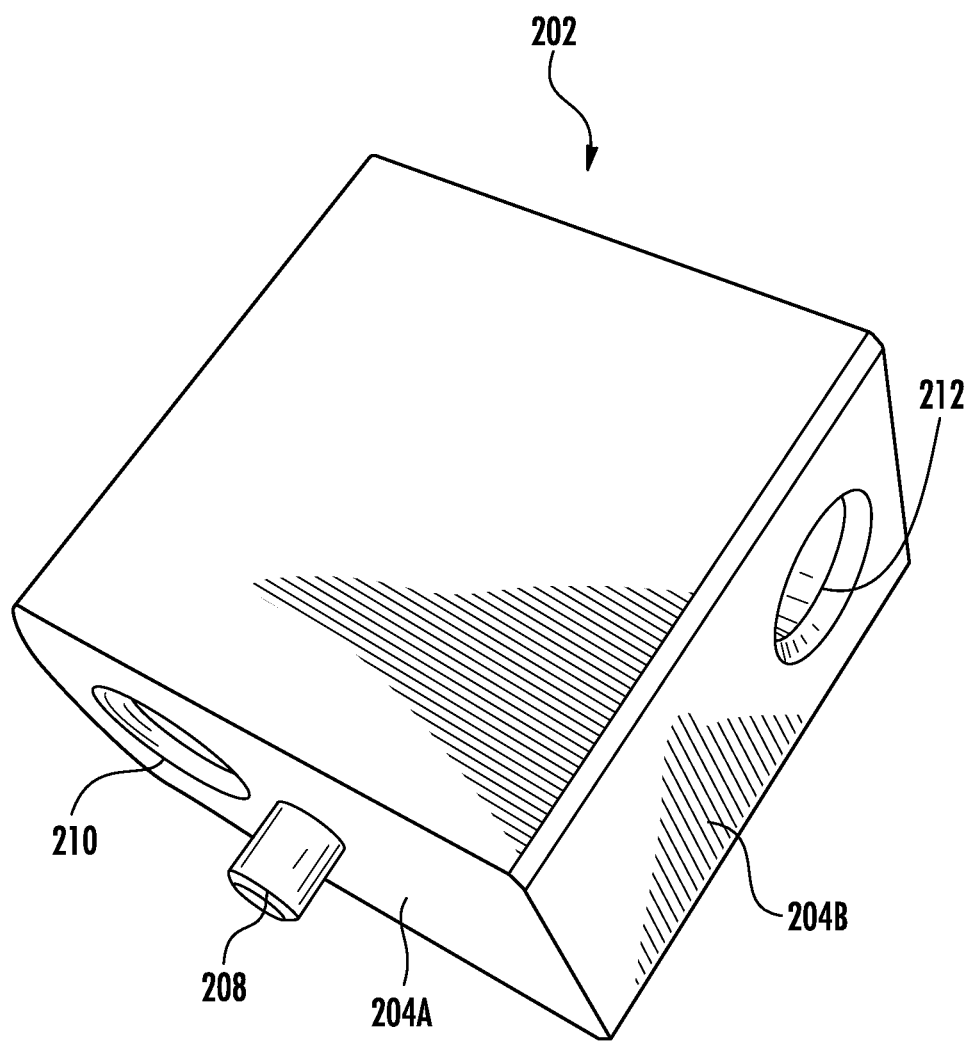
FIG. 25 is a perspective view of an alignment block that secures the OIC to an OIM plate of the OIM of FIGS. 23 and 24.

In this regard, FIG. 24 illustrates an alignment feature 200 to ensure that the PCBs 86 of the OICs 60 are properly secured and aligned with regard to the OIM plate 88 in the Z direction. As illustrated in FIG. 24 and more particularly in FIG. 25, an alignment block 202 is provided. As illustrated in FIG. 25, the alignment block 202 includes two alignment surfaces 204A, 204B. As illustrated in FIGS. 24 and 25, alignment surface 204A is configured to be disposed against the surface of the PCB 86. Alignment surface 204B is configured to be disposed against a rear surface 206 of the OIM plate 88, as also illustrated in FIG. 24. As illustrated in FIG. 25, guide pin 208 extends from the alignment surface 204A that is configured to be disposed in an opening in the PCB 86 of the OICs 60. An opening 210 disposed in the alignment surface 204A is configured to align with an opening disposed in the PCB 86 wherein a fastener can be disposed therein and engaged with the opening 210 to secure the PCB 86 to the alignment block 202. To align the alignment block 202 to the PCB 86, the guide pin 208 is aligned with an opening in the PCB 86 and inserted therein when aligned.

The alignment surface 204B also contains an opening 212 that is configured to receive a fastener 214 (FIG. 23) disposed through the OIM plate 88 and engage with the opening 212. Some of the fasteners 214 may be configured to also be disposed through openings in the connector adapters 90, as illustrated in FIG. 23, to secure both the connector adapters 90 to the OIM plate 88 and the OIM plate 88 to the OICs 60. In this manner, the OIM plate 88 is secured to the alignment block 202, and the alignment block 202 is aligned and secured to the PCB 86. Thus, the OIM plate 88 is aligned with the PCB 86 of the OIC 60 in the Z direction.

Further, when tolerances are tight, it may be difficult to ensure proper mating of all connectors 194, 94B between the OICs 60 and the midplane interface card 58. For example, as illustrated in FIG. 23, if the spacing between standoffs 196 securing and spacing apart the PCBs 86 of the OICs 60 is not the same as the spacing between connectors 94B in the midplane interface card 58, alignment of the OICs 60 in the X, Y, or Z directions may not be proper, and thus only one or neither OIC 60 may be able to be connected to the midplane interface card 58 and/or without damaging the midplane interface card 58 and/or its connectors 94B.

Figure 26A:
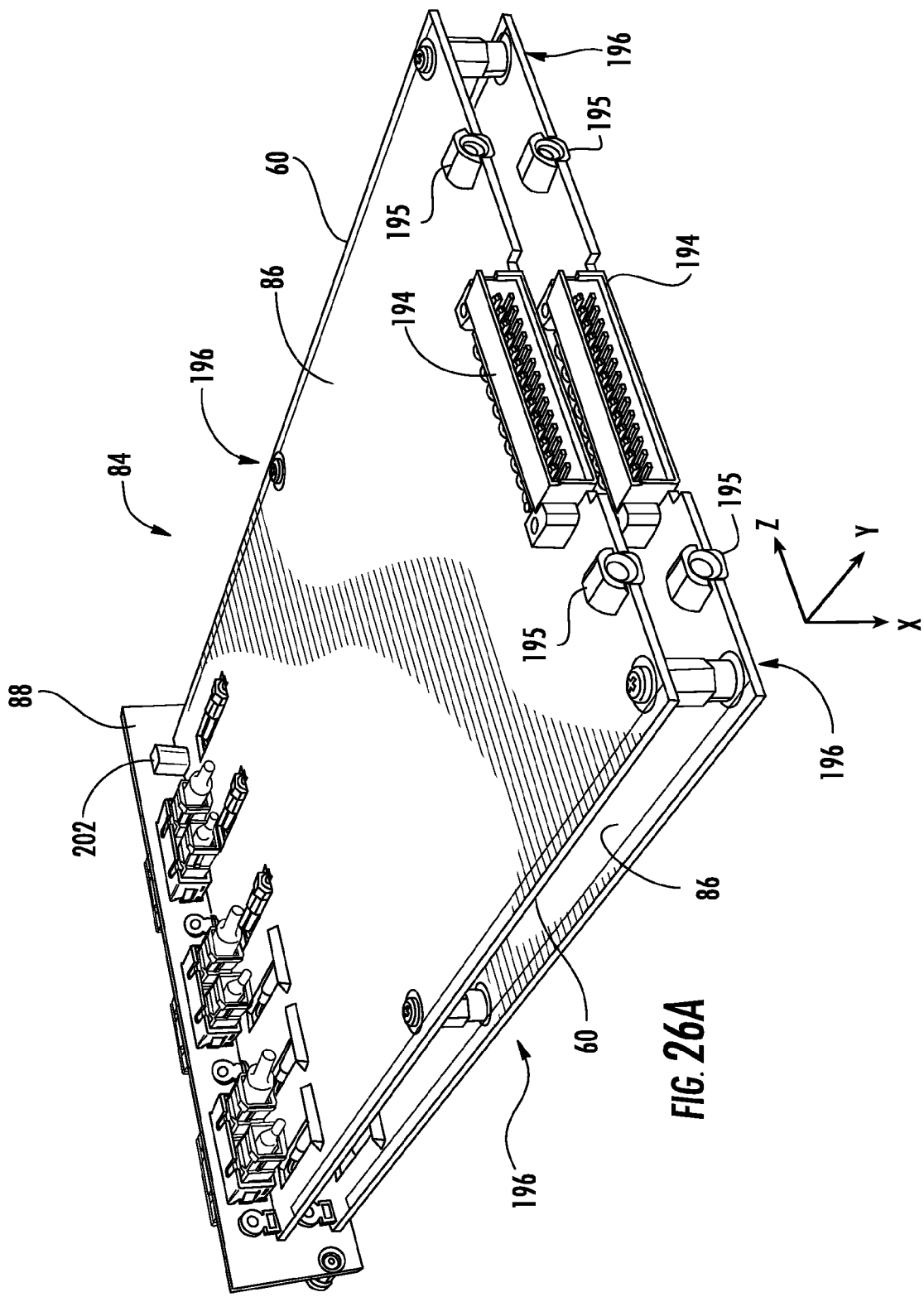
FIG. 26A is a rear perspective view the OIM of FIGS. 23 and 24 without shields installed.

In this regard, FIG. 26A illustrates a rear perspective view of the OIM 84 of FIGS. 23 and 24 with standoffs 196 provided between the two PCBs 86 of the OICs 60 that allow one PCB 86 to float with regard to the other PCB 86. FIG. 26B illustrates a rear perspective view of the OIM 84 of FIG. 26A within optional shield plates 95A, 95B installed to the PCBs 86 and to the OIM plate 88 to provide mechanical, RF, and other electromagnetic interference shielding. In this regard, tolerances are eased when the OICs 60 are secured to the OIM plate 88 to allow one connector 194 of an OIC 60 to move or float slightly in the X, Y, or Z directions with regard to the other OIC 60, as illustrated in FIGS. 26A and 26B. FIG. 27 illustrates a close-up view of one standoff 196 between two PCBs 86A, 86B of the OICs 60. As will be described in more detail below, the standoff 196 is allowed to float about the top PCB 86A to allow the positioning or orientation of the top PCB 86A to move slightly in the X, Y, or Z directions with regard to the bottom PCB 86B.

Figure 28:
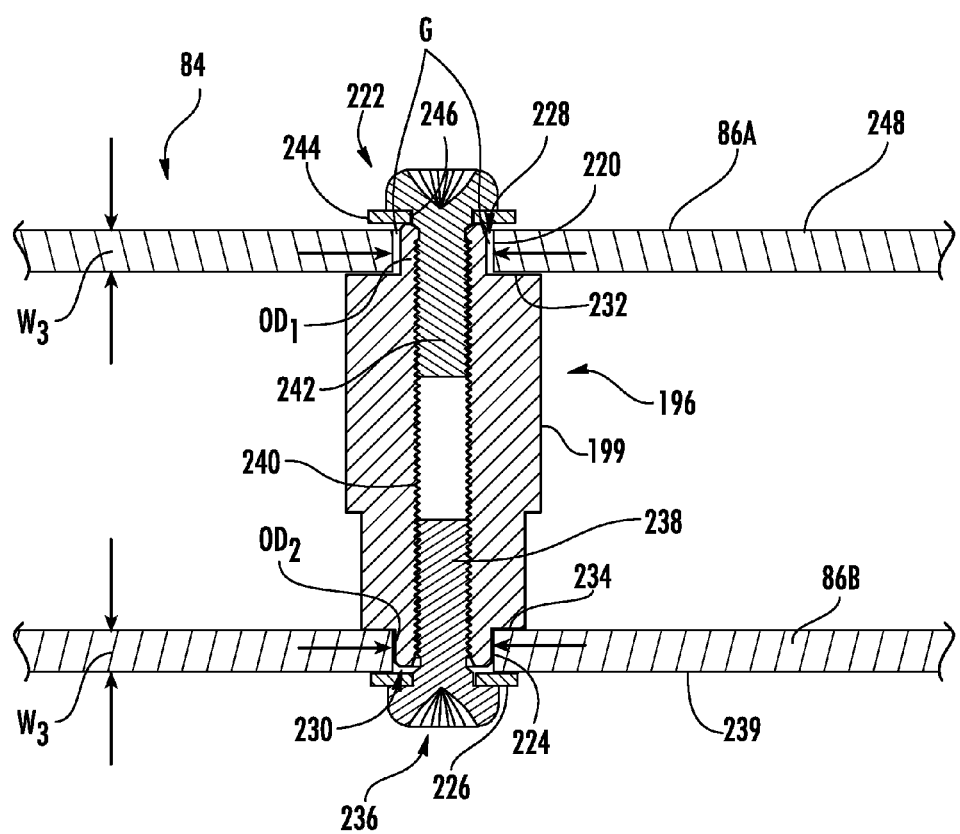
FIG. 28 is a cross-sectional side view of the PCBs of the OICs secured to each other via the standoffs of FIG. 27 to provide one of the OIC PCBs as a floating PCB and the other of the OIC PCBs as a fixed PCB.
Figure 29A:
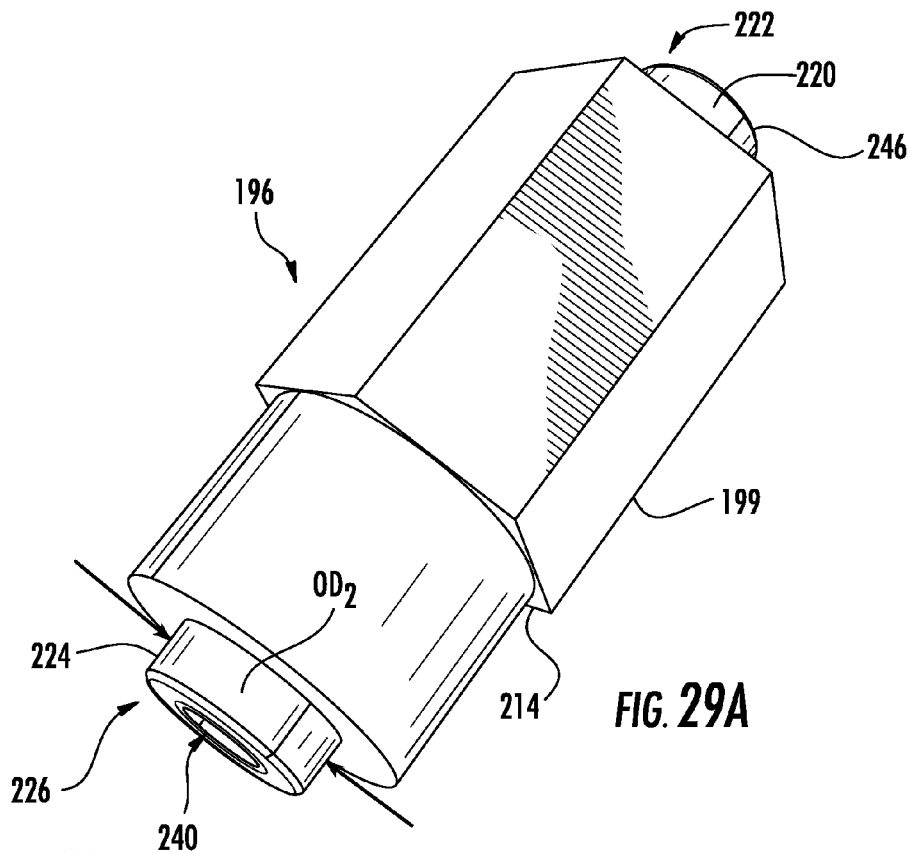
FIGS. 29A and 29B are perspective views of the floating standoffs in FIG. 27.
Figure 29B:
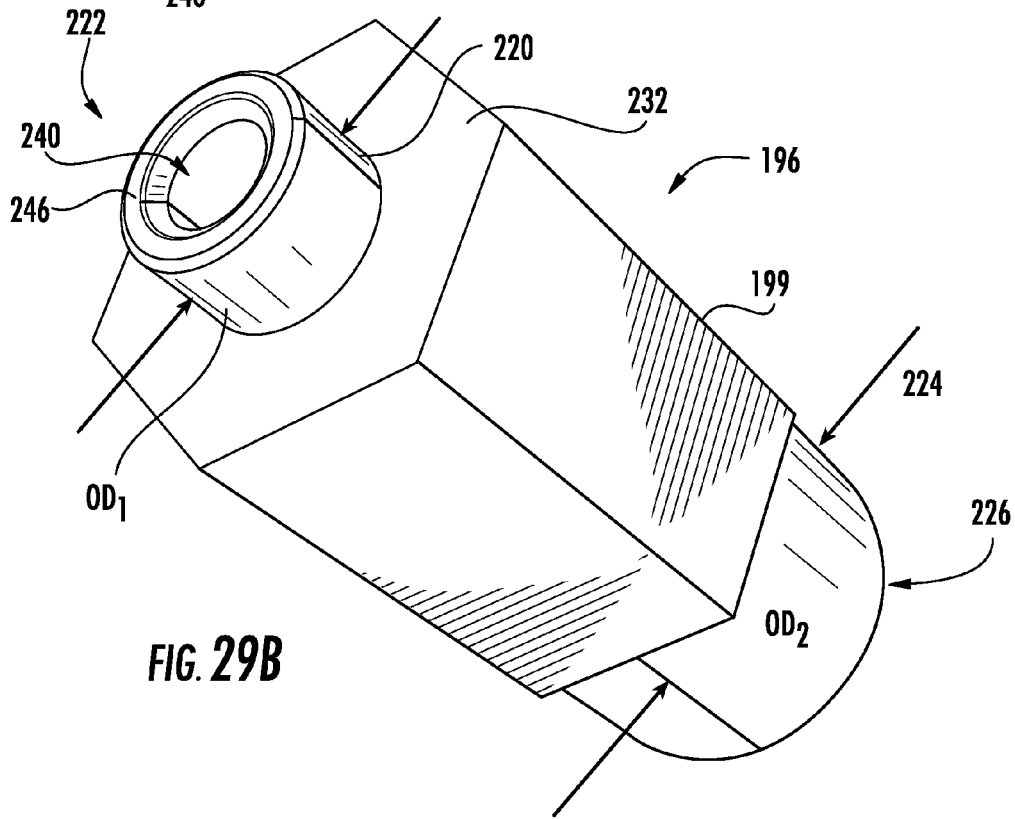
Figure 29C:
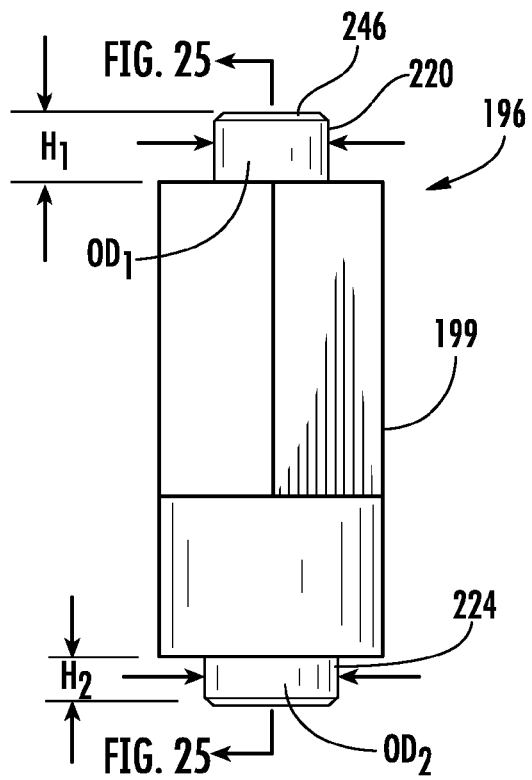
FIGS. 29C and 29D are side and top views, respectively, of the standoffs of FIG. 31.
Figure 30:
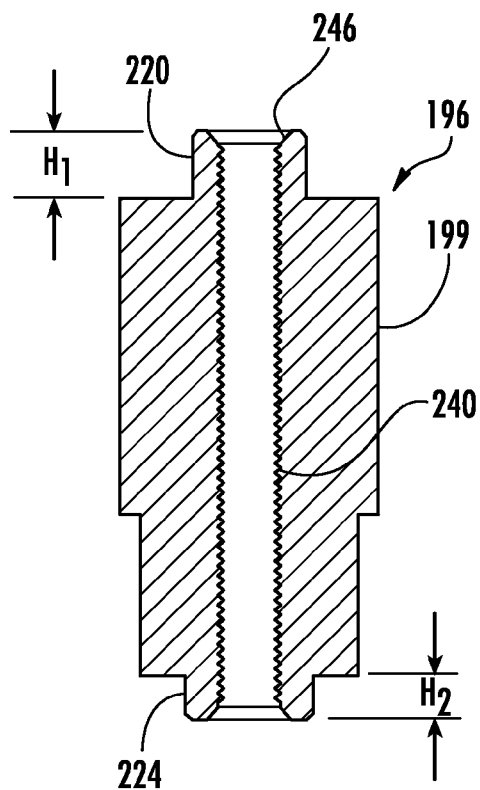
FIG. 30 is a side cross-sectional view of the standoff of FIG. 27.
Figure 29D:
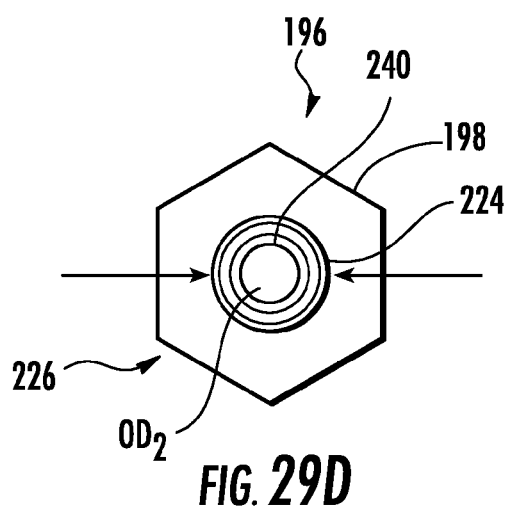

FIG. 28 is a side cross-sectional view of the top and bottom PCBs 86A, 86B of the OIM 84 mounted to each other with the standoff 196, as illustrated in FIGS. 26A and 26B and 28, to further illustrate the floating top PCB 86A. In this regard, the standoff 196 is comprised of a body 199. The body 199 of the standoff 196 is also illustrated in the perspective, side and top view of the standoff in FIGS. 29A-29C, respectively. The body 199 includes a first collar 220 at a first end 222 of the body 199 of an outer diameter $OD_1$ than is smaller than an outer diameter $OD_2$ of a second collar 224 located at a second end 226 of the body 199, as illustrated in FIG. 28-30. The first and second collars 220, 224 are configured to be received within openings 228, 230 of the top and bottom PCBs 86A, 86B, as illustrated in FIG. 28. The first end 222 and second end 226 of the body 199 contains shoulders 232, 234 that limit the amount of disposition of the first and second collars 220, 224 through the openings 228, 230 in the top and bottom PCBs 86A, 86B.

As illustrated in FIG. 28, the second collar 224 is designed so that the outer diameter $OD_2$ includes a tight tolerance with the inner diameter of the opening 230. In this manner, the second collar 224 will not float within the opening 230. Further, a height $H_2$ of the second collar 224 (see FIG. 29C) is less than a width $W_3$ of the PCB 86A and opening 230 disposed therein, as illustrated in FIG. 28. This allows a head 236 of a fastener 238 to be secured directly onto the outer surface 239 of the bottom PCB 86B when disposed through a threaded shaft 240 of the body 199 to firmly secure the standoff 196 to the bottom PCB 86B. Because of the outer diameter $OD_2$ and height $H_2$ provided for the second collar 224 of the standoff 196, the bottom PCB 86B does not float.

However, to allow the top PCB 86A to float, the outer diameter $OD_1$ and height $H_1$ of the first collar 220 is different from that of the second collar 224. In this regard, as illustrated in FIGS. 28-29C and 30, the outer diameter $OD_1$ of the first collar 220 is smaller than the inner diameter of the opening 228. A gap G is formed therebetween to allow the first collar 220 to move slightly with respect to the opening 228 when disposed therein. Further, the height $H_1$ of the first collar 220 is taller than the width $W_1$ of the top PCB 86A, as illustrated in FIG. 28. Thus when a fastener 242 is disposed within the threaded shaft 240 and tightened, a head 244 of the fastener 242 will rest against a top surface 246 of the first collar 220. Because the first collar 220 extends in a plane about a top surface 248 of the top PCB 86A, the head 244 of the fastener 242 does not contact the top surface 248 of the PCB 86A. Thus, when the fastener 242 is tightened, a friction fit is not provided between the head 244 and the top surface 248 of the PCB 86A, allowing the top PCB 86A to float with respect to the standoff 196 and the bottom PCB 86B.

FIG. 31 illustrates an alternative standoff 196' that is the same as the standoff 196, but the thread shaft does not extend all the way through the body 199' like the standoff 196 in FIG. 30. Instead, the thread shafts 240A', 240B' are separated. The standoff 196' can still be employed to provide the floating PCB 86 features discussed above. Also note that the standoffs 196, 196' configured to allow a PCB to float can also be provided for the standoffs 196, 196' provided to install any other components of the HEU 14, including but not limited to the downlink BIC 54 and the uplink BIC 56. Further, the design of the bodies 199, 199' may include a hexagonal outer surface over the entire length of the bodies 199, 199'.

FIGS. 32A and 32B are side cross-sectional views of an alternative standoff 250 that can be employed to secure the OIC PCBs 86 and provide one of the OIC PCBs 86 as a floating PCB. The alternative standoff 250 may be employed to secure the OIC PCBs 86 when the shield plates 95A, 95B are installed, as illustrated in FIG. 26B. In this regard, one standoff 252 is configured to be disposed within another standoff 254. The first standoff 252 contains a thread shaft 256 that is configured to receive a fastener to secure a shield plate 95 to the standoff 252 and the OIM 84. The standoff 252 contains a threaded member 255 that is configured to be secured to a threaded shaft 257 disposed in the standoff 254. The standoff 254 contains a collar 258 similar to the collar 220, as described above in FIGS. 28-29B, that surrounds the threaded shaft 257 and is configured to be received inside an opening of an OIC PCB 86 having a greater inner diameter than the outer diameter $OD_3$ of the collar 258. This allows an OIC PCB 86 disposed on the collar 258 to float with respect to another OIC PCB 86 secured to a thread shaft 260 of the standoff 254. The standoff 254 has a collar 262 having an outer diameter $OD_4$ that is configured to be received in an opening in an OIC PCB 86 that does not allow float.

Another alignment feature provided by the embodiments disclosed herein is alignment assistance provided by the digital connectors disposed in the midplane interface card 58 that accept digital connections from the OICs 60, the downlink BIC 54, and the uplink BIC 56. As previously discussed and illustrated, digital connectors, including connectors 94B, disposed in the midplane interface card 58 receive complementary digital connectors 194 from the OICs 60, the downlink BIC 54, and the uplink BIC 56 when inserted into the enclosure 72. The OICs 60, the downlink BIC 54, and the uplink BIC 56 are designed such that their digital connections are first made to corresponding digital connectors disposed in the midplane interface card 58 when inserted into the enclosure 72 before their RF connections are made to RF connectors disposed on the midplane interface card 58. In this manner, these digital connections assist in aligning the OICs 60, the downlink BIC 54, and the uplink BIC 56 in the X and Y directions with regard to the midplane interface card 58.

Figure 33:
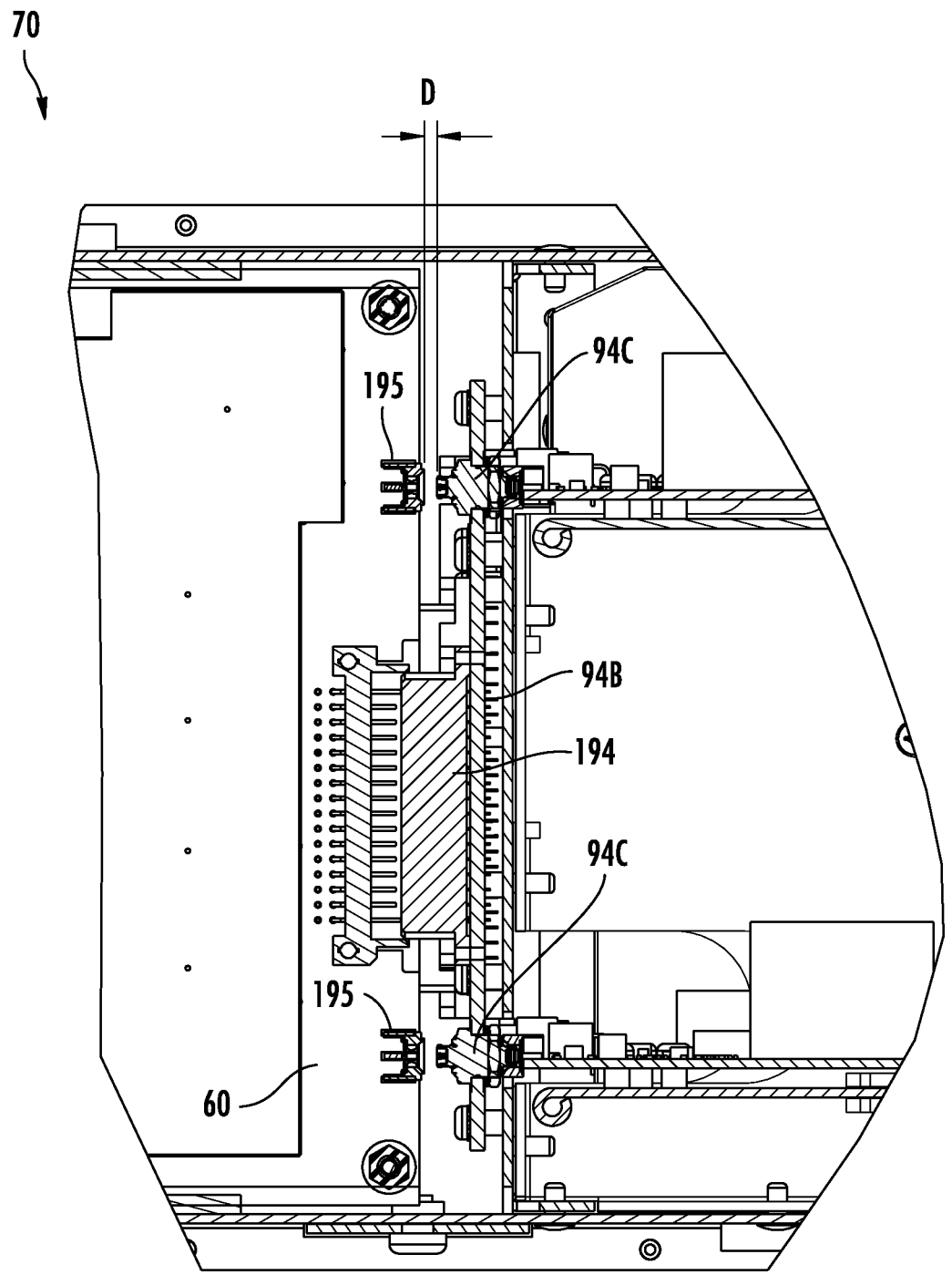
FIG. 33 is a side view of the assembly of FIG. 3 showing an OIC digital connector being connected to a complementary connector disposed in the midplane interface card to align the OIC RF connector to be connected to the complementary RF connector disposed in the midplane interface card.

In this regard, FIG. 33 illustrates a side view of the assembly 70 showing a digital connector 194 from an OIC 60 being connected to a complementary connector 94B disposed in the midplane interface card 58. As illustrated therein, the digital connector 194 disposed in the OIC 60 is designed such that the digital connector 194 makes a connection with the complementary connector 94B in the midplane interface card 58 before an RF connector 195 disposed in the OIC 60 makes a connection with the complementary RF connector 94C disposed in the midplane interface card 58. In this regard, when the digital connector 194 begins to connect with the complementary connector 94B, the digital connector 194 aligns with the complementary connector 94B. The end of the RF connector 195 in the OIC 60 is still a distance D away from the complementary RF connector 94C. In one non-limiting embodiment, the distance D may be 0.084 inches. Because the digital connectors 194 on the OICs 60 are in a fixed relationship to the RF connectors 195 provided therein in this embodiment, alignment of the digital connectors 194 also provides alignment of the RF connectors 195 of the OICs 60 to the complementary RF connectors 94C disposed in the midplane interface card 58 as well. Thus, as the digital connector 194 is fully inserted in the complementary connector 94B, the RF connector 195 will be aligned with the complementary RF connector 94C when disposed therein. Alignment of the RF connector 195 may be important to ensure efficient transfer of RF signals. This feature may also be beneficial if the RF connections require greater precision in alignment than the digital connections. The same alignment feature can be provided for the downlink BIC 54 and uplink BIC 56.

As previously discussed and illustrated in FIG. 4, the OIM plate 88 provides support for the connectors 90 and for attaching the OICs 60 to the OIM plate 88 to provide alignment of the OICs 60 when inserted into the enclosure 72. An OIM plate 88 is provided to assist in coupling a pair of OICs 60 together to form the OIM 84. The OIM plate 88 serves to support the OICs 60 and contributes to the alignment the OICs 60 for proper insertion into and attachment to the enclosure 72, which in turn assists in providing a proper and aligned connection of the OICs 60 to the midplane interface card 58. In this regard, as illustrated in FIG. 34, one feature that can be provided in the OIM 84 to allow the OIM plate 88 to be provided in embodiments disclosed herein is to provide an OIC PCB 86 that extends beyond receiver optical sub-assemblies (ROSAs) and transmitter optical sub-assemblies (TOSAs) provided in the OIC 60.

Figure 34:
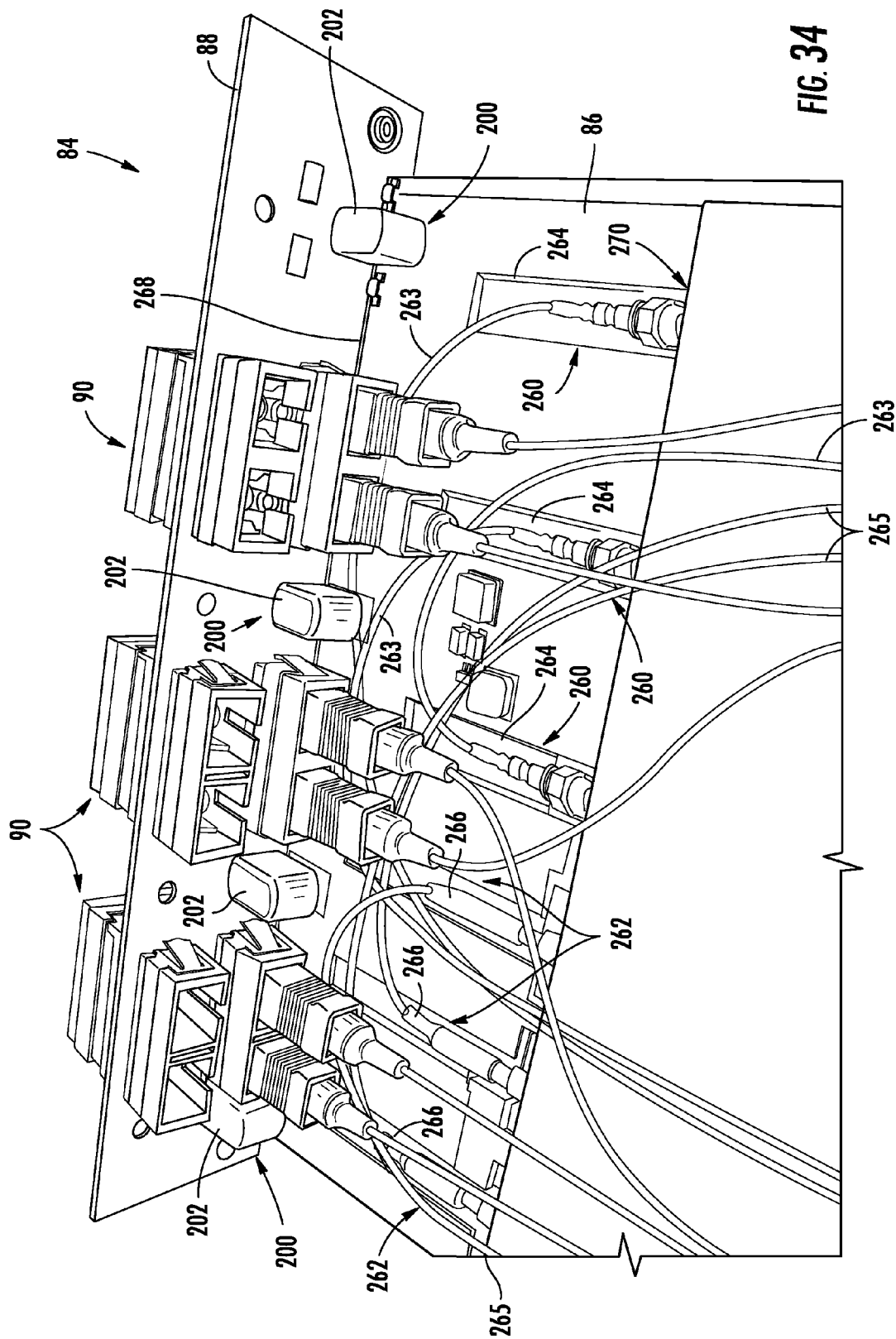
FIG. 34 is a top perspective view of an OIC disposed in the OIM of FIGS. 26A and 26B illustrating the extension of the OIC PCB of beyond transmitter optical sub-assemblies (TOSAs) and receiver optical sub-assemblies (ROSAs) disposed in the OIC PCB.

As illustrated in FIG. 34, a top perspective view of the OIM 84 is provided illustrating the extension of OIC PCBs 86 beyond transmitter optical sub-assemblies (TOSAs) 262 and receiver optical sub-assemblies (ROSAs) 260. The TOSAs 262 and ROSAs 260 are connected via optical fibers 263, 265 to the connectors 90 that extend through the OIM plate 88 to allow connections to be made thereto. By extending the OIC PCBs beyond the TOSAs 262 and ROSAs 260, the OIM plate 88 can be secured to the OIC PCBs 86 without interfering with the TOSAs 262 and ROSAs 260. In this embodiment, the TOSAs 262 and ROSAs 260 are mounted or positioned on an end of a PCB to transmit and/or receive optical signals interfaced with electrical signal components disposed in the OIC PCB 86. Mounting or positioning of TOSAs 262 and ROSAs 260 on the end of a PCB may limit the length of exposed, unshielded wire extensions between the TOSAs 262 and ROSAs 260 and printed traces on the PCB. This provides for signal integrity of the signals after conversion to electrical signals.

Thus, a sufficient space is provided to allow for the TOSAs 262 and ROSAs 260 to extend beyond an end of a PCB. In this regard, openings 264, 266 are disposed in the OIC PCB 86 in this embodiment. The openings 264, 266 allow the TOSAs 262 and ROSAs 260 to be disposed in the OIC PCB 86 without the TOSAs 262 and ROSAs 260 extending beyond an end 268 of the OIC PCB 86 where the OIM plate 84 is disposed. Thus, the openings 264, 266 allow the TOSAs 262 and ROSAs 260 to be disposed at an end 270 of the PCB where the openings 264, 266 start, but not at the end 268 of the OIC PCB 86 where the OIM plate 88 is located. In this manner, space is provided for the TOSAs 262 and ROSAs 260 such that they do not interfere with or prevent the OIM plate 88 from being disposed at the end 268 of the OIC PCB 86.

Figure 35:
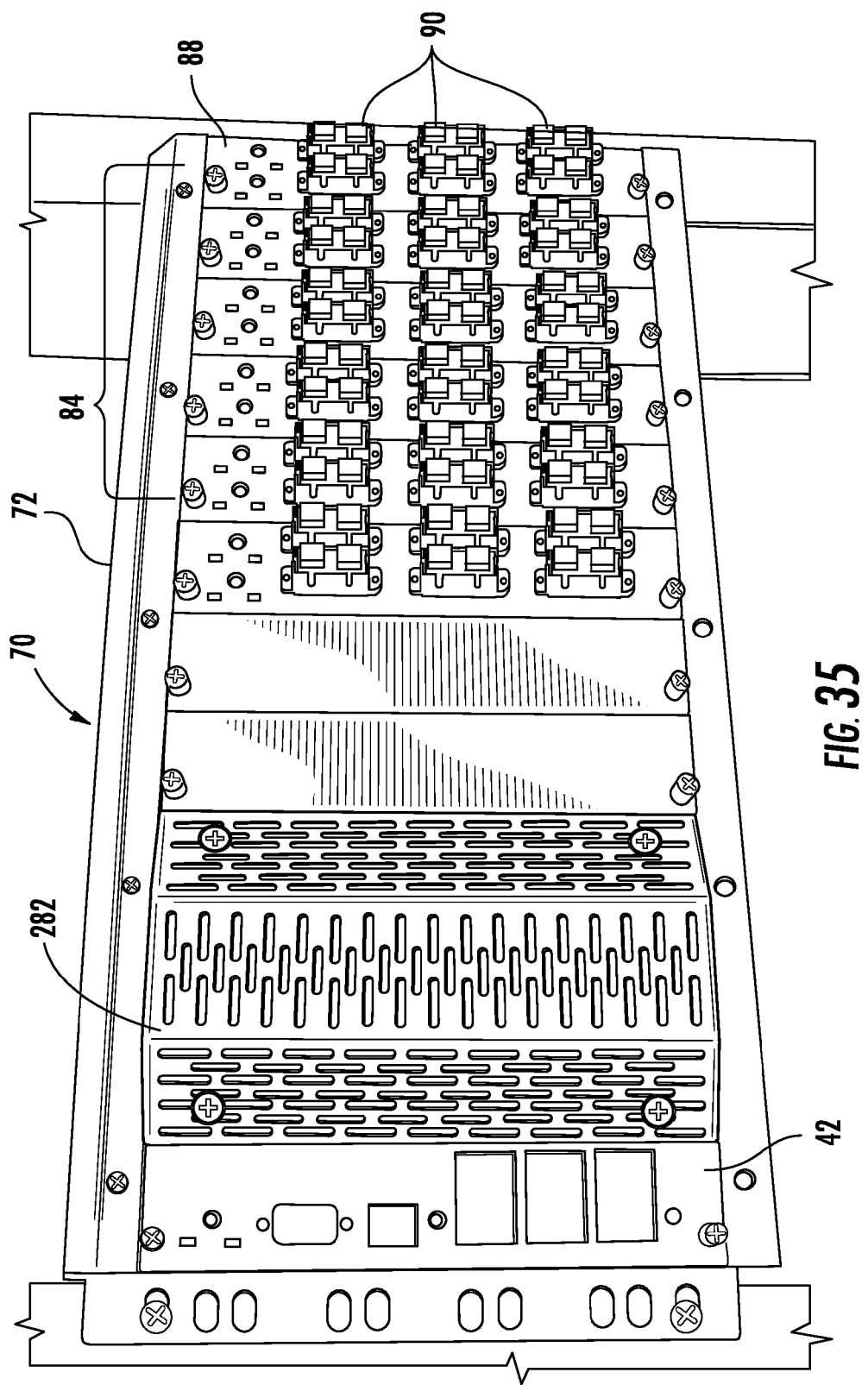
FIG. 35 is a front perspective view of the assembly and enclosure of FIG. 3 with a cooling fan protector plate installed to protect a cooling fan installed in the enclosure.
Figure 36:
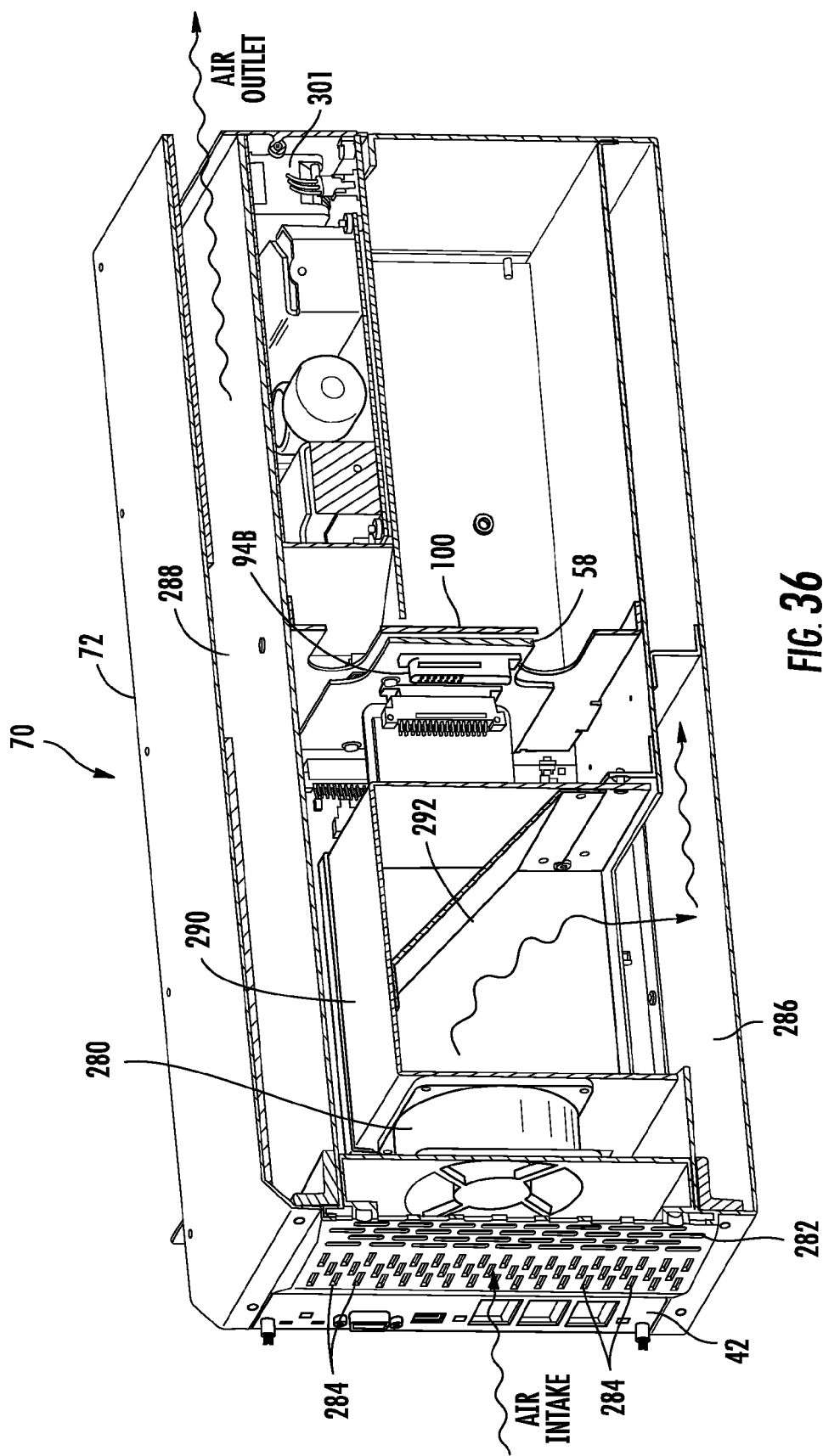
FIG. 36 is a side cross-sectional view of the enclosure of FIG. 35 illustrating a cooling fan duct disposed behind the cooling fan in the enclosure to direct air drawn into the enclosure by the cooling fan into a lower plenum of the enclosure.

It may also be desired to provide a cooling system for the assembly 70. The components installed in the assembly 70, including the downlink BIC 54, the uplink BIC 56, the HEC 42, and the OICs 60 generate heat. Performance of these components may be affected if the temperature due to the generated heat from the components is not kept below a threshold temperature. In this regard, FIGS. 35 and 36 illustrate the assembly 70 and enclosure 72 of FIG. 3 with an optional cooling fan 280 installed therein to provide cooling of components installed in the enclosure 72. View of the cooling fan 280 is obscured by a cooling fan protector plate 282 in front perspective view of the assembly 70 in FIG. 35; however, FIG. 36 illustrates a side cross-sectional view of the assembly 70 and enclosure 72 showing the cooling fan 280 installed in the enclosure 72 behind the cooling fan protector plate 282 attached to the enclosure 72. In this embodiment, cooling is provided by the cooling fan 280 taking air into the enclosure 72 through openings 284 disposed in the cooling fan protector plate 282 and drawing the air across the components in the enclosure 72, as will be described in more detail below. The air may be pushed through the rear of the enclosure 72 through an air outlet, as illustrated in FIG. 36. For example, the cooling fan 280 may be rated to direct air at a flow rate of sixty (60) cubic feet per minute (CFM) or any other rating desired.

Figure 37:
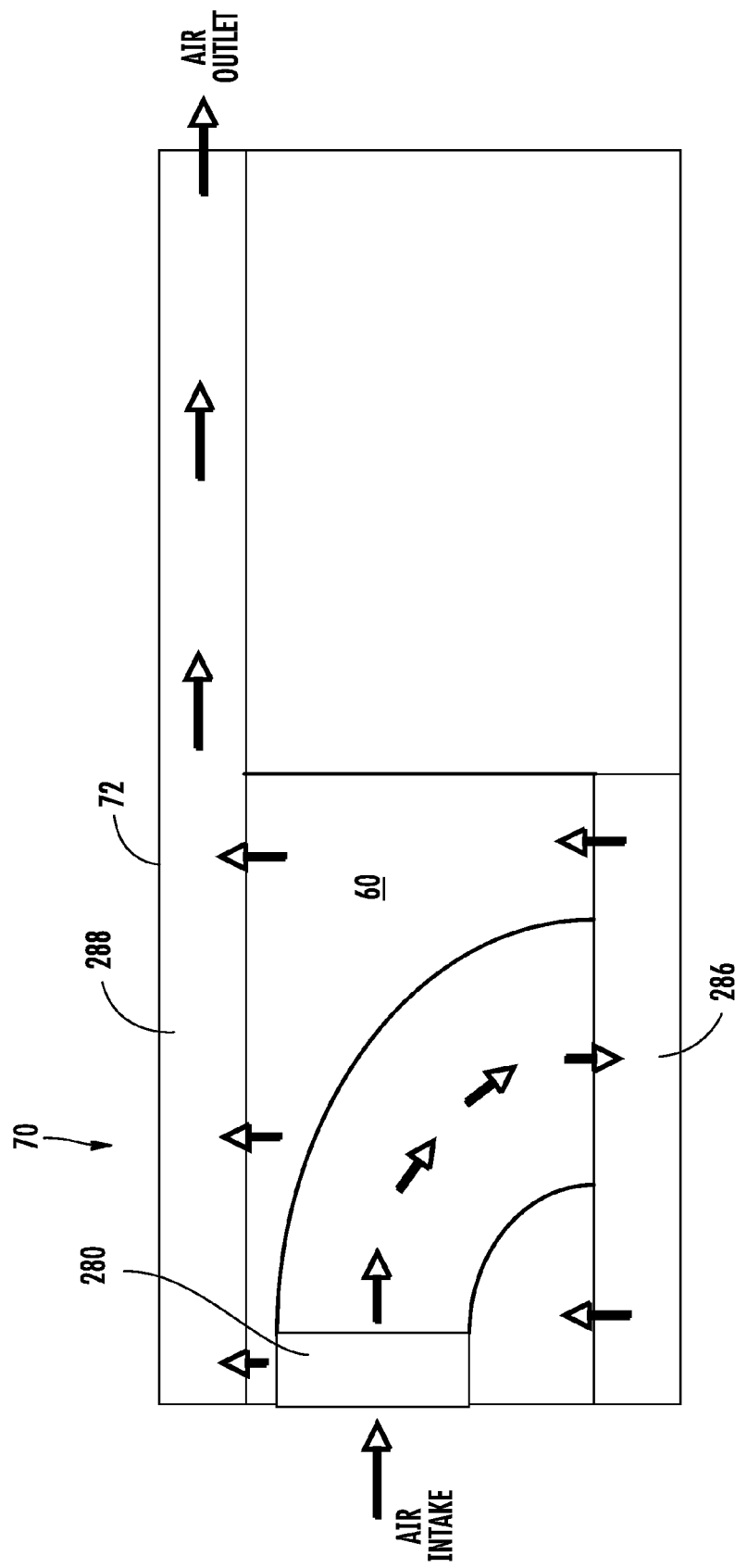
FIG. 37 is an exemplary schematic diagram of air flow drawn into the enclosure by the cooling fan through the enclosure of FIG. 35.
Figure 38:
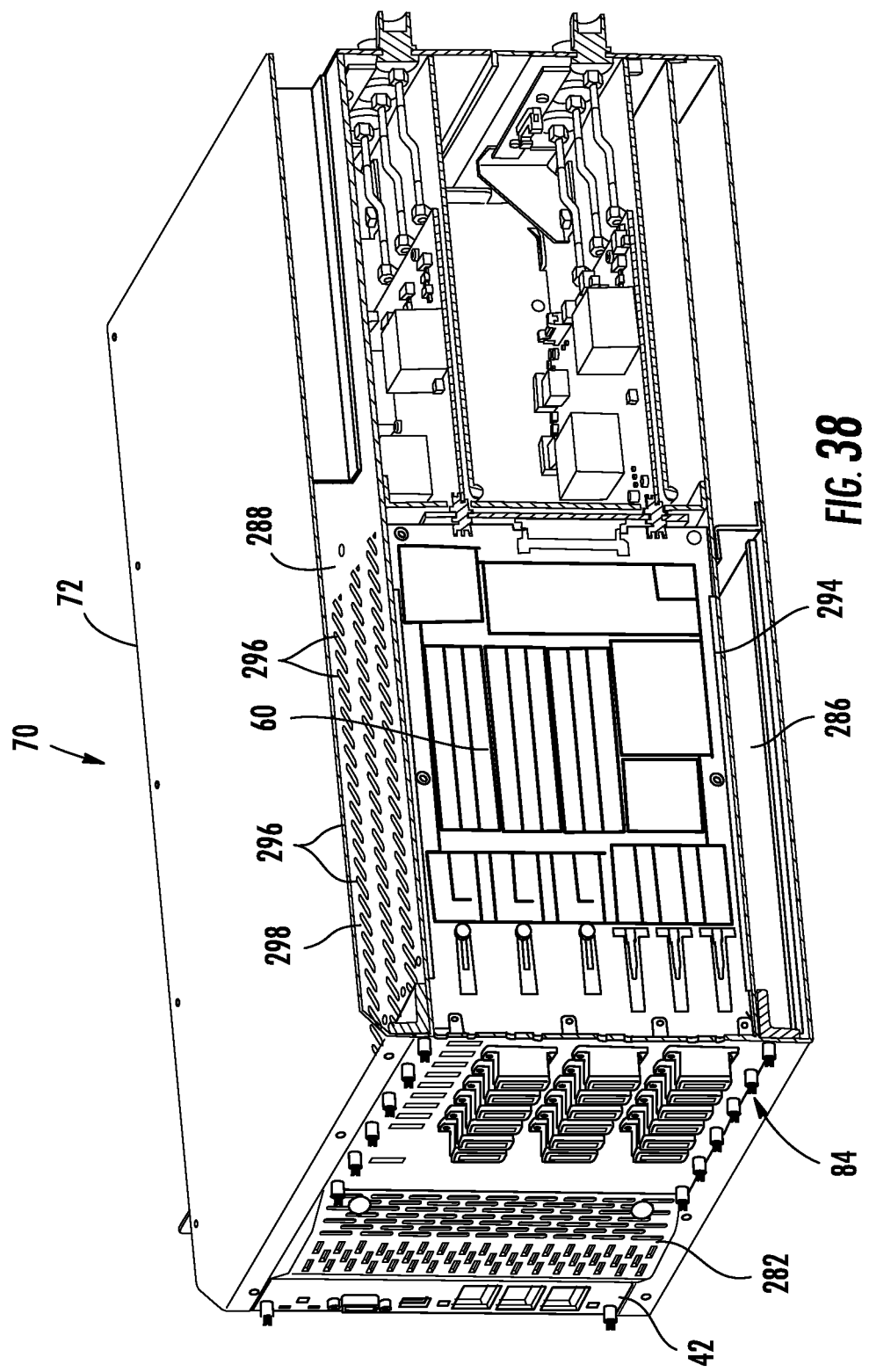
FIG. 38 is another side cross-sectional view of the enclosure of FIG. 35 illustrating the directing of air through openings in a lower plenum plate through OICs installed in the enclosure and through openings disposed in an upper plenum plate in the enclosure.

With continuing reference to FIG. 36, a lower plenum 286 and an upper plenum 288 is provided in the enclosure 72. The lower plenum 286 is provided to direct air pulled in the enclosure 72 by the cooling fan 280 initially to the bottom of the enclosure 72 to allow the air to then be directed upward through OICs 60 installed in the enclosure 72 and to the upper plenum 288 to be directed to the rear and outside of the enclosure 72. Passing air across the OICs 60 cools the OICs 60. This air flow design is further illustrated in the air flow diagram of FIG. 37. In this regard, with reference to FIG. 36, a fan duct 290 is provided behind the cooling fan 280 to direct air drawn into the enclosure 72 by the cooling fan 280. A plate 292 is installed in the fan duct 290 to direct air flow down from the fan duct 290 into the lower plenum 286. The air from the lower plenum 286 passes through openings disposed in a lower plenum plate 294 and then passes through the openings disposed between OICs 60 wherein the air then passes through openings 296 disposed in an upper plenum plate 298, as illustrated in FIG. 38. In this manner, air is directed across the OICs 60 to provide cooling of the OICs 60. Air then entering into the upper plenum 288 is free to exit from the enclosure 72, as illustrated in FIG. 36. The upper plenum 288 is open to the outside of the enclosure 72 through the rear of the enclosure 72, as illustrated in FIGS. 36 and 37 and in FIG. 39.

Figure 40:
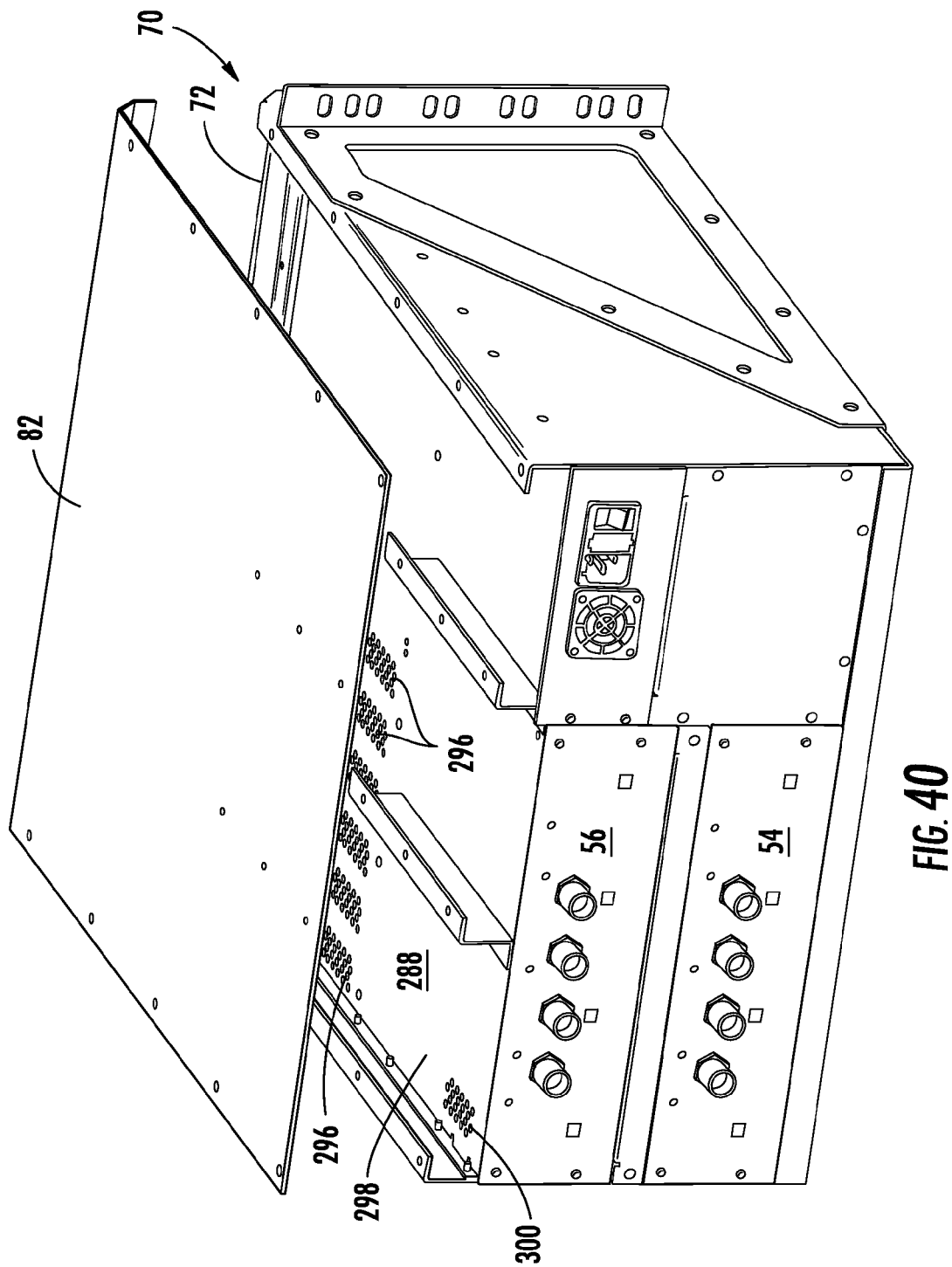
FIG. 40 is a rear perspective view of the enclosure of FIG. 35 illustrating the air outlet from the upper plenum of the enclosure with the top plate of the enclosure removed and illustrating openings in the upper plenum plate into the uplink BIC compartment of the enclosure.
Figure 41:
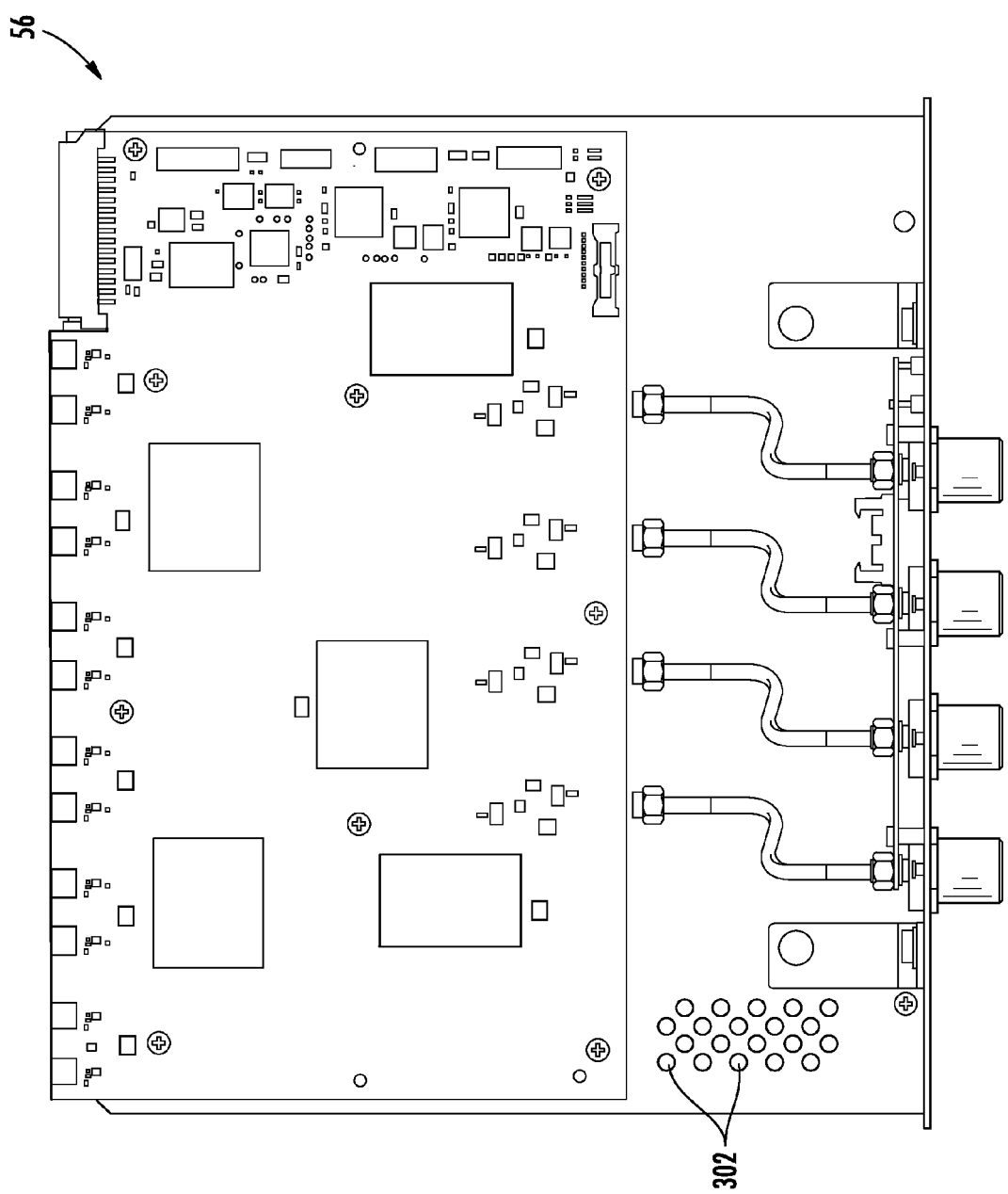
FIG. 41 is a top view of the uplink BIC with openings disposed therein to allow air to flow from the downlink BIC to the uplink BIC disposed above the downlink BIC in the enclosure of FIG. 35.

Further, as illustrated in FIGS. 40 and 41, openings 300 and 302 can also be disposed in the upper plenum plate 298 above the uplink BIC 56 and in the downlink BIC 54 to provide further movement of air for cooling purposes. These openings 300, 302 allow some of the air flowing into the enclosure 72 from the cooling fan 280 to be drawn from the lower plenum 286 into the downlink BIC 54 and then into the uplink BIC 56 via openings 302. Air can then be directed from the uplink BIC 56 through openings 300 and into the upper plenum 288 outside of the enclosure 72.

Figure 39:
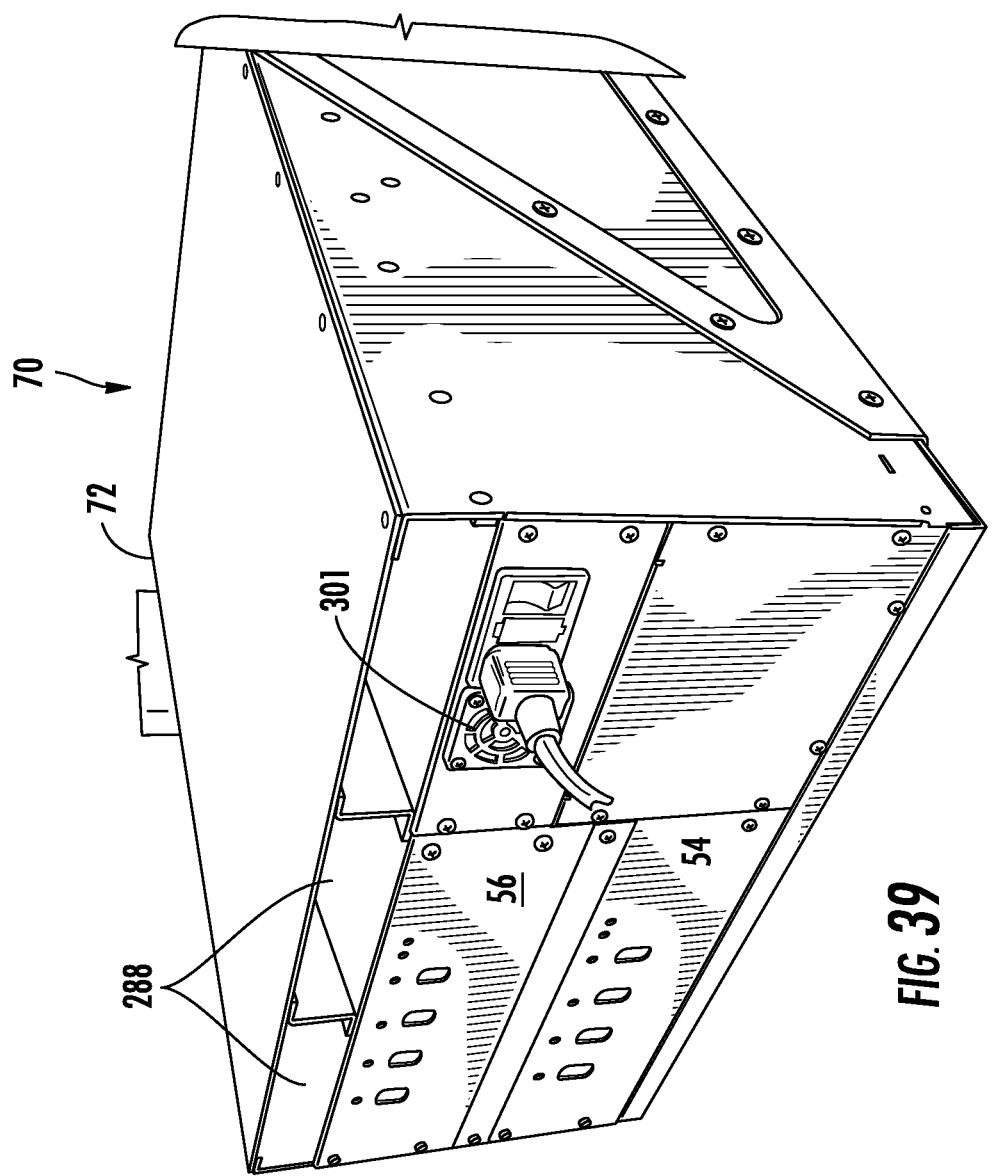
FIG. 39 is a rear perspective view of the enclosure of FIG. 35 illustrating an air outlet from the upper plenum of the enclosure.

Further, as illustrated in FIGS. 36, 39, and 41 an optional second cooling fan 301 is provided below the upper plenum plate 298. In this manner, some of the air from the enclosure 72 is drawn through the power supply 59 by the second cooling fan 301 to provide cooling of the power supply 59. For example, the second cooling fan 301 may be rated to direct air at a flow rate of thirteen (13) cubic feet per minute (CFM) or any other rating desired.

Many modifications and other embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. For example, the embodiments disclosed herein can be employed for any type of distributed antenna system, whether such includes optical fiber or not.

It is intended that the embodiments cover the modifications and variations of the embodiments provided they come within the scope of the appended claims and their equivalents. Although specific terms are employed herein, they are used in a generic and descriptive sense only and not for purposes of limitation

What is claimed is:
1. An optical interface card, comprising:
   a printed circuit board (PCB) having a first perimeter including a first end and a second end opposite the first end;
   at least one opening disposed in the PCB between the first end and the second end of the PCB and having a second perimeter including at least one first opening end and at least one second opening end opposite the at least one first opening end, wherein the second perimeter does not extend to the first perimeter; and
   at least one optical sub-assembly (OSA) mounted to the at least one first opening end and extending into the at least one opening.
2. The optical interface card of claim 1, wherein the at least one opening does not extend to the first end of the PCB.
3. The optical interface card of claim 2, wherein the at least one OSA does not extend to the first end of the PCB.
4. The optical interface card of claim 1, wherein the at least one OSA is comprised of at least one of a transmitter OSA (TOSA) and a receiver OSA (ROSA).
5. The optical interface card of claim 1, further comprising at least one electrical conductor extending in a substantially straight line from an end of the at least one OSA and electrically connected with one or more printed traces on the PCB.
6. The optical interface card of claim 1, wherein the at least one opening is comprised of at least one rectangular opening.
7. The optical interface card of claim 1, further comprising at least one optical fiber routing guide configured to route one or more optical fibers connected to the at least one OSA.

8. The optical interface card of claim 1, further comprising a mounting plate mounted to the first end of the PCB in a plane orthogonal to a plane of the PCB.

9. The optical interface card of claim 8, further comprising at least one alignment block mounted in at least one opening disposed in the PCB proximate the first end of the PCB and at least one opening disposed in the mounting plate to align the PCB to the mounting plate.

10. The optical interface card of claim 9, further comprising at least one guide pin disposed in the at least one alignment block engaged with the at least one opening disposed in the PCB.

11. An optical interface assembly, comprising:
a first optical interface card (OIC) having a first perimeter including a first end and a second end, comprising:
at least one first opening between a first end and a second end of the first OIC having a second perimeter including at least one first opening end, wherein the second perimeter does not extend to the first perimeter; and
at least one first optical sub-assembly (OSA) mounted to the at least one first opening end and extending into the at least one first opening; and
a second OIC, comprising:
at least one second opening between a first end and a second end of the second OIC having at least one second opening end; and
at least one second OSA mounted to the at least one second opening end and extending into the at least one second opening; and
at least one standoff disposed between the first OIC and second OIC.

12. The optical interface assembly of claim 11, wherein the at least one first opening does not extend to the first end of the first OIC, and wherein the at least one second opening does not extend to the second end of the second OIC.

13. The optical interface assembly of claim 12, wherein the at least one first OSA does not extend to the first end of the first OIC, and wherein the at least one second OSA does not extend to the first end of the second OIC.

14. The optical interface assembly of claim 11, wherein the at least one first OSA and the at least one second OSA are each comprised of at least one of a transmitter OSA (TOSA) and a receiver OSA (ROSA).

15. The optical interface assembly of claim 11, further comprising at least one electrical conductor extending in a substantially straight line from an end of the at least one OSA and electrically connected with one or more printed traces on the PCB.

16. The optical interface assembly of claim 11, further comprising a mounting plate mounted to the first end of the first OIC and the first end of the second OIC in a plane orthogonal to a plane of the first OIC and a plane of the second OIC.

17. A method of assembling an optical interface card, comprising:
providing a printed circuit board (PCB) having a first perimeter including a first end and a second end opposite the first end, and at least one opening having a second perimeter including at least one first opening end, wherein the second perimeter does not extend to the first perimeter; and
mounting at least one optical sub-assembly (OSA) to the at least one first opening end of the at least one opening disposed in the PCB between the first end and the second end of the PCB.

18. The method of claim 17, further comprising placing the at least one opening in the PCB prior to the step of mounting.

19. The method of claim 18, further comprising not extending the at least one opening to the first end of the PCB.

20. The method of claim 17, further comprising not mounting the at least one OSA to extend to the first end of the PCB.

21. The method of claim 17, wherein the at least one OSA is comprised of at least one of a transmitter OSA (TOSA) and a receiver OSA (ROSA).

22. The method of claim 17, further comprising routing at least one optical fiber from the at least one OSA through at least one routing guide mounted to the PCB.

23. The method of claim 17, mounting the first end of the PCB to a mounting plate disposed in a plane orthogonal to a plane of the PCB.

24. An optical interface card, comprising:
a printed circuit board (PCB) having a first end and a second end opposite the first end;
at least one opening disposed in the PCB between the first end and the second end of the PCB and having at least one first opening end and at least one second opening end opposite the at least one first opening end;
at least one optical sub-assembly (OSA) mounted to the at least one first opening end and extending into the at least one opening; and
at least one alignment block mounted in at least one opening disposed in the PCB proximate the first end of the PCB and at least one opening disposed in the mounting plate to align the PCB to the mounting plate.

25. The optical interface card of claim 24, further comprising at least one guide pin disposed in the at least one alignment block engaged with the at least one opening disposed in the PCB.

* * * * *